(12) United States Patent
Singh et al.

(10) Patent No.: US 7,648,927 B2
(45) Date of Patent: Jan. 19, 2010

(54) METHOD FOR FORMING SILICON-CONTAINING MATERIALS DURING A PHOTOEXCITATION DEPOSITION PROCESS

(75) Inventors: Kaushal K. Singh, Santa Clara, CA (US); Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 561 days.

(21) Appl. No.: 11/425,344

(22) Filed: Jun. 20, 2006

(65) Prior Publication Data

US 2006/0286775 A1   Dec. 21, 2006

Related U.S. Application Data

(63) Continuation-in-part of application No. 11/157,567, filed on Jun. 21, 2005, and a continuation-in-part of application No. 11/157,533, filed on Jun. 21, 2005.

(51) Int. Cl.
*H01L 21/31* (2006.01)
(52) U.S. Cl. .................. 438/792; 438/723; 438/763; 438/781; 438/791; 257/E21.12
(58) Field of Classification Search .................. 438/676, 438/792
See application file for complete search history.

(56) References Cited

U.S. PATENT DOCUMENTS

| | | |
|---|---|---|
| 4,720,395 A | 1/1988 | Foster |
| 4,834,831 A | 5/1989 | Nishizawa et al. |
| 4,857,139 A | 8/1989 | Tashiro et al. |
| 5,112,439 A | 5/1992 | Reisman et al. |

(Continued)

FOREIGN PATENT DOCUMENTS

EP          0 464 515          1/1992

(Continued)

OTHER PUBLICATIONS

Bergonzo, et al., "Low pressure photodeposition of silicon nitride films using a xenon excimer lamp", Appl. Phys. Lett. 63(13), Sep. 1993, p. 1757-1759.

(Continued)

*Primary Examiner*—N Drew Richards
*Assistant Examiner*—Kyoung Lee
(74) *Attorney, Agent, or Firm*—Patterson & Sheridan, LLP

(57) ABSTRACT

Embodiments of the invention generally provide a method for depositing films or layers using a UV source during a photoexcitation process. The films are deposited on a substrate and usually contain a material, such as silicon (e.g., epitaxy, crystalline, microcrystalline, polysilicon, or amorphous), silicon oxide, silicon nitride, silicon oxynitride, or other silicon-containing materials. The photoexcitation process may expose the substrate and/or gases to an energy beam or flux prior to, during, or subsequent a deposition process. Therefore, the photoexcitation process may be used to pre-treat or post-treat the substrate or material, to deposit the silicon-containing material, and to enhance chamber cleaning processes. Attributes of the method that are enhanced by the UV photoexcitation process include removing native oxides prior to deposition, removing volatiles from deposited films, increasing surface energy of the deposited films, increasing the excitation energy of precursors, reducing deposition time, and reducing deposition temperature.

36 Claims, 11 Drawing Sheets

U.S. PATENT DOCUMENTS

| | | |
|---|---|---|
| 5,273,930 A | 12/1993 | Steele et al. |
| 5,294,286 A | 3/1994 | Nishizawa et al. |
| 5,372,860 A | 12/1994 | Fehlner et al. |
| 5,374,570 A | 12/1994 | Nasu et al. |
| 5,469,806 A | 11/1995 | Mochizuki et al. |
| 5,480,818 A | 1/1996 | Matsumoto et al. |
| 5,503,875 A | 4/1996 | Imai et al. |
| 5,521,126 A | 5/1996 | Okamura et al. |
| 5,527,733 A | 6/1996 | Nishizawa et al. |
| 5,674,304 A | 10/1997 | Fukada et al. |
| 5,693,139 A | 12/1997 | Nishizawa et al. |
| 5,716,495 A * | 2/1998 | Butterbaugh et al. ........ 438/708 |
| 5,796,116 A | 8/1998 | Nakata et al. |
| 5,807,792 A | 9/1998 | Ilg et al. |
| 5,906,680 A | 5/1999 | Meyerson |
| 5,916,365 A | 6/1999 | Sherman |
| 6,025,627 A | 2/2000 | Forbes et al. |
| 6,042,654 A | 3/2000 | Comita et al. |
| 6,124,158 A | 9/2000 | Dautartas et al. |
| 6,144,060 A | 11/2000 | Park et al. |
| 6,159,852 A | 12/2000 | Nuttall et al. |
| 6,200,893 B1 | 3/2001 | Sneh |
| 6,207,487 B1 | 3/2001 | Kim et al. |
| 6,232,196 B1 | 5/2001 | Raaijmakers et al. |
| 6,265,033 B1 | 7/2001 | Hilliard |
| 6,270,572 B1 | 8/2001 | Kim et al. |
| 6,284,646 B1 | 9/2001 | Leem |
| 6,287,965 B1 | 9/2001 | Kang et al. |
| 6,291,319 B1 | 9/2001 | Yu et al. |
| 6,305,314 B1 | 10/2001 | Sneh et al. |
| 6,335,280 B1 | 1/2002 | van der Jeugd |
| 6,342,277 B1 | 1/2002 | Sherman |
| 6,348,420 B1 | 2/2002 | Raaijmakers et al. |
| 6,352,945 B1 | 3/2002 | Matsuki et al. |
| 6,358,829 B2 | 3/2002 | Yoon et al. |
| 6,383,955 B1 | 5/2002 | Matsuki et al. |
| 6,391,785 B1 | 5/2002 | Satta et al. |
| 6,391,803 B1 | 5/2002 | Kim et al. |
| 6,399,491 B2 | 6/2002 | Jeon et al. |
| 6,410,463 B1 | 6/2002 | Matsuki |
| 6,451,119 B2 | 9/2002 | Sneh et al. |
| 6,458,718 B1 | 10/2002 | Todd |
| 6,462,367 B2 | 10/2002 | Marsh et al. |
| 6,468,924 B2 | 10/2002 | Lee et al. |
| 6,489,241 B1 | 12/2002 | Thilderkvist et al. |
| 6,492,283 B2 | 12/2002 | Raaijmakers et al. |
| 6,511,539 B1 | 1/2003 | Raaijmakers |
| 6,534,395 B2 | 3/2003 | Werkhoven et al. |
| 6,544,900 B2 | 4/2003 | Raaijmakers et al. |
| 6,562,720 B2 | 5/2003 | Thilderkvist et al. |
| 6,566,281 B1 | 5/2003 | Buchanan et al. |
| 6,607,973 B1 | 8/2003 | Jeon |
| 6,613,383 B1 | 9/2003 | George et al. |
| 6,620,670 B2 | 9/2003 | Song et al. |
| 6,630,413 B2 | 10/2003 | Todd |
| 6,632,279 B1 | 10/2003 | Ritala et al. |
| 6,632,747 B2 | 10/2003 | Niimi et al. |
| 6,660,660 B2 | 12/2003 | Haukka et al. |
| 6,713,177 B2 | 3/2004 | George et al. |
| 6,713,846 B1 | 3/2004 | Senzaki |
| 6,797,558 B2 | 9/2004 | Nuttall et al. |
| 6,818,250 B2 | 11/2004 | George et al. |
| 6,821,825 B2 | 11/2004 | Todd et al. |
| 6,913,827 B2 | 7/2005 | George et al. |
| 6,969,539 B2 | 11/2005 | Gordon et al. |
| 6,992,019 B2 | 1/2006 | Lee et al. |
| 6,998,305 B2 | 2/2006 | Arena et al. |
| 7,125,582 B2 | 10/2006 | McSwiney et al. |
| 7,166,516 B2 * | 1/2007 | Furuhashi et al. .......... 438/301 |
| 7,192,626 B2 | 3/2007 | Dussarrat et al. |
| 2001/0000866 A1 | 5/2001 | Sneh et al. |
| 2001/0020712 A1 | 9/2001 | Raaijmakers et al. |
| 2001/0024387 A1 | 9/2001 | Raaijmakers et al. |
| 2001/0024871 A1 | 9/2001 | Yagi |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0046567 A1 | 11/2001 | Matsuki et al. |
| 2001/0055672 A1 | 12/2001 | Todd |
| 2002/0000598 A1 | 1/2002 | Kang et al. |
| 2002/0016084 A1 | 2/2002 | Todd |
| 2002/0031618 A1 | 3/2002 | Sherman |
| 2002/0047151 A1 | 4/2002 | Kim et al. |
| 2002/0060363 A1 | 5/2002 | Xi et al. |
| 2002/0074588 A1 | 6/2002 | Lee |
| 2002/0076837 A1 | 6/2002 | Hujanen et al. |
| 2002/0090818 A1 | 7/2002 | Thilderkvist et al. |
| 2002/0093042 A1 | 7/2002 | Oh et al. |
| 2002/0098627 A1 | 7/2002 | Pomarede et al. |
| 2002/0117399 A1 | 8/2002 | Chen et al. |
| 2002/0127883 A1 | 9/2002 | Conti et al. |
| 2002/0145168 A1 | 10/2002 | Bojarczuk, Jr. et al. |
| 2002/0155722 A1 | 10/2002 | Satta et al. |
| 2002/0168868 A1 | 11/2002 | Todd |
| 2002/0172768 A1 | 11/2002 | Endo et al. |
| 2002/0173113 A1 | 11/2002 | Todd |
| 2002/0173130 A1 | 11/2002 | Pomerede et al. |
| 2002/0197831 A1 | 12/2002 | Todd et al. |
| 2002/0197881 A1 | 12/2002 | Ramdani et al. |
| 2002/0197883 A1 | 12/2002 | Niimi et al. |
| 2003/0013320 A1 | 1/2003 | Kim et al. |
| 2003/0015764 A1 | 1/2003 | Raaijmakers et al. |
| 2003/0022528 A1 | 1/2003 | Todd |
| 2003/0032281 A1 | 2/2003 | Werkhoven et al. |
| 2003/0036268 A1 | 2/2003 | Brabant et al. |
| 2003/0049942 A1 | 3/2003 | Haukka et al. |
| 2003/0060057 A1 | 3/2003 | Raaijmakers et al. |
| 2003/0068437 A1 | 4/2003 | Nakamura et al. |
| 2003/0072884 A1 | 4/2003 | Zhang et al. |
| 2003/0072975 A1 | 4/2003 | Shero et al. |
| 2003/0082300 A1 | 5/2003 | Todd et al. |
| 2003/0082833 A1 * | 5/2003 | Yu et al. ...................... 438/3 |
| 2003/0089308 A1 | 5/2003 | Raaijmakers |
| 2003/0089942 A1 | 5/2003 | Bhattacharyya |
| 2003/0101927 A1 | 6/2003 | Raaijmakers |
| 2003/0104707 A1 | 6/2003 | Senzaki et al. |
| 2003/0106490 A1 | 6/2003 | Jallepally et al. |
| 2003/0108674 A1 | 6/2003 | Chung et al. |
| 2003/0116804 A1 | 6/2003 | Visokay et al. |
| 2003/0124262 A1 | 7/2003 | Chen et al. |
| 2003/0129826 A1 | 7/2003 | Werkhoven et al. |
| 2003/0140941 A1 | 7/2003 | Inushima et al. |
| 2003/0143841 A1 | 7/2003 | Yang et al. |
| 2003/0160277 A1 | 8/2003 | Bhattacharyya |
| 2003/0166318 A1 | 9/2003 | Zheng |
| 2003/0172872 A1 | 9/2003 | Thakur et al. |
| 2003/0173586 A1 | 9/2003 | Moriwaki et al. |
| 2003/0185980 A1 | 10/2003 | Endo |
| 2003/0186561 A1 | 10/2003 | Law et al. |
| 2003/0188682 A1 | 10/2003 | Tois et al. |
| 2003/0189208 A1 | 10/2003 | Law et al. |
| 2003/0189232 A1 | 10/2003 | Law et al. |
| 2003/0190423 A1 | 10/2003 | Yang et al. |
| 2003/0190497 A1 | 10/2003 | Yang et al. |
| 2003/0194853 A1 | 10/2003 | Jeon |
| 2003/0198754 A1 | 10/2003 | Xi et al. |
| 2003/0207547 A1 | 11/2003 | Wang et al. |
| 2003/0213560 A1 | 11/2003 | Wang et al. |
| 2003/0215570 A1 | 11/2003 | Seutter et al. |
| 2003/0216981 A1 | 11/2003 | Tillman |
| 2003/0232506 A1 | 12/2003 | Metzner et al. |
| 2003/0232554 A1 | 12/2003 | Blum et al. |
| 2003/0235961 A1 | 12/2003 | Metzner et al. |
| 2004/0007747 A1 | 1/2004 | Visokay et al. |

| | | | |
|---|---|---|---|
| 2004/0009307 A1 | 1/2004 | Koh et al. | |
| 2004/0009675 A1 | 1/2004 | Eissa et al. | |
| 2004/0016973 A1 | 1/2004 | Rotondaro et al. | |
| 2004/0023462 A1 | 2/2004 | Rotondaro et al. | |
| 2004/0033674 A1 | 2/2004 | Todd | |
| 2004/0033698 A1 | 2/2004 | Lee et al. | |
| 2004/0043149 A1 | 3/2004 | Gordon et al. | |
| 2004/0043569 A1 | 3/2004 | Ahn et al. | |
| 2004/0048491 A1 | 3/2004 | Jung et al. | |
| 2004/0053484 A1 | 3/2004 | Kumar et al. | |
| 2004/0069610 A1 | 4/2004 | Arno et al. | |
| 2004/0121085 A1 | 6/2004 | Wang et al. | |
| 2004/0164293 A1 | 8/2004 | Maloney et al. | |
| 2004/0194691 A1 | 10/2004 | George et al. | |
| 2004/0194706 A1 | 10/2004 | Wang et al. | |
| 2004/0214354 A1 | 10/2004 | Marsh et al. | |
| 2004/0226911 A1 | 11/2004 | Dutton et al. | |
| 2004/0235229 A1 | 11/2004 | Hokazono | |
| 2004/0253776 A1 | 12/2004 | Hoffmann et al. | |
| 2005/0012975 A1 | 1/2005 | George et al. | |
| 2005/0037627 A1 | 2/2005 | Dussarrat et al. | |
| 2005/0079691 A1 | 4/2005 | Kim et al. | |
| 2005/0082001 A1 | 4/2005 | Sugiura | |
| 2005/0145177 A1 | 7/2005 | McSwiney et al. | |
| 2005/0170604 A1 | 8/2005 | Orlowski et al. | |
| 2005/0241567 A1 | 11/2005 | Scarlete et al. | |
| 2005/0255714 A1 | 11/2005 | Iyer et al. | |
| 2006/0102076 A1 | 5/2006 | Smith et al. | |
| 2006/0286776 A1 | 12/2006 | Ranish et al. | |
| 2006/0286819 A1 | 12/2006 | Seutter et al. | |
| 2007/0275193 A1 | 11/2007 | DeSimone et al. | |

FOREIGN PATENT DOCUMENTS

| | | |
|---|---|---|
| EP | 1 150 345 | 10/2001 |
| GB | 2 355 727 | 5/2001 |
| JP | 58-098917 | 6/1983 |
| JP | 62-171999 | 7/1987 |
| JP | 63-062313 | 3/1988 |
| JP | 01-014927 | 1/1989 |
| JP | 01-143221 | 6/1989 |
| JP | 01-270593 | 10/1989 |
| JP | 02-172895 | 7/1990 |
| JP | 03-286522 | 12/1991 |
| JP | 05-047665 | 2/1993 |
| JP | 05-102189 | 4/1993 |
| JP | 05-251339 | 9/1993 |
| JP | 06-196809 | 7/1994 |
| JP | 07-300649 | 11/1995 |
| JP | 2001-111000 | 4/2001 |
| JP | 2001-172767 | 6/2001 |
| JP | 2001-189312 | 7/2001 |
| WO | WO 98/20524 | 5/1998 |
| WO | WO 00/16377 | 3/2000 |
| WO | WO 00/54320 | 9/2000 |
| WO | WO 01/15220 | 3/2001 |
| WO | WO 01/17692 | 3/2001 |
| WO | WO 01/29893 | 4/2001 |
| WO | WO 01/40541 | 6/2001 |
| WO | WO 01/41544 | 6/2001 |
| WO | WO 01/66832 | 9/2001 |
| WO | WO 01/71787 | 9/2001 |
| WO | WO 02/43115 | 5/2002 |
| WO | WO 02/45167 | 6/2002 |
| WO | WO 02/64853 | 8/2002 |
| WO | WO 02/65508 | 8/2002 |
| WO | WO 02/65516 | 8/2002 |
| WO | WO 02/65517 | 8/2002 |
| WO | WO 02/65525 | 8/2002 |
| WO | WO 02/80244 | 10/2002 |
| WO | WO 02/97864 | 12/2002 |

OTHER PUBLICATIONS

Argarwal, et al. "Challenges in Integrating the High-K Gate Dielectric Film to the Conventional CMOS Process Flow," Mat. Sec. Soc. Sump. Proc. vol. 670 (2001), pp. K2.1.1-K2.1.11.

Bedair, "Atomic Layer Epitaxy Deposition Processes," J. Vac. Sci. Technol. B., vol. 12, No. 1, Jan./Feb. 1994.

Cameron, et al. "Atomic Layer Deposition of $SiO_2$ and $TiO_2$ in Alumina Tubular Membranes," Langmuir, vol. 16, No. 19, American Chemical Society, 2000, pp. 7435.

Choi, et al. "Stability of $TiB_2$ as a Diffusion Barrier on Silicon," J. Electrochem. Soc., vol. 138, No. 10, Oct. 1991, pp. 3062-3067.

Choi, et al. "The Effect of Annealing on Resistivity of Low Pressure Chemical Vapor Deposited Titanium Diboride," J. Appl. Phys. 69(11), Jun. 1, 1991, pp. 7853-7861.

Derbyshire "Applications of Integrated Processing," Solid State Technology, Dec. 1994, pp. 45-48.

Du, et al. "$SiO_2$ Film Growth at Low Temperature by Catalyzed Atomic Layer Deposition in a Viscous Flow Reactor," Thin Solid Films, 491, (2005), pp. 43-53.

Elam, et al. "Nucleation and Growth During Tungsten Atomic Layer Deposition on $SiO_2$ Surfaces," Thin Solid Films, 386, (2001), pp. 41-52.

Elers, et al. "$NbCl_5$ as a Precursor in Atomic Layer Epitaxy," Applied Surface Science 82/83 (1994), pp. 468-474.

Ferguson, et al. "ALD of $SiO_2$ at Room Temperature Using Teos and $H_2O$ with $NH_3$ as the Catalyst," Journal of the Electrochemical Society, 151, (8), pp. G528-G535 (2004).

Ferguson, et al. "Atomic Layer Deposition of $Al_2O_3$ and $SiO_2$ on BN Particles Using Sequential Surface Reactions," Applied Surface Science, 162-163, (2000), pp. 280-292.

Ferguson, et al. "Atomic Layer Deposition of $SiO_2$ Films on BN Particles Using Sequential Surface Reactions," Chem. Mater., vol. 12, No. 11, 2000, pp. 3472.

George, et al. "Surface Chemistry for Atomic Layer Growth," J. Phys. Chem. 1996, 100, pp. 13121-13131.

Goto, et al. "Ultra-Low Contact Resistance for Deca-nm MOSFETs by Laser Annealing," Electron Devices Meeting, 1999. IEDM Technical Digest. International Washington, DC, USA Dec. 5-8, 1999, Piscataway, NJ, USA, IEEE, US, Dec. 5, 1999 (Dec. 2, 1999), pp. 931-933, XP010372206.

Groner, et al. "High-k Dielectrics Grown by Atomic Layer Deposition: Capacitor and Gate Applications," Interlayer Dielectrics for Semiconductor Technologies, Chapter 10, Elsevier Inc., 2003, pp. 327-348.

Hausmann, et al. "Rapid Vapor Deposition of Highly Conformal Silica Nanolaminates," Science, vol. 298, Oct. 11, 2002, pp. 402-406.

He, et al. "Pulse Deposition of Silicate Films," Journal of Applied Physics, vol. 94, No. 5, Sep. 1, 2003, pp. 3657-3659.

Hendrix, et al. "Composition control of $Hf_{1-x}Si_xO_2$ films deposited on Si by chemical-vapor deposition using amide precursors," Applied Physics Letters, American Institute of Physics. New York, US, vol. 80, No. 13, Apr. 1, 2002, pp. 2362-2364.

Hwang, et al. "Nanometer-Size $\alpha$-$PbO_2$-Type $TiO_2$ in Garnet: A Thermobarometer for Ultrahigh-Pressure Metamorphism," Science Vo. 288 (Apr. 14, 2000), pp. 321-324.

Iyer, et al., U.S. Appl. No. 11/245,373, filed Oct. 6, 2005.

Jeong, et al. "Growth and Characterization of Aluminum Oxide ($Al_2O_3$) Thin Films by Plasma-Assisted Atomic Layer Controlled Deposition," J. Korean Inst. Met. Mater., vol. 38, No. 10, Oct. 2000, pp. 1395-1399.

Jeong, et al. "Plasma-assisted Atomic Layer Growth of High-Quality Aluminum Oxide Thin Films," Jpn. J. Appl. Phys. 1, Regul. Pap. Short Notes, vol. 40, No. 1, Jan 2001, pp. 285-289.

Kamins, et al. "Kinetics of selective epitaxial deposition of $Si_{1-x}Ge_x$," Applied Physics Letters, American Institute pf Physics. New York, US, vol. 61, No. 6, Aug. 10, 1992, pp. 669-671.

Kang, et al. "Infrared Spectroscopic Study of Atomic Layer Deposition Mechanism for Hafnium Silicate Thin Films Using $HfCl_2$ [$N(SiMe_3)_2$]$_2$ and $H_2O$," J. Vac. Sci. Technol. A 22(6), Nov./Dec. 2004, American Vacuum Society, pp. 2393-2397.

Klaus, et al. "Atomic Layer Controlled Growth of SiO$_2$ Films Using Binary Reaction Sequence Chemistry," Appl. Phys. Lett. 70(9), Mar. 3, 1997. pp. 1092-1094.

Klaus, et al. "Atomic Layer Deposition of SiO$_2$ at Room Temperature Using NH$_3$-Catalyzed Sequential Surface Reactions," Surface Science 447 (2000) Elsevier Science, pp. 81-90.

Klaus, et al. "Atomic Layer Deposition of SiO$_2$ Using Catalyzed and Uncatalyzed Self-Limiting Surface Reactions," Surface Review and Letters, vol. 6, Nos. 3 & 4 (1999), pp. 435-448.

Klaus, et al. "Growth of SiO$_2$ at Room Temperature with the Use of Catalyzed Sequential Half-Reactions," Science, vol. 278, Dec. 12, 1997, pp. 1934-1936.

Klaus, et al. "SiO$_2$ Chemical Vapor Deposition at Room Temperature Using SiCl$_4$ and H$_2$O with an NH$_3$ Catalyst," Journal of The Electrochemical Society, 147 (7), 2000, pp. 2658-2664.

Lee, et al. "Cyclic Technique for the Enhancement of Highly Oriented Diamond Film Growth," Thin Solid Films 303 (1997), pp. 264-269.

McCool, et al. "Self-Limited Pore Size Reduction of Mesoporous Silica Membranes via Pyridine-Catalyzed Silicon Dioxide ALD," Chem. Vap. Deposition, 2004, vol. 10, No. 4, pp. 190-194.

McCool, et al. "Synthesis and Characterization of Silica Membrane Prepared by Pyridine-Catalyzed Atomic Layer Deposition," Ind. Eng. Chem. Res., vol. 43, No. 10, 2004, pp. 2478-2484.

Menon, et al. "Loading effect in SiGe layers grown by dichlorosilane- and silane-based epitaxy," Journal of Applied Physics, American Institute of Physics. New York, US, vol. 90, No. 9, Nov. 1, 2001, pp. 4805-4809.

Migitaka, "Excellent Silicon Nitride Films Made by Hybride Process and Their Application to a-Si TFTS", Semioconductor Conference, 2000, CAS 2000 Proceedings, 2000 IEEE, pp. 23-32, vol. 1.

Min, et al. "Chemical Vapor Deposition of Ti-Si-N Films with Alternating Source Supply," Mat. Res. Soc. Symp. Proc. vol. 564 (1999), pp. 207-210.

Min, et al. "Metal-organic Atomic-layer Deposition of Titanium-silicon-nitride Films," Applied Physics Letters, vol. 75, No. 11 (Sep. 11, 1999), pp. 1521-1523.

Morishita, et al. "New Substances for Atomic-Layer Deposition of Silicon Dioxide," Journal of Non-Crystalline Solids, vol. 187 (1995), pp. 66-69.

Paranjpe, et al. "Atomic Layer Deposition of AlO$_x$ for Thin Film Head Gap Applications," J. Electrochem. Soc., vol. 148, No. 9, Sep. 2001, pp. G465-G471.

Rana, et al. "Interactions of Moisture and Organic Contaminants with SiO$_2$ and ZrO$_2$ Gate Dielectric Films," Applied Surface Science, vol. 205, (2003), pp. 160-175.

Ritala, et al. "Atomic Layer Deposition of Oxide Thin Films with Metal Alkoxides as Oxygen Sources," Science vol. 288, Apr. 14, 2000, pp. 319-321.

Sedgwick, et al. "Selective SiGe and heavily As doped Si deposited at low temperature by atmospheric pressure chemical vapor deposition", Journal of Vacuum Science and Technology: Part B, American Institute of Physics. New York, US, vol. 11, No. 3, May 1, 1993, pp. 1124-1128.

Uchino, et al. "A Raised Source/Drain Technology Using In-situ P-doped SiGe and B-doped Si for 0.1 μm CMOS ULSIs", Electron Devices Meeting, 1997. Technical Digest, International Washington, DC, USA Dec. 7-10, 1991, New York, NY, USA, IEEE, US, Dec. 7, 1997, pp. 479-482.

Wang, et al., U.S. Appl. No. 11/155,646, filed Jun. 17, 2005.

PCT International Search Report for PCT/US06/23915 dated Jul. 14, 2008.

Office Action dated Apr. 30, 2009, for U.S. Appl. No. 11/425,346.

* cited by examiner

METHOD FOR FORMING SILICON-CONTAINING MATERIALS DURING A PHOTOEXCITATION DEPOSITION PROCESS

RELATED APPLICATION

This application is a continuation-in-part of co-pending U.S. Ser. No. 11/157,567, entitled "Methods for Treating Substrates and Films with Photoexcitation," filed Jun. 21, 2005, and a continuation-in-part of co-pending U.S. Ser. No. 11/157,533, entitled "Method for Silicon Based Dielectric Deposition and Clean with Photoexcitation," filed Jun. 21, 2005, which are both herein incorporated by reference in their entirety. This application is also related to pending U.S. patent application Ser. No. 11/425,346, filed Jun. 20, 2006, and published on Dec. 21, 2006, as United States Patent Application Publication 2006/0286776.

BACKGROUND OF THE INVENTION

1. Field of the Invention

Embodiments of the invention generally relate to a method for depositing silicon-containing materials, and more particularly, embodiments of the invention relate to chemical vapor deposition processes utilizing photoexcitation techniques to deposit silicon based dielectric materials, such as silicon oxide, silicon nitride, silicon oxynitride, silicon, and other silicon materials.

2. Description of the Related Art

Thermal chemical vapor deposition (CVD) of silicon-containing materials, such as silicon nitride, is a front end process used during the manufacture of semiconductor devices. For example, in a thermal CVD process for depositing silicon nitride, thermal energy is utilized for decomposing one or more feedstock chemicals, which includes a silicon precursor, to make a thin film of a silicon nitride on a substrate surface. Conventional thermal CVD processes of silicon-containing materials are typically performed in a batch furnace or a single wafer deposition chamber operating at elevated temperatures typically in excess of 550° C. As device geometries shrink to enable faster integrated circuits, the thermal budget for deposited films must be reduced in order to obtain satisfactory processing results, good production yield and robust device performance. Although some thermal CVD processes for silicon-containing materials having deposition temperatures of less than 550° C. have been proposed, the processes usually lack suitable production worthiness for large scale semiconductor device fabrication. Atomic layer deposition (ALD) processes have also been developed for depositing silicon-containing materials, such as silicon nitride and silicon oxide. While ALD processes have enabled a reduction in processing temperatures of about 550° C., film growth rates are usually extremely slow and therefore cost prohibiting for commercial fabrication.

Thus, there is a need for an improved method of depositing silicon-containing materials, such as silicon, silicon oxide, silicon nitride, and silicon oxynitride, at a temperature of less than about 550° C. while maintaining a high growth rate.

SUMMARY OF THE INVENTION

Embodiments of the invention generally provide a method for depositing films using a UV source during a photoexcitation process. The films are deposited on a substrate and usually contain a material, such as silicon oxide, silicon nitride, silicon oxynitride, silicon (e.g., epitaxy, crystalline, microcrystalline, polysilicon, or amorphous), or other silicon-containing materials (e.g., SiGe, SiC, SiGeC, or doped variants thereof). The photoexcitation process may expose the substrate and/or gases to an energy beam or flux prior to, during, or subsequent a deposition process. Therefore, the photoexcitation process may be used to pre-treat or post-treat the substrate, to deposit the silicon-containing material, and to enhance chamber cleaning processes. Attributes of the method that are enhanced by the UV photoexcitation process include removing native oxides prior to deposition, removing volatiles from deposited films, increasing surface energy, increasing the excitation energy of precursors, reducing deposition time, and reducing deposition temperature.

In one embodiment, a method for forming a silicon material on a substrate is provided which includes positioning a substrate within a process chamber, exposing the substrate to a deposition gas containing an aminosilane precursor, an oxygen precursor, and a nitrogen precursor, exposing the deposition gas to an energy beam derived from a UV-source within the process chamber, and depositing a silicon-containing material on the substrate, such that the silicon-containing material may be amorphous and contain oxygen and nitrogen.

In one example, the substrate may be exposed to the energy beam during a pretreatment process prior to depositing the silicon-containing material. The native oxides may be removed from the substrate during the pretreatment process. In another example, the substrate may be exposed to the energy beam during a post-treatment process after depositing the silicon-containing material. During the pretreatment process or the post-treatment process, the energy beam may have a photon energy within a range from about 2 eV to about 10 eV, for example, from about 3.2 eV to about 4.5 eV. Also, the energy delivery gas may be passed through the energy beam during the pretreatment process or the post-treatment process. The energy delivery gas may be neon, argon, krypton, xenon, argon bromide, argon chloride, krypton bromide, krypton chloride, krypton fluoride, xenon fluorides (e.g., $XeF_2$), xenon chlorides, xenon bromides, fluorine, chlorine, bromine, excimers thereof, radicals thereof, derivatives thereof, or combinations thereof. In one example, the energy delivery gas further contains nitrogen gas or hydrogen gas.

In some of the examples, the aminosilane precursor may be bis-tertbutylaminosilane, trisilylamine, hexakis(ethylamino)disilane, or derivatives thereof. The oxygen precursor may include atomic oxygen, oxygen, ozone, water, hydrogen peroxide, radicals thereof, derivatives thereof, or combinations thereof. The nitrogen precursor may include atomic nitrogen, nitrogen, azide, ammonia, hydrazine, amine compounds, hydrazine compounds, azide compounds, radicals thereof, derivatives thereof, or combinations thereof.

In another embodiment, a method for forming a silicon material on a substrate is provided which includes positioning a substrate containing a monocrystalline silicon-containing surface and a second surface within a process chamber, exposing the substrate to an energy beam derived from a UV-source during a pretreatment process, and exposing the substrate to a deposition gas containing an aminosilane and the energy beam during a deposition process. The method further provides depositing a silicon-containing material epitaxially and selectively over the monocrystalline silicon-containing surface while maintaining the second surface free of the silicon-containing material.

In one example, the monocrystalline silicon-containing surface may contain at least one element, such as germanium, carbon, boron, arsenic, phosphoric, or combinations thereof. In another example, the second surface contains at least one material, such as polycrystalline silicon, amorphous silicon, silicon oxide, silicon nitride, silicon oxynitride, a metal, a metal silicate, or derivatives thereof. Examples provide that the deposition gas may further contain an etchant. The etchant may contain chlorine gas, hydrogen chloride, tetrachlorosilane, derivatives thereof, or combinations thereof.

In another embodiment, a method for forming a silicon material on a substrate is provided which includes positioning a substrate containing a native oxide layer within a process chamber and exposing the substrate to an energy beam derived from a UV-source to remove the native oxide layer during a pretreatment process. The method further provides exposing the substrate to a deposition gas containing an aminosilane and the energy beam during a deposition process, depositing a polycrystalline silicon-containing material on the substrate, and exposing the substrate to the energy beam during a post-treatment process after depositing the polycrystalline silicon-containing material.

In another embodiment, a method for forming a silicon material on a substrate is provided which includes positioning a substrate containing a native oxide layer within a process chamber, exposing the substrate to an energy beam derived from a UV-source to remove the native oxide layer during a pretreatment process, and depositing a silicon oxide material on the substrate during a deposition process. The method further provides that during the deposition process, the substrate may be exposed to a deposition gas containing an aminosilane and an oxygen precursor, and deposition gas is exposed to the energy beam within the process chamber. The oxygen precursor may contain atomic oxygen, oxygen, ozone, water, hydrogen peroxide, radicals thereof, derivatives thereof, or combinations thereof.

In another embodiment, a method for forming a silicon material on a substrate is provided which includes positioning a substrate within a process chamber, depositing a silicon oxide material on the substrate during a deposition process, and exposing the substrate to the energy beam after depositing the silicon oxide material during a post-treatment process. In another embodiment, the substrate is exposed to an energy beam derived from a UV-source during a pretreatment process prior to depositing the silicon oxide material. The deposition process provides exposing the substrate to a deposition gas containing an aminosilane and an oxygen precursor, and exposing the deposition gas to the energy beam.

In one example, a silicon oxide material containing nitrogen may be formed by providing a nitrogen precursor within the deposition gas. The nitrogen precursor may contain atomic nitrogen, nitrogen, azide, ammonia, hydrazine, amine compounds, hydrazine compounds, azide compounds, radicals thereof, derivatives thereof, or combinations thereof. In other examples, the substrate may be exposed to a nitridation process after depositing a silicon oxide material on the substrate.

In another embodiment, a method for forming a silicon material on a substrate is provided which includes positioning a substrate within a process chamber and exposing the substrate to a deposition gas that contains a silicon-containing precursor, an oxygen precursor, and a nitrogen precursor. The method further includes exposing the deposition gas to an energy beam derived from a UV-source within the process chamber, and depositing a silicon-containing material on the substrate, such that the silicon-containing material is amorphous and comprises oxygen and nitrogen.

In another embodiment, a method for forming a silicon material on a substrate is provided which includes positioning a substrate within a process chamber, exposing the substrate to a deposition gas containing a silicon-containing precursor and an oxygen precursor, exposing the deposition gas to an energy beam derived from a UV-source within the process chamber, and depositing a silicon oxide material on the substrate. In another embodiment, a method for forming a silicon material on a substrate is provided which includes positioning a substrate within a process chamber, exposing the substrate to a deposition gas containing tetraethoxysilane and an oxygen precursor, exposing the deposition gas to an energy beam derived from a UV-source within the process chamber, and depositing a silicon oxide material on the substrate.

In one example, the silicon-containing precursor is an alkoxysilane compound. The alkoxysilane compound may have the chemical formula of $(RO)_n SiR'_{(4-n)}$, wherein n=1, 2, 3, or 4, each R, independently, may be methyl, ethyl, propyl, or butyl, and each R', independently, may be hydrogen, a halogen group, methyl, ethyl, propyl, or butyl. In a specific example, the alkoxysilane compound is tetraethoxysilane (TEOS). In another example, the silicon-containing precursor is a halosilane compound. The halosilane compound may include hexachlorodisilane, tetrachlorosilane, dichlorosilane, derivatives thereof, or combinations thereof. In other example, the silicon-containing precursor may include silane, disilane, trisilane, methylsilane, derivatives thereof, or combinations thereof. The oxygen precursor may contain atomic oxygen, oxygen, ozone, water, hydrogen peroxide, radicals thereof, derivatives thereof, or combinations thereof. The nitrogen precursor may contain atomic nitrogen, nitrogen, azide, ammonia, hydrazine, amine compounds, hydrazine compounds, azide compounds, radicals thereof, derivatives thereof, or combinations thereof.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
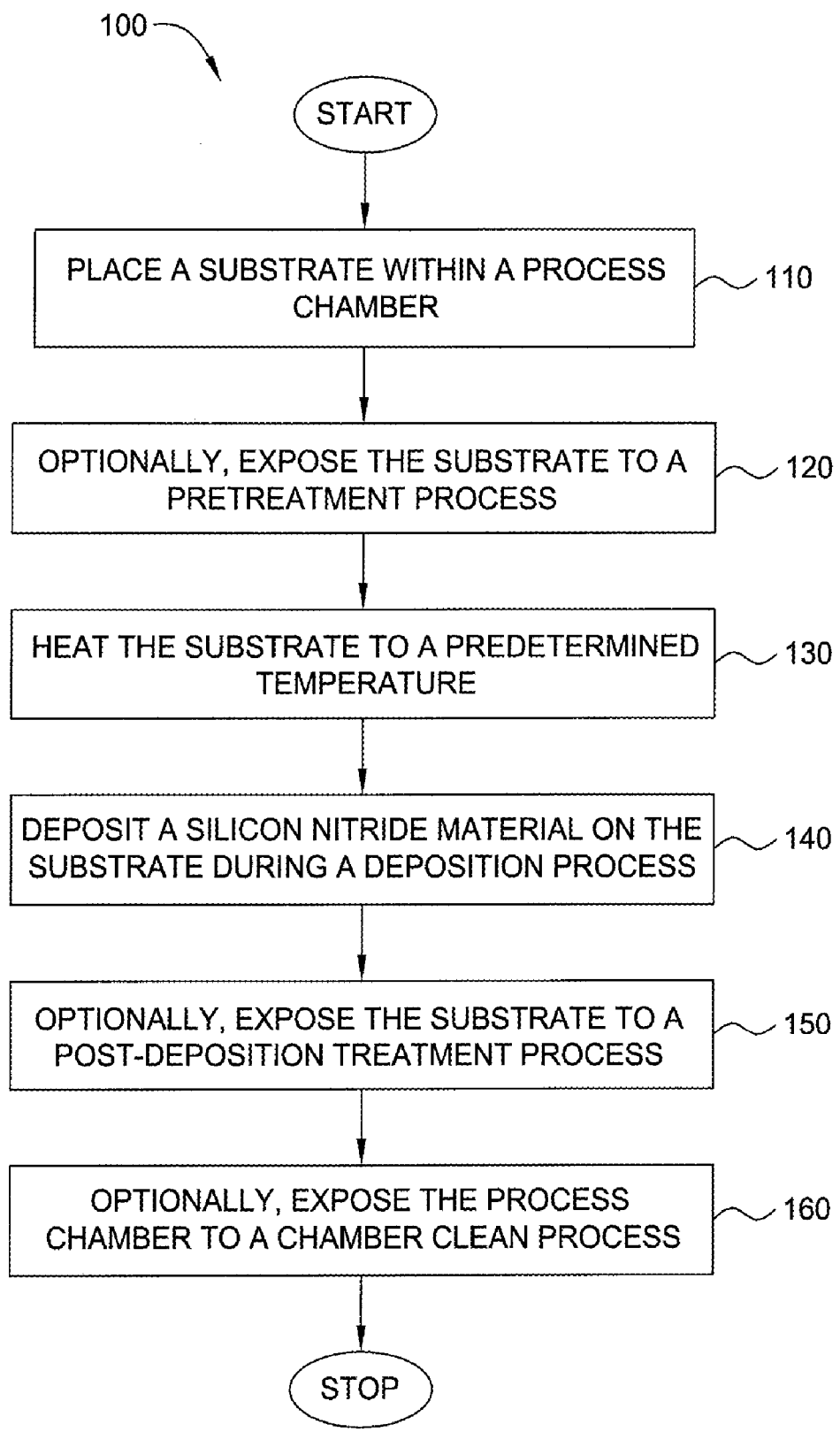
FIG. 1 is a flow diagram of a process for depositing a silicon nitride material as described by embodiments herein.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the invention provide a process for depositing a silicon-containing material onto a substrate. Silicon-containing materials include silicon oxide, silicon nitride, and silicon oxynitride, as well as silicon materials that may contain germanium, carbon, dopants, or combinations thereof. Many of the embodiments described herein are advantageously performed utilizing temperatures of less than about 550° C. Although some examples of the processes are described with reference to a single wafer thermal-chemical vapor deposition chamber (e.g., process chamber 1100 illustrated in FIG. 7), other processes may be beneficially practiced in other deposition systems, such as a batch chamber. Process chambers which may be used during the deposition processes as described herein include a SINGEN® Plus chamber and a POLYGEN™ chamber, each available from Applied Materials, Inc., located in Santa Clara, Calif. An excimer, such as a Xe-excimer, may be integrated into theses process chambers and used as an UV-source. In one example, a useful Xe-excimer source at 172 nm is the XERADEX® 20, available from Osram Sylvania, located in Westfield, Ind. Moreover, although deposition processes for silicon oxide, silicon nitride, silicon oxynitride, and silicon materials are described below, it is contemplated that the process may be adapted to deposit other silicon-containing materials, such as metal suicides and metal silicates.

Besides conventional CVD, other useful processes for depositing silicon-containing materials during photoexcitation processes or UV-assisted processes include pulsed-CVD and atomic layer deposition (ALD). During a pulsed-CVD process, a silicon precursor and a reactant (e.g., another precursor, a reductant, or an oxidizer) are co-flowed and pulsed into the process chamber. In one embodiment, the substrate is sequentially exposed to a deposition gas containing the silicon precursor and the reactant. In another embodiment, the substrate is sequentially exposed to the silicon precursor and the reactant. During an ALD process, the silicon precursor and the reactant are sequentially pulsed into the process chamber. In one embodiment, the substrate is sequentially exposed to the silicon precursor and the reactant during an ALD process. Plasma enhanced or thermally enhanced deposition techniques may be used during either ALD or CVD processes. Silicon-containing materials may be deposited on a single substrate or a batch of substrates during the deposition processes described herein.

Processes for Depositing Silicon-Containing Materials

FIGS. 1-4 illustrate flow chart diagrams of processes 100, 200, 300, and 400 for depositing silicon-containing materials, as described by embodiments herein. Processes 100, 200, 300, and 400 may be performed within process chamber 1100, such as described by examples herein, or by other suitable chamber and equipment. The silicon-containing material may include silicon nitride, silicon oxide, silicon oxynitride, silicon materials (epitaxy, polysilicon, or amorphous), such as silicon, silicon carbide, silicon germanium, silicon germanium carbide, doped variants thereof, derivatives thereof, or combinations thereof. Silicon-containing materials may be deposited on a substrate, such as a silicon nitride material by process 100 (FIG. 1), a silicon oxide material by process 200 (FIG. 2), a silicon oxynitride material by process 300 (FIG. 3), or a silicon material by process 400 (FIG. 4) as described by embodiments herein. The silicon-containing materials may be deposited as layers on a substrate to form electronic features, such as a MOSFET transistor (FIGS. 5A-5B), a bi-polar transistor (FIG. 6), or other silicon-containing layers, as well as within a photovoltaic cell.

Silicon Nitride Materials

FIG. 1 depicts a flow diagram of process 100 for depositing a silicon nitride material, as described by embodiments herein. The substrate may be positioned within a process chamber (step 110), optionally exposed to a pretreatment process (step 120), and heated to a predetermined temperature (step 130). Subsequently, a silicon nitride material may be deposited on the substrate (step 140). The substrate may be optionally exposed to post-deposition treatment process (step 150) and the process chamber may be optionally exposed to a chamber clean process (step 160).

The substrate may be positioned within a process chamber during step 110. The process chamber may be a single wafer chamber or a batch chamber containing multiple wafers or substrates (e.g., 25, 50, 100, or more). The substrate may be maintained in a fixed position, but preferably, is rotated by a support pedestal. Optionally, the substrate may be indexed during one or more steps of process 100.

Figure 7:
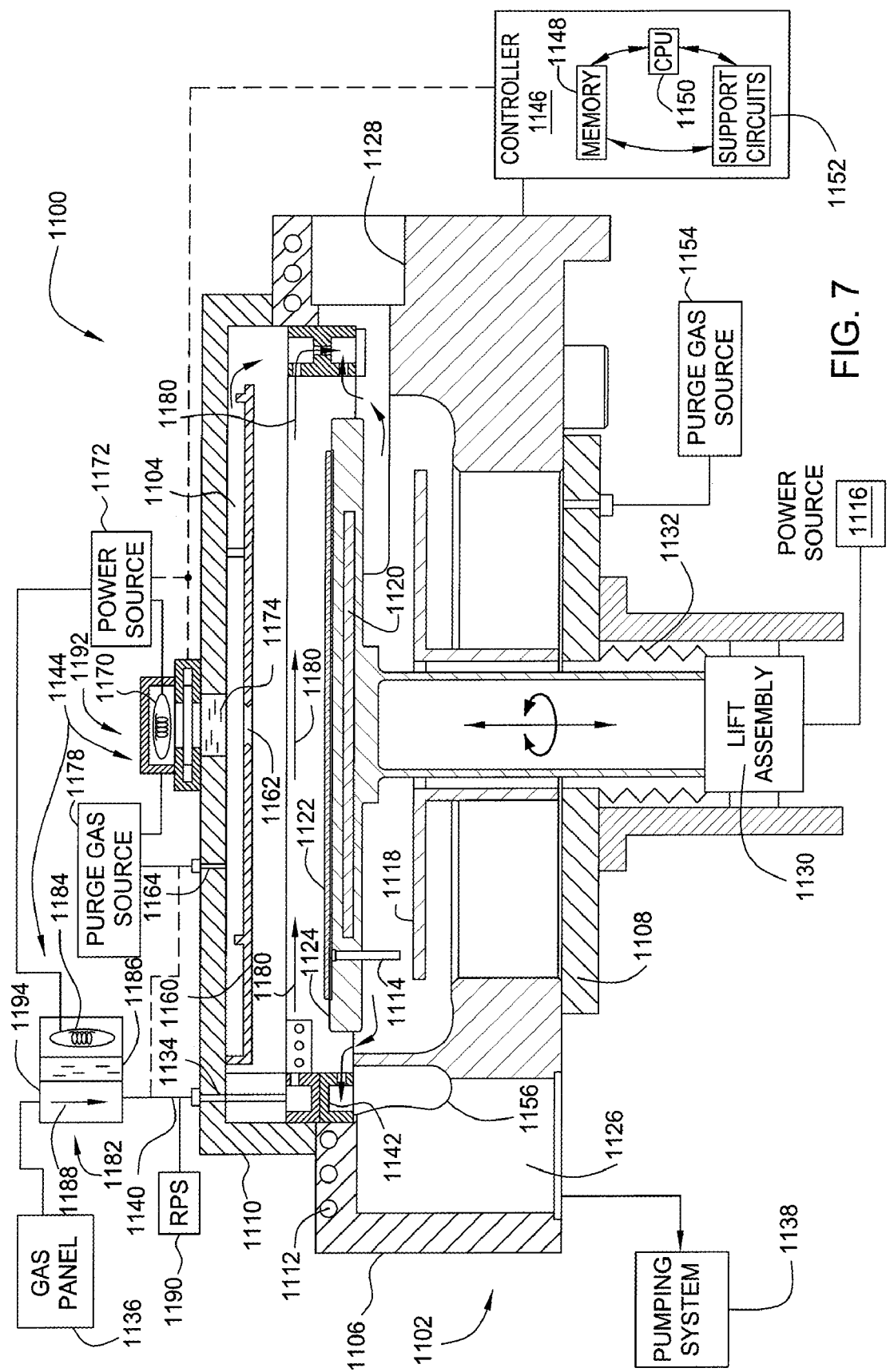
FIG. 7 is a simplified cross sectional view of one embodiment of a deposition chamber that may be used during a process for depositing silicon-containing materials as described herein.

Process chamber 1100, depicted in FIG. 7, may be used during process 100 to deposit silicon nitride materials on substrate 1122 as described by examples herein. In one example, substrate 1122 may be rotated on substrate support pedestal 1124 within process chamber 1100 at a rate of up to about 120 rpm (revolutions per minute). Alternatively, substrate 1122 may be positioned on substrate support pedestal 1124 and not rotated during the deposition process.

In one embodiment, the substrate is optionally exposed to at least one pretreatment process during step 120. The substrate surface may contain native oxides that are removed during a pretreatment process. The substrate may be pretreated with an energy beam generated by direct photoexcitation system to remove the native oxides from the substrate surface prior to depositing a silicon nitride material during step 140. A process gas may be exposed to the substrate during the pretreatment process. The process gas may contain argon, nitrogen, helium, hydrogen, forming gas, or combinations thereof. The pretreatment process may last for a time period within a range from about 2 minutes to about 10 minutes to facilitate native oxide removal during a photoexcitation process. Also, the substrate may be heated during step 120 to a temperature within a range from about 100° C. to about 800° C., preferably, from about 200° C. to about 600° C., and more preferably, from about 300° C. to about 500° C., to facilitate native oxide removal during process 100.

Examples provide that substrate 1122 may be exposed to an energy beam produced by lamp 1170 during step 120. Lamp 1170 may provide an energy beam having a photon energy within a range from about 2 eV to about 10 eV. In another example, lamp 1170 provides an energy beam of UV radiation having a wavelength within a range from about 126 nm to about 351 nm. Lamp 1170 may be energized for a period sufficient to remove oxides. The energization period is selected based upon the size and geometry of window 1174 (which corresponds to the exposed area of substrate 1122) and the substrate rotation speed. In one embodiment, lamp 1170 is energized for a time period within a range from about 2 minutes to about 10 minutes to facilitate native oxide removal during a photoexcitation process. In one example, substrate 1122 may be heated to a temperature within a range from about 100° C. to about 800° C. during step 120. In another example, substrate 1122 may be heated to a temperature within a range from about 300° C. to about 500° C. during step 120, while lamp 1170 provides an energy beam having a photon energy within a range from about 2 eV to about 10 eV for a time period within a range from about 2 minutes to about 5 minutes to facilitate native oxide removal. In one example, the energy beam has a photon energy within a range from about 3.2 eV to about 4.5 eV for about 3 minutes.

In another embodiment, native oxide removal may be augmented by a photoexcitation process in the presence of a process gas containing an energy delivery gas during a pretreatment process at step 120. The energy delivery gas may be neon, argon, krypton, xenon, argon bromide, argon chloride, krypton bromide, krypton chloride, krypton fluoride, xenon fluorides (e.g., $XeF_2$), xenon chlorides, xenon bromides, fluorine, chlorine, bromine, excimers thereof, radicals thereof, derivatives thereof, or combinations thereof. In some embodiments, the process gas may also contain nitrogen gas ($N_2$), hydrogen gas ($H_2$), forming gas (e.g., $N_2/H_2$ or $Ar/H_2$) besides at least one energy delivery gas.

In one example, substrate 1122 may be exposed to a process gas containing an energy delivery gas by providing the process gas to interior volume 1104 of process chamber 1100 during step 120. The energy delivery gas may be provided through flow control ring 1142 from gas panel 1136. The proximately of the process gas to lamp 1170 compared to substrate 1122 readily excites the energy delivery gas therein. As the energy delivery gas de-excites and moves closer to substrate 1122, the energy is efficiently transferred to the surface of substrate 1122, thereby facilitating the removal of native oxides.

In another embodiment, native oxide removal may be augmented by a photoexcitation process in the presence of a process gas containing an organic vapor during the pretreatment process at step 120. In one example, the substrate may be exposed to the process gas containing a cyclic aromatic hydrocarbon. The cyclic aromatic hydrocarbon may be in the presence of UV radiation. Monocyclic aromatic hydrocarbons and polycyclic aromatic hydrocarbons that are useful during a pretreatment process include quinone, hydroxyquinone (hydroquinone), anthracene, naphthalene, phenanthracene, derivatives thereof, or combinations thereof. In another example, the substrate may be exposed to the process gas containing other hydrocarbons, such as unsaturated hydrocarbons, including ethylene, acetylene (ethyne), propylene, alkyl derivatives, halogenated derivates, or combinations thereof. In another example, the organic vapor may contain alkane compounds during the pretreatment process at step 120.

In one example, the UV radiation having a wavelength within a range from about 126 nm to about 351 nm may be generated by a lamp during step 120. In another embodiment, polycyclic aromatic hydrocarbons may remove native oxides in the presence of UV radiation by reacting with oxygen atoms within the native oxides. In another embodiment, native oxides may be removed by exposing the substrate to quinone or hydroxyquinone while forming derivative products. The derivative product may be removed from the process chamber by a vacuum pumping process.

At step 130, the substrate may be heated to a predetermined temperature during or subsequent to the pretreatment process. The substrate is heated prior to depositing the silicon nitride material at step 140. The substrate may be heated by an embedded heating element within the substrate support, the energy beam (e.g., UV-source), or combinations thereof. Generally, the substrate is heated long enough to obtain the predetermined temperature, such as for a time period within a range from about 15 seconds to about 30 minutes, preferably, from about 30 seconds to about 20 minutes, and more preferably, from about 1 minute to about 10 minutes. In one embodiment, the substrate may be heated to a temperature within a range from about 200° C. to about 1,000° C., preferably, from about 400° C. to about 850° C., and more preferably, from about 550° C. to about 800° C. In another embodiment, the substrate may be heated to a temperature of less than about 550° C., preferably, less than about 450° C.

In one example, substrate 1122 may be heated to the predetermined temperature within process chamber 1100. The predetermined temperature may be within a range from about 300° C. to about 500° C. Substrate 1122 may be heated by applying power from power source 1116 to the resistive heating element (i.e., the heater 1120).

In one embodiment, a silicon nitride material is deposited on the substrate during a deposition process at step 140. The silicon nitride material may be formed by exposing the substrate to at least one deposition gas during the deposition process. In one example, the deposition process is a CVD process having a deposition gas that may contain a silicon precursor and a nitrogen precursor or a precursor containing both silicon and nitrogen sources. Alternatively, the deposition process may be an ALD process having at least two deposition gases, such that, the substrate is sequentially exposed to a silicon precursor and a nitrogen precursor. The deposition process may be a thermal process, a radical process, or a combination thereof. For example, the substrate may be exposed to a process gas in the presence of an energy beam generated by a direct photoexcitation system.

Examples of suitable nitrogen precursors for forming silicon nitride materials at step 140 include ammonia ($NH_3$), hydrazine ($N_2H_4$), organic amines, organic hydrazines, organic diazines (e.g., methyldiazine (($H_3C$)NNH)), silylazides, silylhydrazines, hydrogen azide ($HN_3$), hydrogen cyanide (HCN), atomic nitrogen (N), nitrogen ($N_2$), derivatives thereof, or combinations thereof. Organic amines as nitrogen precursors include $R_xNH_{3-x}$, where each R is independently an alkyl group or an aryl group and x is 1, 2, or 3. Examples of organic amines include trimethylamine (($CH_3$)$_3$N), dimethylamine (($CH_3$)$_2$NH), methylamine (($CH_3$)$NH_2$)), triethylamine (($CH_3CH_2$)$_3$N), diethylamine (($CH_3CH_2$)$_2$NH), ethylamine (($CH_3CH_2$)$NH_2$)), tertbutylamine ((($CH_3$)$_3$C)$NH_2$), derivatives thereof, or combinations thereof. Organic hydrazines as nitrogen precursors include $R_xN_2H_{4-x}$, where each R is independently an alkyl group or an aryl group and x is 1, 2, 3, or 4. Examples of organic hydrazines include methylhydrazine (($CH_3$)$N_2H_3$), dimethylhydrazine (($CH_3$)$_2N_2H_2$), ethylhydrazine (($CH_3CH_2$)$N_2H_3$), diethylhydrazine (($CH_3CH_2$)$_2N_2H_2$), tertbutylhydrazine ((($CH_3$)$_3$C)$N_2H_3$), ditertbutylhydrazine ((($CH_3$)$_3$C)$_2N_2H_2$), radicals thereof, plasmas thereof, derivatives thereof, or combinations thereof.

In one embodiment, the nitrogen precursors ideally contain a nitrogen-nitrogen single bond (i.e., N—N single bond) for decomposition of the nitrogen precursor at low temperatures.

Additionally, when a silicon precursor and nitrogen precursor are used in the process gas mix, some amount of a nitrogen precursor may be included in the gas mix for additional control over the composition of the deposited layer during deposition. In a preferred example, the nitrogen precursor is ammonia. The nitrogen precursor generally disassociate at a temperature of less than about 500° C. with a high vapor pressure at room temperature. Examples of suitable nitrogen precursors and the respective vapor pressure include methylamine having a vapor pressure of about 353 kPa at 25° C., methylhydrazine having a vapor pressure of about 66 kPa at 25° C., and hydrocyanic acid having a vapor pressure of about 98.8 kPa at 25° C. (e.g., aqueous hydrogen cyanide solution).

Examples of suitable silicon precursors for forming silicon nitride materials at step 140 include aminosilanes, aminodisilanes, silylazides, silylhydrazines, or derivatives thereof. Some specific examples of silicon precursors include bis (tertbutylamino)silane (BTBAS or ($^t$Bu(H)N)$_2$SiH$_2$), hexachlorodisilane (HCD or Si$_2$Cl$_6$), tetrachlorosilane (SiCl$_4$), dichlorosilane (H$_2$SiCl$_2$), 1,2-diethyl-tetrakis(diethylamino)disilane ((CH$_2$CH$_3$((CH$_3$CH$_2$)$_2$N)$_2$Si)$_2$), 1,2-dichloro-tetrakis(diethylamino)disilane ((Cl((CH$_3$CH$_2$)$_2$N)$_2$Si)$_2$), hexakis(N-pyrrolidinio)disilane (((C$_4$H$_9$N)$_3$Si)$_2$), 1,1,2,2-tetrachloro-bis(di(trimethylsilyl)amino)disilane, ((Cl$_2$((CH$_3$)$_3$Si)$_2$N)Si)$_2$), 1,1,2,2-tetrachloro-bis(diisopropylamino) disilane, ((Cl$_2$((C$_3$H$_7$)$_2$N)Si)$_2$), 1,2-dimethyltetrakis (diethylamino) disilane ((CH$_3$(CH$_3$CH$_2$N)$_2$Si)$_2$), tris (dimethylamino)silane azide (((CH$_3$)$_2$N)$_3$SiN$_3$), tris (methylamino)silane azide (((CH$_3$)(H)N)$_3$SiN$_3$), 2,2-dimethylhydrazine-dimethylsilane ((CH$_3$)$_2$(H)Si)(H)NN (CH$_3$)$_2$), trisilylamine ((SiH$_3$)$_3$N or TSA), and hexakis (ethylamino)disilane (((EtHN)$_3$Si)$_2$), radicals thereof, plasmas thereof, derivatives thereof, or combinations thereof.

Silicon precursors that may be used to produce a silicon nitride material by the UV-assisted chemical vapor deposition at sufficiently high deposition rates while at a low temperatures include compounds having one or more Si—N bonds or Si—Cl bonds, such as bis(tertbutylamino)silane (BTBAS or ($^t$Bu(H)N)$_2$SiH$_2$) or hexachlorodisilane (HCD or Si$_2$Cl$_6$). Combination of a Si—Cl functional group (bond) and a Si—N functional group (bond) has been observed to improved step coverage and microloading especially for the ever decreasing temperatures at suitable deposition rates. The number of Si—Cl groups can be varied relative to the number of Si—N groups.

Silicon precursors having preferred bond structures described above have the chemical formulas:

R$_2$NSi(R'$_2$)Si(R'$_2$)NR$_2$ (aminodisilanes),     (I)

R$_3$SiN$_3$ (silylazides), or     (II)

R'$_3$SiNRNR$_2$ (silylhydrazines).     (III)

In the above chemical formulas, R and R' may be one or more functional groups independently selected from the group of a halogen, an organic group having one or more double bonds, an organic group having one or more triple bonds, an aliphatic alkyl group, a cyclical alkyl group, an aromatic group, an organosilyl group, an alkylamino group, or a cyclic group containing N or Si, or combinations thereof. Examples of suitable functional groups on silicon precursors include chloro (—Cl), methyl (—CH$_3$), ethyl (—CH$_2$CH$_3$), isopropyl (—CH(CH$_3$)$_2$), tertbutyl (—C(CH$_3$)$_3$), trimethylsilyl (—Si(CH$_3$)$_3$), pyrrolidine, or combinations thereof. It is believed that many of the silicon precursors or the nitrogen precursors described herein may decompose or disassociate at a low temperature, such as about 550° C. or less.

Other examples of suitable silicon precursors include silylazides R$_3$—SiN$_3$ and silylhydrazine class of precursors R$_3$SiNRNR$_2$, linear and cyclic with any combination of R groups. The R groups may be H or any organic functional group such as methyl, ethyl, propyl, butyl, and the like (C$_X$H$_Y$). The R groups attached to Si can optionally be another amino group NH$_2$ or NR$_2$. One benefit of using a silicon-nitrogen precursor is that silicon and nitrogen are simultaneously delivered while avoiding the presence of chlorine to yield films with good step coverage and minimal pattern dependence (so-called pattern loading) without the undesirable ammonium chloride particle formation problematic to other conventions Si—N film precursors. Examples of specific silylazide compounds include trimethylsilylazide ((CH$_3$)$_3$SiN$_3$) (available from United Chemical Technologies, located in Bristol, Pa.) and tris(dimethylamine)silylazide (((CH$_3$)$_2$N)$_3$SiN$_3$). An example of a specific silylhydrazine compound is 1,1-dimethyl-2-dimethylsilylhydrazine ((CH$_3$)$_2$HSiNHN(CH$_3$)$_2$). In another embodiment, the silicon-nitrogen precursor may be at least one of (R$_3$Si)$_3$N, (R$_3$Si)$_2$NN(SiR$_3$)$_2$ and (R$_3$Si)NN(SiR$_3$), wherein each R is independently hydrogen or an alkyl such as methyl, ethyl, propyl, butyl, phenyl, or combinations thereof. Examples of suitable silicon-nitrogen precursor include trisilylamine ((H$_3$Si)$_3$N), (H$_3$Si)$_2$NN(SiH$_3$)$_2$, (H$_3$Si)NN(SiH$_3$), or derivatives thereof.

In one example, a silicon nitride material may be deposited on substrate 1122 within process chamber 1100 during a deposition process at step 140. In one embodiment, substrate 1122 may be exposed to a process gas containing a silicon precursor and a nitrogen precursor during a CVD process. The silicon and nitrogen precursors are generally provided from gas panel 1136 to interior volume 1104 of chamber body 1102 through flow control ring 1142.

In one embodiment, the nitrogen precursor and the silicon precursor may be introduced at step 140 into process chamber or exposed to substrate 1122 by inlet port 1134 simultaneously, such as during a traditional CVD process or sequentially, such as during an ALD process. The ALD process may expose the substrate to at least two deposition gases, such that, the substrate is sequentially exposed to a silicon precursor and a nitrogen precursor. Although one gas line 1140 is shown disposed between gas panel 1136 and inlet port 1134, it is contemplated that the silicon precursor and the nitrogen precursor are provided to process chamber 1100 in separate gas lines. The temperature may be controlled for each gas line.

A description of CVD and ALD processes and apparatuses that may be modified (e.g., incorporating a UV radiation source) and chemical precursors that may be useful for depositing silicon nitride materials are further disclosed in commonly assigned U.S. Pat. Nos. 6,677,247, 6,869,838, and 6,825,134, and commonly assigned U.S. Ser. No. 09/964,075, filed Sep. 25, 2001, and published as US 2003-0059535, U.S. Ser. No. 10/263,555, filed May 16, 2002, and published as US 2003-0215570, U.S. Ser. No. 10/898,547, filed Jul. 23, 2004, and published as US 2006-0019032, U.S. Ser. No. 11/155,646, filed Jul. 17, 2005, U.S. Ser. No. 10/970,317, filed Oct. 20, 2004, and published as US 2006-0084283, and U.S. Ser. No. 10/688,797, filed Oct. 17, 2003, and published as US 2004-0224089, which are all herein incorporated by reference in their entirety.

As the silicon precursor and the nitrogen precursor may be combined in the process chamber, a silicon-containing material, such as a silicon nitride material, is formed on the substrate surface. The deposited silicon nitride material exhibits good film qualities such as reflective index and wet etch rate.

In one embodiment, the silicon nitride material may be deposited at a rate within a range from about 10 Å/min to about 500 Å/min and is deposited to a thickness within a range from about 10 Å to about 1,000 Å. Silicon nitride materials may have a chemical formula such as $Si_xN_y$, wherein a nitrogen: silicon atomic ratio (Y/X) is about 1.33 or less, for example, $Si_3N_4$. In one embodiment, the materials formed as described herein exhibits low hydrogen content and includes a small amount of carbon doping, which enhances boron retention in PMOS devices. In another embodiment, a halogen-free silicon precursor improves the wet etch rate.

A carrier gas may be provided during step 140 to control the partial pressure of the nitrogen precursor and the silicon precursor. The total internal pressure of a single wafer process chamber may be at a pressure within a range from about 100 mTorr to about 740 Torr, preferably, from about 250 mTorr to about 100 Torr, and more preferably, from about 500 mTorr to about 50 Torr. In one example, the internal pressure of the process chamber is maintained at a pressure of about 10 Torr or less, preferably, about 5 Torr or less, and more preferably, about 1 Torr or less. In some embodiments, the carrier gas may be provided to control the partial pressure of the nitrogen precursor or the silicon precursor within a range from about 100 mTorr to about 1 Torr for batch processing systems. Examples of suitable carrier gases include nitrogen, hydrogen, argon, helium, forming gas, or combinations thereof.

The substrate, the silicon precursor, and/or the nitrogen precursor may be exposed to an energy beam or a flux of energy generated by the photoexcitation system during the deposition process at step 140. The use of the energy beam advantageously increases the deposition rate and improves surface diffusion or mobility of atoms within the silicon nitride material to create active sites for incoming reactive species. In one embodiment, the beam has energy within a range from about 3.0 eV to about 9.84 eV. Also, the energy beam may have a wavelength within a range from about 126 nm to about 450 nm.

In one example, lamp 1170 of direct photoexcitation system 1192 and/or lamp 1184 of remote photoexcitation system 1182 provides an energy beam to supply the excitation energy of at least one of the silicon precursor or the nitrogen precursor. The high deposition rate and the low deposition temperature produce a film having tunable properties with minimal parasitic side reactions. In one embodiment, the energy beam or flux may have a photon energy within a range from about 4.5 eV to about 9.84 eV. The substrate surface and the process gases may also be excited by lamps 1170 and 1184.

Gas phase excitation and surface reactions are controlled by UV excimer selection. For example, optical excitation of $Si_2H_6$ may be achieved by using UV photons of hv>4.5 eV and hv>8 eV ($\lambda$<155 nm. Accordingly, intermediates of silanes—and $NH_3$* (405 nm), $NH_2$* (470.7 nm), NH* (336 nm) (with * indicating the compound in an excited state) enhances cross-linking between Si and N which may cause Si—N bond distortion in the SiN network, desirable for increasing film tensile stress.

In another embodiment, the substrate containing the silicon nitride material (formed in step 140) is exposed to a post-deposition treatment process during step 150. The post-deposition treatment process increases the substrate surface energy after deposition, which advantageously removes volatiles and/or other film contaminants (such as by reducing the hydrogen content) and/or anneals the deposited film. A lower concentration of hydrogen from the deposited material advantageously increases tensile stress of the film. At least one lamp (e.g., lamps 1170 or 1184) may alternatively be utilized to energize an energy delivery gas which is exposed to the substrate to increase the surface energy of the substrate after deposition and to remove volatiles and/or other films.

Optionally, at step 150, an energy delivery gas may be provided to interior volume 1104 of process chamber 1100. Examples of suitable energy delivery gases include nitrogen, hydrogen, helium, argon, and combinations thereof. Examples provide that substrate 1122 is treated with an energy beam or flux of energy generated by photoexcitation system 1144 during step 150. In one example, lamp 1170 of direct photoexcitation system 1192 provides an energy beam to supply the surface energy of substrate 1122 during step 150. In another example for annealing the silicon nitride material, the energy beam or flux may have a photon energy within a range from about 3.53 eV to about 9.84 eV. Also, lamp 1170 may produce an energy beam having a wavelength within a range from about 126 nm to about 351 nm. Generally, lamp 1170 may be energized for a time period within a range from about 1 minute to about 10 minutes to facilitate post deposition treatment by photoexcitation.

In one example, volatile compounds or contaminants may be removed from the deposited film surface by exposing the substrate to an energy beam having a photon energy within a range from about 3.2 eV to about 4.5 eV is generated by lamp 1170 and/or lamp 1184 is utilized to dissociate Si—H (3.21 eV), N—H (3.69 eV), NH—H (3.86 eV), $H_2N$—H (4.47 eV), and Si—N (4.51 eV) radicals within process chamber 1100. Thus, excimer lamps, such as XeBr* (283 nm/4.41 eV), $Br_2$* (289 nm/4.29 eV), XeCl* (308 nm/4.03 eV), $I_2$* (342 nm/3.63 eV), XeF* (351 nm/3.53 eV) may be selected to dissociate the Si—H and N—H bonds to remove hydrogen from the SiN network. It is contemplated that the rotational speed of the substrate may be changed, for example, by increasing the rotation speed in step 150 relative to the preceding deposition step.

In another embodiment, the substrate may be removed from the process chamber and the process chamber is subsequently exposed to a chamber clean process during step 160. The process chamber may be cleaned using a photoexcited cleaning agent. Alternatively, the cleaning agent may be provided from the remote plasma source 1190. In one embodiment, the cleaning agent includes fluorine.

Examples provide that the cleaning agent may be photoexcited within process chamber 1100 using lamp 1170, or remotely from process chamber 1100 using lamp 1184. In one example, lamp 1170 may be used to maintain the excitation level of cleaning agents formed by remote plasma source (RPS) 1190.

Process chamber 1100 may be cleaned during a chamber clean process to enhance deposition performance. For example, the chamber clean process may be used to remove contaminants contained on windows 1174 and 1186, thereby minimizing transmission losses of the energy beam or flux traveling through window 1174 or 1186 and maximizing the energy transferred to the gases and surfaces. It is also contemplated that windows 1174 and 1186 may be cleaned using a photoexcited agent formed from RPS 1190 during the chamber clean process. Windows 1174 and 1186 may be cleaned with greater frequency than process chamber 1100, for example, process chamber 1100 may be cleaned using RPS 1190 after processing a number of substrates while windows 1174 and 1186 are cleaned after processing each substrate.

The elemental composition of the silicon nitride material deposited during step 140 may be predetermined by controlling the concentration or flow rate of the chemical precursors, namely the silicon precursor and the nitrogen precursor. Film properties may be tailored for specific applications by controlling the relative concentrations of Si, O, N, C, and H within the silicon nitride material. In one embodiment, the elemental concentrations of silicon, nitrogen, and hydrogen may be tuned by varying the range of the UV energy during or subsequent the deposition process. The film properties include wet etch rate, dry etch rate, stress, dielectric constant, and the like. For example, by reducing the hydrogen content, the deposited material may have a higher tensile stress. In another example, by reducing the carbon content, the deposited material may have a lower electrical resistance.

Additionally, when using N—Si—R or N—Si—Si—R type of precursors, the dissociation of the silicon-source molecule takes place at lower temperatures, thereby enabling lower temperature processing. The functional group (e.g., Si—R or Si—Si) is weakly bonded compared to Si—N bond, since the bond enthalpy of Si—N (about 470 kJ/mol) is higher than that of Si—Si (about 327 kJ/mol) or Si—C (about 452 kJ/mol). Furthermore, the nitrogen precursors used in this invention that contain a carbon and hydrogen function group, which react with R or Si—R from N—Si—R or N—Si—Si—R in the silicon precursor, allow the R group to become dissociated and more easily removed than without reacting with nitrogen precursor. The nitrogen precursor provides nitrogen and carbon sources to the silicon nitride material. Thus, embodiments of the methods may advantageously facilitate low temperature processing, e.g., at temperatures of less than about 550° C.

Silicon nitride materials deposited during process 100 as described herein may be used throughout electronic features/devices due to several physical properties. Silicon nitride materials are electric insulators, as well as barrier materials. The barrier properties inhibit ion diffusion between dissimilar materials or elements when a silicon nitride material is placed therebetween, such as a gate material and an electrode, or between low dielectric constant porous materials and copper. Therefore, a silicon nitride material may be used in barrier layers, protective layers, off-set layers, spacer layers, and capping layers. Another physical property of silicon nitride materials is a high degree of hardness. In some applications, a silicon nitride material may be used as a protective coating for various optical devices as well as tools. Also, silicon nitride materials may be selectively etched relative to silicon oxide, i.e., silicon nitride may be used as an etch stop layer under a silicon oxide dielectric layer to accurately control etch depth without over or under etching. Silicon nitride materials may be formed containing a predetermined concentration of carbon and hydrogen to provide a desirable film stress, such as high tensile stress. In one embodiment, silicon nitride materials may be deposited during process 100 as layers on a substrate to form electronic features, such as a MOSFET transistor (FIGS. 5A-5B), a bi-polar transistor (FIG. 6), or other silicon-containing layers. In another embodiment, silicon nitride materials deposited by process 100 may be used throughout photovoltaic cell applications, such as to form a solar cell.

Silicon Oxide Materials

Figure 2:
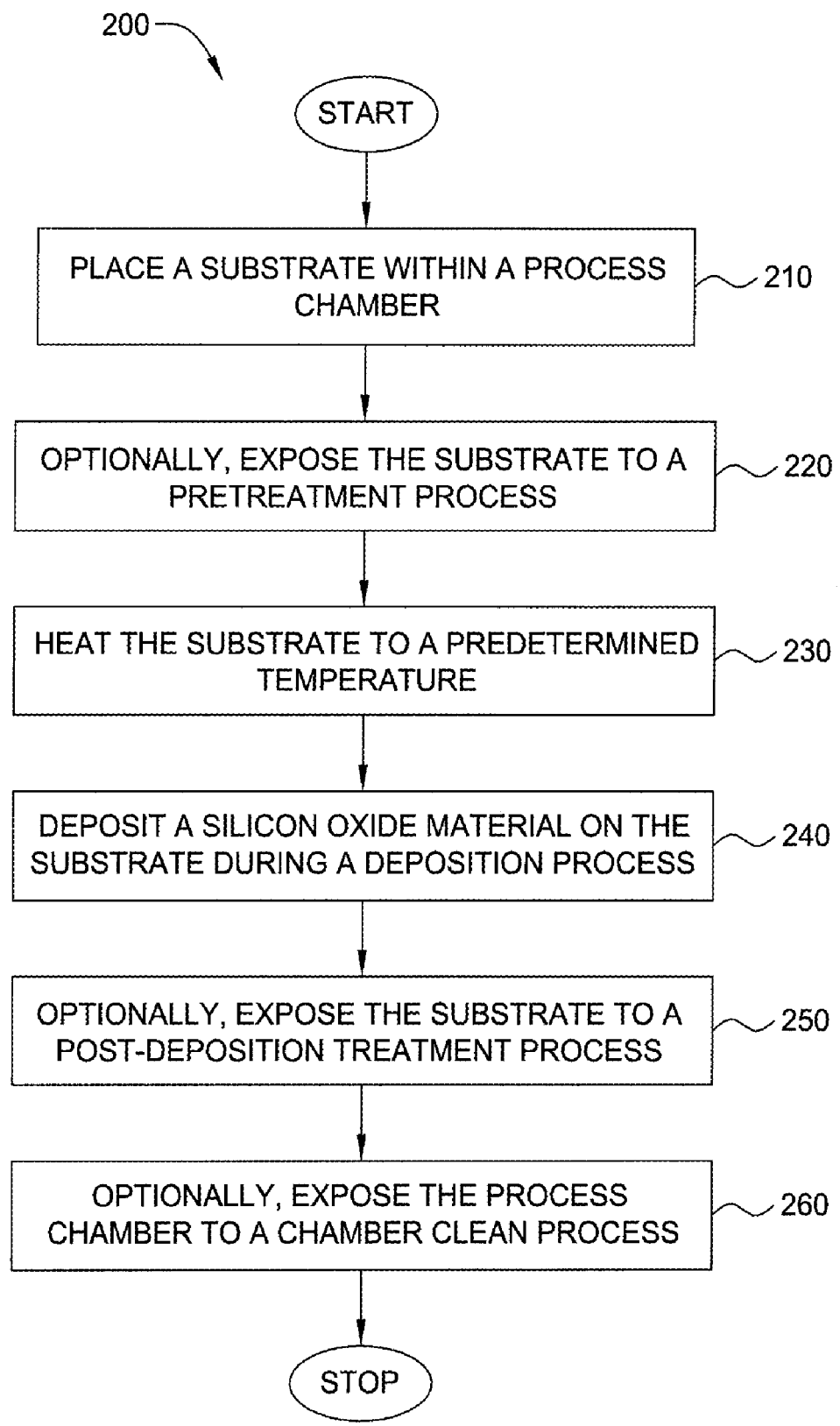
FIG. 2 is a flow diagram of a process for depositing a silicon oxide material as described by embodiments herein.

FIG. 2 depicts a flow diagram of process 200 for depositing a silicon oxide material, as described by embodiments herein. The substrate may be positioned within a process chamber (step 210), optionally exposed to a pretreatment process (step 220), and heated to a predetermined temperature (step 230). Subsequently, a silicon oxide material may be deposited on the substrate (step 240). The substrate may be optionally exposed to post-deposition treatment process (step 250) and the process chamber may be optionally exposed to a chamber clean process (step 260).

The substrate may be positioned within a process chamber during step 210. The process chamber may be a single wafer chamber or a batch chamber containing multiple wafers or substrates (e.g., 25, 50, 100, or more). The substrate may be maintained in a fixed position, but preferably, is rotated by a support pedestal. Optionally, the substrate may be indexed during one or more steps of process 200.

Process chamber 1100, depicted in FIG. 7, may be used during process 200 to deposit silicon oxide materials on substrate 1122 as described by examples herein. In one example, substrate 1122 may be rotated on substrate support pedestal 1124 within process chamber 1100 at a rate of up to about 120 rpm. Alternatively, substrate 1122 may be positioned on substrate support pedestal 1124 and not rotated during the deposition process.

In one embodiment, the substrate is optionally exposed to at least one pretreatment process during step 220. The substrate surface may contain native oxides that are removed during a pretreatment process. The substrate may be pretreated with an energy beam generated by direct photoexcitation system to remove the native oxides from the substrate surface prior to depositing a silicon oxide material during step 240. A process gas may be exposed to the substrate during the pretreatment process. In one embodiment, the process gas may contain argon, nitrogen, helium, hydrogen, forming gas, or combinations thereof. The pretreatment process may last for a time period within a range from about 2 minutes to about 10 minutes to facilitate native oxide removal during a photoexcitation process. Also, the substrate may be heated during step 220 to a temperature within a range from about 100° C. to about 800° C., preferably, from about 200° C. to about 600° C., and more preferably, from about 300° C. to about 500° C., to facilitate native oxide removal during process 200.

Examples provide that substrate 1122 may be exposed to an energy beam produced by lamp 1170 during step 220. Lamp 1170 may provide an energy beam having a photon energy within a range from about 2 eV to about 10 eV, for example, from about 3.2 eV to about 4.5 eV. In another example, lamp 1170 provides an energy beam of UV radiation having a wavelength within a range from about 126 nm to about 351 nm. Lamp 1170 may be energized for a period sufficient to remove oxides. The energization period is selected based upon the size and geometry of window 1174 (which corresponds to the exposed area of substrate 1122) and the substrate rotation speed. In one embodiment, lamp 1170 is energized for a time period within a range from about 2 minutes to about 10 minutes to facilitate native oxide removal during a photoexcitation process. In one example, substrate 1122 may be heated to a temperature within a range from about 100° C. to about 800° C. during step 220. In another example, substrate 1122 may be heated to a temperature within a range from about 300° C. to about 500° C. during step 220, while lamp 1170 provides an energy beam having a photon energy within a range from about 2 eV to about 10 eV for a time period within a range from about 2 minutes to about 5 minutes to facilitate native oxide removal. In one example, the energy beam has a photon energy within a range from about 3.2 eV to about 4.5 eV for about 3 minutes.

In another embodiment, native oxide removal may be augmented by a photoexcitation process in the presence of a process gas containing an energy delivery gas during a pretreatment process at step 220. The energy delivery gas may be neon, argon, krypton, xenon, argon bromide, argon chloride, krypton bromide, krypton chloride, krypton fluoride, xenon fluorides (e.g., $XeF_2$), xenon chlorides, xenon bromides, fluorine, chlorine, bromine, excimers thereof, radicals thereof, derivatives thereof, or combinations thereof. In another embodiment, the energy delivery gas may contain ozone, oxygen, hydrogen, water, hydroxyls, radicals thereof, plasma thereof, or combinations thereof. In some embodiments, the process gas may also contain nitrogen gas ($N_2$), hydrogen gas ($H_2$), forming gas (e.g., $N_2/H_2$ or $Ar/H_2$) besides at least one energy delivery gas.

In one example, substrate 1122 may be exposed to a process gas containing an energy delivery gas by providing the process gas to interior volume 1104 of process chamber 1100 during step 220. The energy delivery gas may be provided through flow control ring 1142 from gas panel 1136. The proximately of the process gas to lamp 1170 compared to substrate 1122 readily excites the energy delivery gas therein. As the energy delivery gas de-excites and moves closer to substrate 1122, the energy is efficiently transferred to the surface of substrate 1122, thereby facilitating the removal of native oxides.

In another embodiment, native oxide removal may be augmented by a photoexcitation process in the presence of a process gas containing an organic vapor during the pretreatment process at step 220. In one example, the substrate may be exposed to the process gas containing a cyclic aromatic hydrocarbon. The cyclic aromatic hydrocarbon may be in the presence of UV radiation. Monocyclic aromatic hydrocarbons and polycyclic aromatic hydrocarbons that are useful during a pretreatment process include quinone, hydroxyquinone (hydroquinone), anthracene, naphthalene, phenanthracene, derivatives thereof, or combinations thereof. In another example, the substrate may be exposed to the process gas containing other hydrocarbons, such as unsaturated hydrocarbons, including ethylene, acetylene (ethyne), propylene, alkyl derivatives, halogenated derivates, or combinations thereof. In another example, the organic vapor may contain alkane compounds during the pretreatment process at step 220.

In one example, the UV radiation having a wavelength within a range from about 126 nm to about 351 nm may be generated by a lamp during step 220. In another embodiment, polycyclic aromatic hydrocarbons may remove native oxides in the presence of UV radiation by reacting with oxygen atoms within the native oxides. In another embodiment, native oxides may be removed by exposing the substrate to quinone or hydroxyquinone while forming derivative products. The derivative product may be removed from the process chamber by a vacuum pumping process.

At step 230, the substrate may be heated to a predetermined temperature during or subsequent to the pretreatment process. The substrate is heated prior to depositing the silicon oxide material at step 240. The substrate may be heated by an embedded heating element within the substrate support, the energy beam (e.g., UV-source), or combinations thereof. Generally, the substrate is heated long enough to obtain the predetermined temperature, such as for a time period within a range from about 15 seconds to about 30 minutes, preferably, from about 30 seconds to about 20 minutes, and more preferably, from about 1 minute to about 10 minutes. In one embodiment, the substrate may be heated to a temperature within a range from about 200° C. to about 1,000° C., preferably, from about 400° C. to about 850° C., and more preferably, from about 500° C. to about 900° C. In another embodiment, the substrate may be heated to a temperature of less than about 550° C., preferably, less than about 450° C.

In one example, substrate 1122 may be heated to the predetermined temperature within process chamber 1100. The predetermined temperature may be within a range from about 300° C. to about 500° C. Substrate 1122 may be heated by applying power from power source 1116 to the resistive heating element (i.e., the heater 1120).

In one embodiment, a silicon oxide material is deposited on the substrate during a deposition process at step 240. The silicon oxide material may be formed by exposing the substrate to at least one deposition gas during the deposition process. In one example, the deposition process is a CVD process having a deposition gas that may contain a silicon precursor and an oxygen precursor or a precursor containing both silicon and oxygen sources. Alternatively, the deposition process may be an ALD process having at least two deposition gases, such that, the substrate is sequentially exposed to a silicon precursor and an oxygen precursor. The deposition process may be a thermal process, a radical process, or a combination thereof. For example, the substrate may be exposed to a process gas in the presence of an energy beam generated by a direct photoexcitation system.

Examples of suitable oxygen precursors for forming silicon oxide materials during step 240 include atomic oxygen (O), oxygen ($O_2$), ozone ($O_3$), water ($H_2O$), hydrogen peroxide ($H_2O_2$), organic peroxides, alcohols, nitrous oxide ($N_2O$), nitric oxide (NO), nitrogen dioxide ($NO_2$), dinitrogen pentoxide ($N_2O_5$), plasmas thereof, radicals thereof, derivatives thereof, or combinations thereof. In one embodiment, an oxygen precursor may be formed by combining ozone and water to provide a strong oxidizing agent. The oxygen precursor generally contains hydroxyl radicals (OH) which have strong oxidizing power. The ozone concentration may vary relative to the water concentration. A molar ratio of ozone to water ratio may be within a range from about 0.01 to about 30, preferably, from about 0.03 to about 3, and more preferably, from about 0.1 to about 1. In one example, an energy beam derived from a UV source may be exposed to oxygen or an oxygen/water mixture to form an oxygen precursor containing ozone. In another embodiment, the energy delivery gas and/or the atmosphere within the chamber during the photoexcitation step includes oxygen and/or ozone.

Examples of suitable silicon precursors for forming silicon oxide materials during step 240 include silanes, alkylsilanes, halosilanes, alkoxysilanes, aminosilanes, aminodisilanes, silylazides, silylhydrazines, or derivatives thereof. Some specific examples of silicon precursors include silane ($SiH_4$), disilane ($Si_2H_6$), trisilane ($Si_3H_8$), methylsilane ($CH_3SiH_3$), bis(tertbutylamino)silane (BTBAS or ($^tBu(H)N)_2SiH_2$), tetraethoxysilane (($EtO)_4Si$ or TEOS), hexachlorodisilane (HCD or $Si_2Cl_6$), tetrachlorosilane ($SiCl_4$), dichlorosilane ($H_2SiCl_2$), 1,2-diethyl-tetrakis(diethylamino)disilane (($CH_2CH_3((CH_3CH_2)_2N)_2Si)_2$), 1,2-dichloro-tetrakis(diethylamino) disilane (($Cl((CH_3CH_2)_2N)_2Si)_2$), hexakis(N-pyrrolidinio)disilane ((($C_4H_9N)_3)Si)_2$), 1,1,2,2-tetrachloro-bis(di(trimethylsilyl)amino)disilane, (($Cl_2((CH_3)_3Si)_2N)Si)_2$), 1,1,2,2-tetrachloro-bis(diisopropylamino)disilane, (($Cl_2((C_3H_7)_2N)Si)_2$), 1,2-dimethyltetrakis(diethylamino)disilane (($CH_3(CH_3CH_2N)_2Si)_2$), tris(dimethylamino)silane azide ((($CH_3)_2N)_3SiN_3$), tris(methylamino)silane azide ((($CH_3)(H)N)_3SiN_3$), 2,2-dimethylhydrazine-dimethylsilane (($CH_3)_2(H)Si)(H)NN(CH_3)_2$), trisilylamine (($SiH_3)_3N$ or TSA), and hexakis(ethylamino)disilane ((($EtHN)_3Si)_2$), radicals thereof, plasmas thereof, derivatives thereof, or combinations thereof. In many embodiments, the silicon precursors for forming silicon oxide materials during step 240 include the same silicon precursors as described at step 140 during process 100.

In another embodiment, an alkoxysilane compound is used as the silicon precursors for forming silicon oxide materials during step 240. The alkoxysilane may have the chemical formula $(RO)_n SiR'_{(4-n)}$, wherein n=1, 2, 3, or 4, each R, independently, may be methyl, ethyl, propyl, butyl, or other alkyl group, and each R', independently, may be hydrogen, a halogen group, methyl, ethyl, propyl, butyl, or other alkyl group. Examples of alkoxysilane compounds that may be used as silicon precursors include tetraethoxysilane (($EtO)_4Si$ or TEOS), tetramethoxysilane (($MeO)_4Si$), tetrapropoxysilane (($PrO)_4Si$), tetraisopropoxysilane (($^iPrO)_4Si$), tetrabutoxysilane (($BuO)_4Si$), triethoxysilane (($EtO)_3SiH$), diethoxysilane (($EtO)_2SiH_2$), diethoxydimethylsilane (($EtO)_2SiMe_2$), diethoxydiethylsilane (($EtO)_2SiEt_2$), dimethoxydiethoxsilane (($MeO)_2Si(OEt)_2$), derivatives thereof, or combinations thereof. In another embodiment, an alkoxysilane compound (e.g., TEOS) may be used as a source for both silicon and oxygen, instead of separate silicon and oxygen precursors, to form a silicon oxide material during step 240.

In one example, a silicon oxide material may be deposited on substrate 1122 within process chamber 1100 during a deposition process at step 240. In one embodiment, substrate 1122 may be exposed to a process gas containing a silicon precursor and an oxygen precursor during a CVD process. The silicon and oxygen precursors are generally provided from gas panel 1136 to interior volume 1104 of chamber body 1102 through flow control ring 1142.

In one embodiment, at step 240, the oxygen precursor and the silicon precursor may be introduced into process chamber or exposed to substrate 1122 by inlet port 1134 simultaneously, such as during a traditional CVD process or sequentially, such as during an ALD process. The ALD process may expose the substrate to at least two deposition gases, such that, the substrate is sequentially exposed to a silicon precursor and an oxygen precursor. Although one gas line 1140 is shown disposed between gas panel 1136 and inlet port 1134, it is contemplated that the silicon precursor and the oxygen precursor are provided to process chamber 1100 in separate gas lines. The temperature may be controlled for each gas line.

A description of CVD and ALD processes and apparatuses that may be modified (e.g., incorporating a UV radiation source) and chemical precursors that may be useful for depositing silicon oxide materials are further disclosed in commonly assigned U.S. Pat. Nos. 6,869,838, 6,825,134, 6,905,939, and 6,924,191, and commonly assigned U.S. Ser. No. 09/964,075, filed Sep. 25, 2001, and published as US 2003-0059535, U.S. Ser. No. 10/624,763, filed Jul. 21, 2003, and published as US 2004-0018738, U.S. Ser. No. 10/794,707, filed Mar. 4, 2004, and published as US 2004-0175961, and U.S. Ser. No. 10/688,797, filed Oct. 17, 2003, and published as US 2004-0224089, which are all herein incorporated by reference in their entirety.

As the silicon precursor and the oxygen precursor may be combined in the process chamber, a silicon-containing material, such as a silicon oxide material, is formed on the substrate surface. In one embodiment, the silicon oxide material may be deposited at a rate within a range from about 10 Å/min to about 500 Å/min and is deposited to a thickness within a range from about 10 Å to about 1,000 Å. Silicon oxide materials may have a chemical formula such as $Si_xO_y$, wherein an oxygen:silicon atomic ratio (Y/X) is about 2 or less, for example, $SiO_2$. In one embodiment, the materials formed as described herein exhibits low hydrogen concentration and includes a small amount of carbon doping, which enhances boron retention in PMOS devices. In another embodiment, a halogen-free silicon precursor improves the wet etch rate.

A carrier gas may be provided during step 240 to control the partial pressure of the oxygen precursor and the silicon precursor. The total internal pressure of a single wafer process chamber may be at a pressure within a range from about 100 mTorr to about 740 Torr, preferably, from about 250 mTorr to about 100 Torr, and more preferably, from about 500 mTorr to about 50 Torr. In one example, the internal pressure of the process chamber is maintained at a pressure of about 10 Torr or less, preferably, about 5 Torr or less, and more preferably, about 1 Torr or less. In some embodiments, the carrier gas may be provided to control the partial pressure of the nitrogen precursor or the silicon precursor within a range from about 100 mTorr to about 1 Torr for batch processing systems. Examples of suitable carrier gases include nitrogen, hydrogen, argon, helium, forming gas, or combinations thereof.

The substrate, the silicon precursor, and/or the oxygen precursor may be exposed to an energy beam or a flux of energy generated by the photoexcitation system during the deposition process at step 240. The use of the energy beam advantageously increases the deposition rate and improves surface diffusion or mobility of atoms within the silicon oxygen material to create active sites for incoming reactive species. In one embodiment, the beam has energy within a range from about 3.0 eV to about 9.84 eV. Also, the energy beam may have a wavelength within a range from about 126 nm to about 450 nm.

In one example, lamp 1170 of direct photoexcitation system 1192 and/or lamp 1184 of remote photoexcitation system 1182 provides an energy beam to supply the excitation energy of at least one of the silicon precursor or the oxygen precursor. The high deposition rate and the low deposition temperature produce a film having tunable properties with minimal parasitic side reactions. In one embodiment, the energy beam or flux may have a photon energy within a range from about 4.5 eV to about 9.84 eV. The substrate surface and the process gases may also be excited by lamps 1170 and 1184.

In another embodiment, the substrate containing the silicon oxide material (formed in step 240) is exposed to a post-deposition treatment process during step 250. The post-deposition treatment process increases the substrate surface energy after deposition, which advantageously removes volatiles and/or other film contaminants (such as by reducing the hydrogen content) and/or anneals the deposited film. A lower concentration of hydrogen from the deposited material advantageously increases tensile stress of the film. At least one lamp (e.g., lamps 1170 or 1184) may alternatively be utilized to energize an energy delivery gas which is exposed to the substrate to increase the surface energy of the substrate after deposition and to remove volatiles and/or other films.

Optionally, at step 250, an energy delivery gas may be provided to interior volume 1104 of process chamber 1100. Examples of suitable energy delivery gases include nitrogen, hydrogen, helium, argon, ozone, oxygen, hydrogen, water, hydroxyls, radicals thereof, plasma thereof, or combinations thereof. Examples provide that substrate 1122 is treated with an energy beam or flux of energy generated by photoexcitation system 1144 during step 250. In one example, lamp 1170 of direct photoexcitation system 1192 provides an energy beam to supply the surface energy of substrate 1122 during step 250. In another example for annealing the silicon oxide material, the energy beam or flux may have a photon energy within a range from about 3.53 eV to about 9.84 eV. Also, lamp 1170 may produce an energy beam having a wavelength within a range from about 126 nm to about 351 nm. Generally, lamp 1170 may be energized for a time period within a range from about 1 minute to about 10 minutes to facilitate post deposition treatment by photoexcitation.

In one example, volatile compounds or contaminants may be removed from the deposited film surface by exposing the substrate to an energy beam having a photon energy within a range from about 3.2 eV to about 4.5 eV is generated by lamp 1170 and/or lamp 1184 is utilized to dissociate silicon precursors and oxygen precursors within process chamber 1100. Thus, excimer lamps, such as XeBr* (283 nm/4.41 eV), Br$_2$* (289 nm/4.29 eV), XeCl* (308 nm/4.03 eV), I$_2$* (342 nm/3.63 eV), XeF* (351 nm/3.53 eV) may be selected to remove hydrogen from the SiO$_x$ network. It is contemplated that the rotational speed of substrate 1122 may be changed, for example, by increasing the rotation speed in step 250 relative to the preceding deposition step.

In another embodiment, the substrate may be removed from the process chamber and the process chamber is subsequently exposed to a chamber clean process during step 260. The process chamber may be cleaned using a photoexcited cleaning agent. Alternatively, the cleaning agent may be provided from the remote plasma source 1190. In one embodiment, the cleaning agent includes fluorine.

Examples provide that the cleaning agent may be photoexcited within process chamber 1100 using lamp 1170, or remotely from process chamber 1100 using lamp 1184. In one example, lamp 1170 may be used to maintain the excitation level of cleaning agents formed by RPS 1190.

Process chamber 1100 may be cleaned during a chamber clean process to enhance deposition performance. For example, the chamber clean process may be used to remove contaminants contained on windows 1174 and 1186, thereby minimizing transmission losses of the energy beam or flux traveling through window 1174 or 1186 and maximizing the energy transferred to the gases and surfaces. It is also contemplated that windows 1174 and 1186 may be cleaned using a photoexcited agent formed from RPS 1190 during the chamber clean process. Windows 1174 and 1186 may be cleaned with greater frequency than process chamber 1100, for example, process chamber 1100 may be cleaned using RPS 1190 after processing a number of substrates while windows 1174 and 1186 are cleaned after processing each substrate.

The elemental composition of the silicon oxide material deposited during step 240 may be predetermined by controlling the concentration or flow rate of the chemical precursors, namely the silicon precursor and the oxygen precursor. Film properties may be tailored for specific applications by controlling the relative concentrations of Si, O, N, C, and H within the silicon oxide material. In one embodiment, the elemental concentrations of silicon, nitrogen, and hydrogen may be tuned by varying the range of the UV energy during or subsequent the deposition process. The film properties include wet etch rate, dry etch rate, stress, dielectric constant, and the like. For example, by reducing the hydrogen content, the deposited material may have a higher tensile stress. In another example, by reducing the carbon content, the deposited material may have a lower electrical resistance.

Silicon oxide materials deposited utilizing process 200 may be used throughout electronic features/devices due to several physical properties. The silicon oxide materials may be deposited as layers on a substrate to form electronic features, such as a MOSFET transistor (FIGS. 5A-5B), a bi-polar transistor (FIG. 6), or other silicon-containing layers. In another embodiment, silicon oxide materials deposited by process 200 may be used throughout photovoltaic cell applications, such as to form a solar cell.

Silicon Oxynitride Materials

Figure 3:
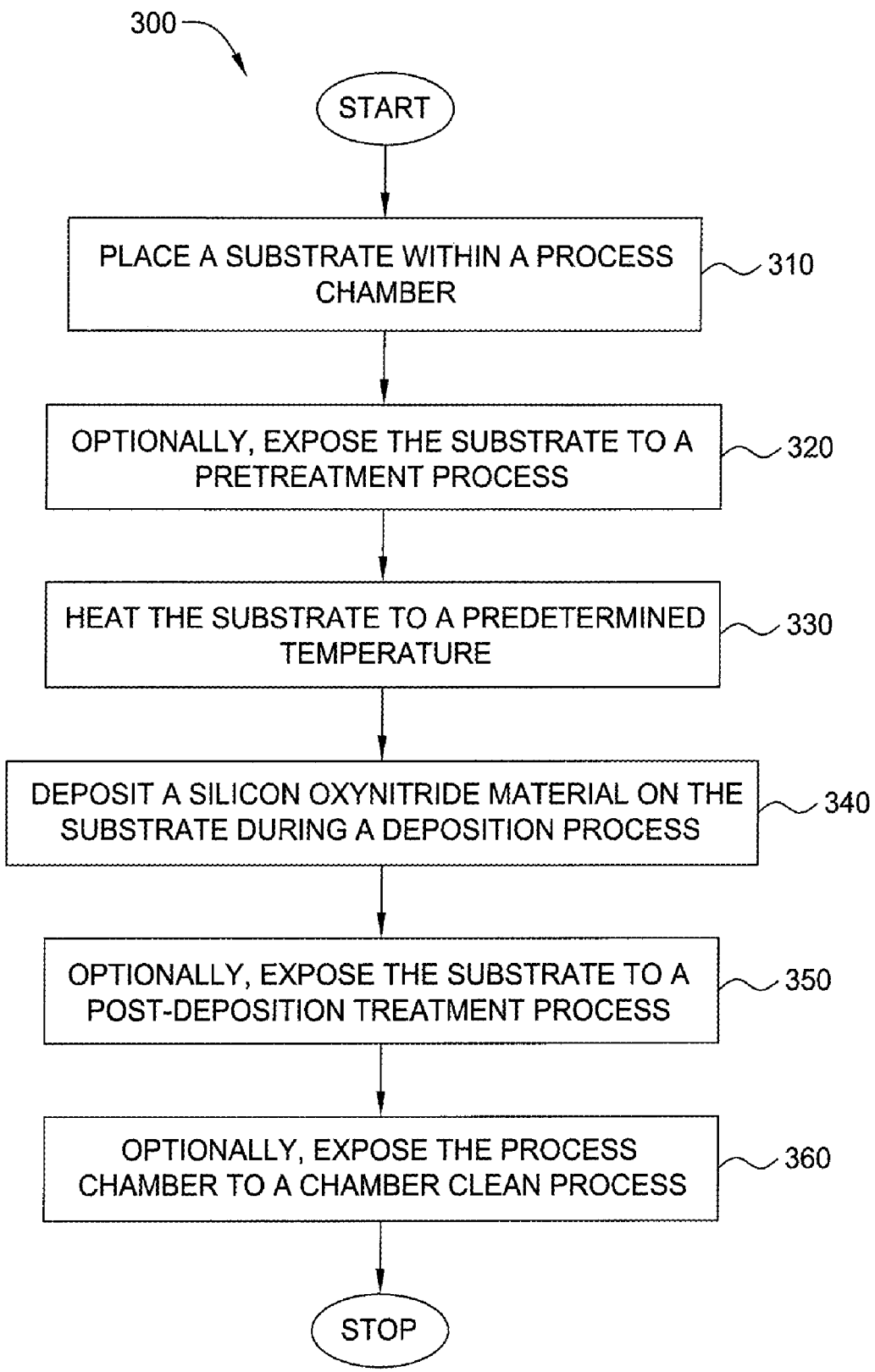
FIG. 3 is a flow diagram of a process for depositing a silicon oxynitride material as described by embodiments herein.

FIG. 3 depicts a flow diagram of process 300 for depositing a silicon oxynitride material, as described by embodiments herein. The substrate may be positioned within a process chamber (step 310), optionally exposed to a pretreatment process (step 320), and heated to a predetermined temperature (step 330). Subsequently, a silicon oxynitride material may be deposited on the substrate (step 340). The substrate may be optionally exposed to post-deposition treatment process (step 350) and the process chamber may be optionally exposed to a chamber clean process (step 360).

The substrate may be positioned within a process chamber during step 310. The process chamber may be a single wafer chamber or a batch chamber containing multiple wafers or substrates (e.g., 25, 50, 100, or more). The substrate may be maintained in a fixed position, but preferably, is rotated by a support pedestal. Optionally, the substrate may be indexed during one or more steps of process 300.

Process chamber 1100, depicted in FIG. 7, may be used during process 300 to deposit silicon oxynitride materials on substrate 1122 as described by examples herein. In one example, substrate 1122 may be rotated on substrate support pedestal 1124 within process chamber 1100 at a rate of up to about 120 rpm. Alternatively, substrate 1122 may be positioned on substrate support pedestal 1124 and not rotated during the deposition process.

In one embodiment, the substrate is optionally exposed to at least one pretreatment process during step 320. The substrate surface may contain native oxides that are removed during a pretreatment process. The substrate may be pretreated with an energy beam generated by direct photoexcitation system to remove the native oxides from the substrate surface prior to depositing a silicon oxynitride material during step 340. A process gas may be exposed to the substrate during the pretreatment process. The process gas may contain argon, nitrogen, helium, hydrogen, forming gas, or combinations thereof. The pretreatment process may last for a time period within a range from about 2 minutes to about 10 minutes to facilitate native oxide removal during a photoexcitation process. Also, the substrate may be heated during step 320 to a temperature within a range from about 100° C. to about 800° C., preferably, from about 200° C. to about 600° C., and more preferably, from about 300° C. to about 500° C., to facilitate native oxide removal during process 300.

Examples provide that substrate 1122 may be exposed to an energy beam produced by lamp 1170 during step 320. Lamp 1170 may provide an energy beam having a photon energy within a range from about 2 eV to about 10 eV, for example, from about 3.2 eV to about 4.5 eV. In another example, lamp 1170 provides an energy beam of UV radiation having a wavelength within a range from about 126 nm to about 351 nm. Lamp 1170 may be energized for a period sufficient to remove oxides. The energization period is selected based upon the size and geometry of window 1174 (which corresponds to the exposed area of substrate 1122) and the substrate rotation speed. In one embodiment, lamp 1170 is energized for a time period within a range from about 2 minutes to about 10 minutes to facilitate native oxide removal during a photoexcitation process. In one example, substrate 1122 may be heated to a temperature within a range from about 100° C. to about 800° C. during step 320. In another example, substrate 1122 may be heated to a temperature within a range from about 300° C. to about 500° C. during step 320, while lamp 1170 provides an energy beam having a photon energy within a range from about 2 eV to about 10 eV for a time period within a range from about 2 minutes to about 5 minutes to facilitate native oxide removal. In one example, the energy beam has a photon energy within a range from about 3.2 eV to about 4.5 eV for about 3 minutes.

In another embodiment, native oxide removal may be augmented by a photoexcitation process in the presence of a process gas containing an energy delivery gas during a pretreatment process at step 320. The energy delivery gas may be neon, argon, krypton, xenon, argon bromide, argon chloride, krypton bromide, krypton chloride, krypton fluoride, xenon fluorides (e.g., $XeF_2$), xenon chlorides, xenon bromides, fluorine, chlorine, bromine, excimers thereof, radicals thereof, derivatives thereof, or combinations thereof. In another embodiment, the energy delivery gas may contain ozone, oxygen, hydrogen, water, hydroxyls, radicals thereof, plasma thereof, or combinations thereof. In some embodiments, the process gas may also contain nitrogen gas ($N_2$), hydrogen gas ($H_2$), forming gas (e.g., $N_2/H_2$ or $Ar/H_2$) besides at least one energy delivery gas.

In one example, substrate 1122 may be exposed to a process gas containing an energy delivery gas by providing the process gas to interior volume 1104 of process chamber 1100 during step 320. The energy delivery gas may be provided through flow control ring 1142 from gas panel 1136. The proximately of the process gas to lamp 1170 compared to substrate 1122 readily excites the energy delivery gas therein. As the energy delivery gas de-excites and moves closer to substrate 1122, the energy is efficiently transferred to the surface of substrate 1122, thereby facilitating the removal of native oxides.

In another embodiment, native oxide removal may be augmented by a photoexcitation process in the presence of a process gas containing an organic vapor during the pretreatment process at step 320. In one example, the substrate may be exposed to the process gas containing a cyclic aromatic hydrocarbon. The cyclic aromatic hydrocarbon may be in the presence of UV radiation. Monocyclic aromatic hydrocarbons and polycyclic aromatic hydrocarbons that are useful during a pretreatment process include quinone, hydroxyquinone (hydroquinone), anthracene, naphthalene, phenanthracene, derivatives thereof, or combinations thereof. In another example, the substrate may be exposed to the process gas containing other hydrocarbons, such as unsaturated hydrocarbons, including ethylene, acetylene (ethyne), propylene, alkyl derivatives, halogenated derivates, or combinations thereof. In another example, the organic vapor may contain alkane compounds during the pretreatment process at step 320.

In one example, the UV radiation having a wavelength within a range from about 126 nm to about 351 nm may be generated by a lamp during step 320. In another embodiment, polycyclic aromatic hydrocarbons may remove native oxides in the presence of UV radiation by reacting with oxygen atoms within the native oxides. In another embodiment, native oxides may be removed by exposing the substrate to quinone or hydroxyquinone while forming derivative products. The derivative product may be removed from the process chamber by a vacuum pumping process.

At step 330, the substrate may be heated to a predetermined temperature during or subsequent to the pretreatment process. The substrate is heated prior to depositing the silicon oxynitride material at step 340. The substrate may be heated by an embedded heating element within the substrate support, the energy beam (e.g., UV-source), or combinations thereof. Generally, the substrate is heated long enough to obtain the predetermined temperature, such as for a time period within a range from about 15 seconds to about 30 minutes, preferably, from about 30 seconds to about 20 minutes, and more preferably, from about 1 minute to about 10 minutes. In one embodiment, the substrate may be heated to a temperature within a range from about 200° C. to about 1,000° C., preferably, from about 400° C. to about 850° C., and more preferably, from about 550° C. to about 800° C. In another embodiment, the substrate may be heated to a temperature of less than about 550° C., preferably, less than about 450° C.

In one example, substrate 1122 may be heated to the predetermined temperature within process chamber 1100. The predetermined temperature may be within a range from about 300° C. to about 500° C. Substrate 1122 may be heated by applying power from power source 1116 to the resistive heating element (i.e., the heater 1120).

In one embodiment, a silicon oxynitride material is deposited on the substrate during a deposition process at step 340. The silicon oxynitride material may be formed by exposing the substrate to at least one deposition gas during the deposition process. In one example, the deposition process is a CVD process having a deposition gas that may contain a silicon precursor and an oxygen precursor or a precursor containing both silicon and oxygen sources. Alternatively, the deposition process may be an ALD process having at least two deposition gases, such that, the substrate is sequentially exposed to a silicon precursor and an oxygen precursor. The deposition process may be a thermal process, a radical process, or a combination thereof. For example, the substrate may be exposed to a process gas in the presence of an energy beam generated by a direct photoexcitation system.

Examples of suitable oxygen precursors for forming silicon oxynitride materials during step 340 include atomic oxygen (O), oxygen ($O_2$), ozone ($O_3$), water ($H_2O$), hydrogen peroxide ($H_2O_2$), organic peroxides, alcohols, nitrous oxide ($N_2O$), nitric oxide (NO), nitrogen dioxide ($NO_2$), dinitrogen pentoxide ($N_2O_5$), plasmas thereof, radicals thereof, derivatives thereof, or combinations thereof. In one embodiment, an oxygen precursor may be formed by combining ozone and water to provide a strong oxidizing agent. The oxygen precursor generally contains hydroxyl radicals (OH) which have strong oxidizing power. The ozone concentration may vary relative to the water concentration. A molar ratio of ozone to water ratio may be within a range from about 0.01 to about 30, preferably, from about 0.03 to about 3, and more preferably, from about 0.1 to about 1. In one example, an energy beam derived from a UV source may be exposed to oxygen or an oxygen/water mixture to form an oxygen precursor containing ozone. In another embodiment, the energy delivery gas and/or the atmosphere within the chamber during the photoexcitation step includes oxygen and/or ozone.

Examples of suitable nitrogen precursors for forming silicon oxynitride materials during step 340 include ammonia ($NH_3$), hydrazine ($N_2H_4$), organic amines, organic hydrazines, organic diazines (e.g., methyldiazine (($H_3C$)NNH)), silylazides, silylhydrazines, hydrogen azide ($HN_3$), hydrogen cyanide (HCN), atomic nitrogen (N), nitrogen ($N_2$), derivatives thereof, or combinations thereof. Organic amines as nitrogen precursors include $R_xNH_{3-x}$, where each R is independently an alkyl group or an aryl group and x is 1, 2, or 3. Examples of organic amines include trimethylamine (($CH_3)_3$N), dimethylamine (($CH_3)_2$NH), methylamine (($CH_3)NH_2$)), triethylamine (($CH_3CH_2)_3$N), diethylamine (($CH_3CH_2)_2$NH), ethylamine (($CH_3CH_2)NH_2$)), tertbutylamine ((($CH_3)_3$C)$NH_2$), derivatives thereof, or combinations thereof. Organic hydrazines as nitrogen precursors include $R_xN_2H_{4-x}$, where each R is independently an alkyl group or an aryl group and x is 1, 2, 3, or 4. Examples of organic hydrazines include methylhydrazine (($CH_3)N_2H_3$), dimethylhydrazine (($CH_3)_2N_2H_2$), ethylhydrazine (($CH_3CH_2)N_2H_3$), diethylhydrazine (($CH_3CH_2)_2N_2H_2$), tertbutylhydrazine ((($CH_3)_3C)N_2H_3$), ditertbutylhydrazine ((($CH_3)_3C)_2N_2H_2$), radicals thereof, plasmas thereof, derivatives thereof, or combinations thereof.

In one embodiment, the nitrogen precursors ideally contain a nitrogen-nitrogen single bond (i.e., N—N single bond) for decomposition of the nitrogen precursor at low temperatures. Additionally, when a silicon precursor and nitrogen precursor are used in the process gas mix, some amount of a nitrogen precursor may be included in the gas mix for additional control over the composition of the deposited layer during deposition. In a preferred example, the nitrogen precursor is ammonia. The nitrogen precursor generally disassociate at a temperature of less than about 500° C. with a high vapor pressure at room temperature. Examples of suitable nitrogen precursors and the respective vapor pressure include methylamine (vapor pressure of about 353 kPa at 25° C.), methylhydrazine (vapor pressure of about 66 kPa at 25° C.), and hydrocyanic acid (e.g., aqueous hydrogen cyanide solution) (vapor pressure of about 98.8 kPa at 25° C.).

Examples of suitable silicon precursors for forming silicon oxynitride materials during step 340 include silanes, alkylsilanes, halosilanes, alkoxysilanes, aminosilanes, aminodisilanes, silylazides, silylhydrazines, or derivatives thereof. Some specific examples of silicon precursors include silane ($SiH_4$), disilane ($Si_2H_6$), trisilane ($Si_3H_8$), methylsilane ($CH_3SiH_3$), tetraethoxysilane (($EtO)_4Si$ or TEOS), bis(tert-butylamino)silane (BTBAS or ($^tBu(H)N)_2SiH_2$), hexachlorodisilane (HCD or $Si_2Cl_6$), tetrachlorosilane ($SiCl_4$), dichlorosilane ($H_2SiCl_2$), 1,2-diethyl-tetrakis(diethylamino)disilane (($CH_2CH_3((CH_3CH_2)_2N)_2Si)_2$), 1,2-dichloro-tetrakis(diethylamino)disilane (($Cl((CH_3CH_2)_2N)_2Si)_2$), hexakis(N-pyrrolidinio)disilane ((($C_4H_9N)_3Si)_2$), 1,1,2,2-tetrachloro-bis(di(trimethylsilyl)amino)disilane (($Cl_2((CH_3)_3Si)_2N)Si)_2$), 1,1,2,2-tetrachloro-bis(diisopropylamino)disilane, (($Cl_2((C_3H_7)_2N)Si)_2$), 1,2-dimethyltetrakis(diethylamino)disilane (($CH_3(CH_3CH_2N)_2Si)_2$), tris(dimethylamino)silane azide ((($CH_3)_2N)_3SiN_3$), tris(methylamino)silane azide ((($CH_3)(H)N)_3SiN_3$), 2,2-dimethylhydrazine-dimethylsilane (($CH_3)_2(H)Si)(H)NN(CH_3)_2$), trisilylamine (($SiH_3)_3N$ or TSA), and hexakis(ethylamino)disilane ((($EtHN)_3Si)_2$), radicals thereof, plasmas thereof, derivatives thereof, or combinations thereof.

In some embodiments, the silicon precursors for forming silicon oxynitride materials during step 340 include aminodisilanes, silylazides, or silylhydrazines having the chemical formulas:

  $R_2NSi(R'_2)Si(R'_2)NR_2$ (aminodisilanes), (I)

  $R_3SiN_3$ (silylazides), or (II)

  $R'_3SiNRNR_2$ (silylhydrazines). (III)

In the above chemical formulas, R and R' may be one or more functional groups independently selected from the group of a halogen, an organic group having one or more double bonds, an organic group having one or more triple bonds, an aliphatic alkyl group, a cyclical alkyl group, an aromatic group, an organosilyl group, an alkylamino group, or a cyclic group containing N or Si, or combinations thereof. Examples of suitable functional groups on silicon precursors include chloro (—Cl), methyl (—$CH_3$), ethyl (—$CH_2CH_3$), isopropyl (—$CH(CH_3)_2$), tertbutyl (—$C(CH_3)_3$), trimethylsilyl (—$Si(CH_3)_3$), pyrrolidine, or combinations thereof.

Other examples of suitable silicon precursors for forming silicon oxynitride materials include silylazides $R_3$—$SiN_3$ and silylhydrazine class of precursors $R_3SiNRNR_2$, linear and cyclic with any combination of R groups. The R groups may be H or any organic functional group such as methyl, ethyl, propyl, butyl, and the like ($C_xH_y$). The R groups attached to Si can optionally be another amino group $NH_2$ or $NR_2$. One benefit of using a silicon-nitrogen precursor is that silicon and nitrogen are simultaneously delivered while avoiding the presence of chlorine to yield films with good step coverage and minimal pattern dependence (so-called pattern loading) without the undesirable ammonium chloride particle formation problematic to other precursors. Examples of specific silylazide compounds include trimethylsilylazide (($CH_3)_3SiN_3$) (available from United Chemical Technologies, located in Bristol, Pa.) and tris(dimethylamine)silylazide ((($CH_3)_2N)_3SiN_3$). An example of a specific silylhydrazine compound is 1,1-dimethyl-2-dimethylsilylhydrazine (($CH_3)_2HSiNHN(CH_3)_2$). In another embodiment, the silicon-nitrogen precursor may be at least one of ($R_3Si)_3N$, ($R_3Si)_2NN(SiR_3)_2$ and ($R_3Si)NN(SiR_3$), wherein each R is independently hydrogen or an alkyl, such as methyl, ethyl, propyl, butyl, phenyl, or combinations thereof. Examples of suitable silicon-nitrogen precursor include trisilylamine (($H_3Si)_3N$), ($H_3Si)_2NN(SiH_3)_2$, ($H_3Si)NN(SiH_3$), or derivatives thereof.

In another embodiment, an alkoxysilane compound is used as the silicon precursors for forming silicon oxynitride materials during step 340. The alkoxysilane may have the chemical formula $(RO)_nSiR'_{(4-n)}$, wherein n=1, 2, 3, or 4, each R, independently, may be methyl, ethyl, propyl, butyl, or other alkyl group, and each R', independently, may be hydrogen, a halogen group, methyl, ethyl, propyl, butyl, or other alkyl group. Examples of alkoxysilane compounds that may be used as silicon precursors include tetraethoxysilane (($EtO)_4Si$ or TEOS), tetramethoxysilane (($MeO)_4Si$), tetrapropoxysilane (($PrO)_4Si$), tetraisopropoxysilane (($^iPrO)_4Si$), tetrabutoxysilane (($BuO)_4Si$), triethoxysilane (($EtO)_3SiH$), diethoxysilane (($EtO)_2SiH_2$), diethoxydimethylsilane (($EtO)_2SiMe_2$), diethoxydiethylsilane (($EtO)_2SiEt_2$), dimethoxydiethoxsilane (($MeO)_2Si(OEt)_2$), derivatives thereof, or combinations thereof. In another embodiment, an alkoxysilane compound (e.g., TEOS) may be used as a source for both silicon and oxygen, instead of separate silicon and oxygen precursors, to form a silicon oxynitride material during step 340.

In one embodiment to form the silicon oxynitride material, in step 340, the silicon precursor, the oxygen precursor, and the nitrogen precursor may be combined in the process chamber or exposed to substrate 1122 by inlet port 1134 simultaneously, such as during a traditional CVD process or sequentially, such as during an ALD process. The ALD process may expose the substrate to the deposition gases, such that, the substrate is sequentially exposed to the silicon precursor, the oxygen precursor, and the nitrogen precursor to form the silicon oxynitride material. Although one gas line 1140 is shown disposed between gas panel 1136 and inlet port 1134, it is contemplated that the silicon precursor, the oxygen precursor, and the nitrogen precursor are provided to process chamber 1100 in separate gas lines. The temperature may be controlled for each gas line.

In one example, a silicon oxynitride material may be deposited on substrate 1122 within process chamber 1100 during a deposition process at step 340. In one embodiment, substrate 1122 may be exposed to a process gas containing a silicon precursor and an oxygen precursor during a CVD process to form a silicon oxide material that is subsequently exposed to a nitridization process to form a silicon oxynitride material. The silicon and oxygen precursors are generally provided from gas panel 1136 to interior volume 1104 of chamber body 1102 through flow control ring 1142. In one example during step 340, a silicon oxide material may be deposited on a substrate and exposed to a nitridation process that physically incorporates nitrogen atoms into the silicon oxide material to form a silicon oxynitride material. The nitridation process may include decoupled plasma nitridation (DPN), remote plasma nitridation, hot-wired induced atomic-N, and nitrogen incorporation during dielectric deposition (e.g., during CVD process). In a preferred example, radical nitrogen ions are formed by the UV photoexcitation as described herein. In another example, the nitridation process may be performed within a DPN chamber, such as the CENTURA® DPN chamber, available from Applied Materials, Inc., located in Santa Clara, Calif.

A description of CVD and ALD processes and apparatuses that may be modified (e.g., incorporating a UV radiation source) and chemical precursors that may be useful for depositing silicon oxynitride materials are further disclosed in commonly assigned U.S. Pat. Nos. 6,869,838 and 6,825,134, and commonly assigned U.S. Ser. No. 09/964,075, filed Sep. 25, 2001, and published as US 2003-0059535, U.S. Ser. No. 10/624,763, filed Jul. 21, 2003, and published as US 2004-0018738, U.S. Ser. No. 10/794,707, filed Mar. 4, 2004, and published as US 2004-0175961, and U.S. Ser. No. 10/688,797, filed Oct. 17, 2003, and published as US 2004-0224089, which are all herein incorporated by reference in their entirety.

A silicon oxynitride material may be formed by exposing the substrate to the silicon precursor, the oxygen precursor, and the nitrogen precursor are combined within a process chamber. In one embodiment, the silicon oxynitride material may be deposited at a rate within a range from about 10 Å/min to about 500 Å/min and is deposited to a thickness within a range from about 10 Å to about 1,000 Å. Silicon oxynitride materials may have a chemical formula such as $SiO_xN_y$, wherein X is within a range from about 0.01 to about 1.99 and Y is within a range from about 0.01 to about 1.32. In one example, the oxygen/nitrogen atomic ratio may be about 1 and the silicon oxynitride may have a chemical formula of about $SiO_{0.8}N_{0.8}$. In an example of an oxygen-rich silicon oxynitride, the oxygen/nitrogen atomic ratio is greater than 1 and the silicon oxynitride may have a chemical formula of about $SiO_{1.6}N_{0.5}$. In an example of a nitrogen-rich silicon oxynitride, the oxygen/nitrogen atomic ratio is less than 1 and the silicon oxynitride may have a chemical formula of about $SiO_{0.5}N_{1.0}$. In another embodiment, an alkoxysilane compound (e.g., TEOS) may be used as a source of both silicon and oxygen to form a silicon oxynitride material during step 340.

A carrier gas may be provided during step 340 to control the partial pressure of the nitrogen precursor, the oxygen precursor, and the silicon precursor. The total internal pressure of a single wafer process chamber may be at a pressure within a range from about 100 mTorr to about 740 Torr, preferably, from about 250 mTorr to about 100 Torr, and more preferably, from about 500 mTorr to about 50 Torr. In one example, the internal pressure of the process chamber is maintained at a pressure of about 10 Torr or less, preferably, about 5 Torr or less, and more preferably, about 1 Torr or less. In some embodiments, the carrier gas may be provided to control the partial pressure of the nitrogen precursor or the silicon precursor within a range from about 100 mTorr to about 1 Torr for batch processing systems. Examples of suitable carrier gases include nitrogen, hydrogen, argon, helium, forming gas, or combinations thereof.

The substrate, the silicon precursor, the oxygen precursor, and/or the nitrogen precursor may be exposed to an energy beam or a flux of energy generated by the photoexcitation system during the deposition process at step 340. The use of the energy beam advantageously increases the deposition rate and improves surface diffusion or mobility of atoms within the silicon oxynitride material to create active sites for incoming reactive species. In one embodiment, the energy beam has a photon energy within a range from about 3.0 eV to about 9.84 eV. Also, the energy beam may have a wavelength within a range from about 126 nm to about 450 nm.

In one example, lamp 1170 of direct photoexcitation system 1192 and/or lamp 1184 of remote photoexcitation system 1182 provides an energy beam to supply the excitation energy of at least one of the silicon precursor, the oxygen precursor, or the nitrogen precursor. The high deposition rate and the low deposition temperature produce a film having tunable properties with minimal parasitic side reactions. In one embodiment, the energy beam or flux may have a photon energy within a range from about 4.5 eV to about 9.84 eV. The substrate surface and the process gases may also be excited by lamps 1170 and 1184.

In another embodiment, the substrate containing the silicon oxynitride material (formed in step 340) is exposed to a post-deposition treatment process during step 350. The post-deposition treatment process increases the substrate surface energy after deposition, which advantageously removes volatiles and/or other film contaminants (such as by reducing the hydrogen content) and/or anneals the deposited film. A lower concentration of hydrogen from the deposited material advantageously increases tensile stress of the film. At least one lamp (e.g., lamps 1170 or 1184) may alternatively be utilized to energize an energy delivery gas which is exposed to the substrate to increase the surface energy of the substrate after deposition and to remove volatiles and/or other films.

In another embodiment of the photoexcitation step 340, lamp 1170 of direct photoexcitation system 1192 and/or lamp 1184 of remote photoexcitation system 1182 provides an energy beam to supply the excitation energy of at least one of the silicon precursor and/or the nitrogen precursors, which advantageously increases the deposition rate without increasing the overall deposition temperature. The high rate, low temperature deposition reaction produces a film having tunable properties with minimal parasitic side reactions. In this embodiment, the energy beam or flux has a photon energy within a range from about 4.5 eV to about 9.84 eV. The surface of the substrate may also be excited by the lamp in addition to the process gases being energized.

Gas phase excitation and surface reactions will be controlled by UV excimer selection. For example, optical excitation of $Si_2H_6$ may be achieved by using UV photons of hv>4.5 eV and hv>8 eV (λ<155 nm), respectively. Accordingly, intermediates of silanes—and $NH_3^*$ (405 nm), $NH_2^*$ (470.7 nm), NH* (336 nm) (with * indicating the compound in an excited state) enhances cross-linking bonds within the $SiO_xN_y$ network, desirable for increasing film tensile stress.

In another embodiment, the substrate containing the silicon oxynitride material (formed in step 340) is exposed to a post-deposition treatment process during step 350. The post-deposition treatment process increase the substrate surface energy after deposition, which advantageously removes volatiles and/or other film contaminants (such as by reducing the hydrogen content) and/or to anneal the deposited film. The removal of hydrogen from the silicon oxynitride material from within the film advantageously increases film tensile stress. At least one lamp (e.g., lamps 1170 or 1184) may alternatively be utilized to energize an energy delivery gas which is bought in contact with the substrate to increase the surface energy of the substrate after deposition and remove volatiles and/or other films.

Optionally, at step 350, an energy delivery gas may be provided to interior volume 1104 of process chamber 1100. Examples of suitable energy delivery gases include nitrogen, hydrogen, helium, argon, ozone, oxygen, hydrogen, water, hydroxyls, radicals thereof, plasma thereof, or combinations thereof. Examples provide that substrate 1122 is treated with an energy beam or flux of energy generated by photoexcitation system 1144 during step 350. In one example, lamp 1170 of direct photoexcitation system 1192 provides an energy beam to supply the surface energy of substrate 1122 during step 350. In another example for annealing the silicon oxynitride material, the energy beam or flux may have a photon energy within a range from about 3.53 eV to about 9.84 eV. Also, lamp 1170 may produce an energy beam having a wavelength within a range from about 126 nm to about 351 nm. Generally, lamp 1170 may be energized for a time period within a range from about 1 minute to about 10 minutes to facilitate post deposition treatment by photoexcitation.

In one example, volatile compounds or contaminants may be removed from the deposited film surface by exposing the substrate to an energy beam having a photon energy within a range from about 3.2 eV to about 4.5 eV is generated by lamp 1170 and/or lamp 1184 is utilized to dissociate silicon precursors, nitrogen precursors, and oxygen precursors within process chamber 1100. Thus, excimer lamps, such as XeBr* (283 nm/4.41 eV), Br$_2$* (289 nm/4.29 eV), XeCl* (308 nm/4.03 eV), I$_2$* (342 nm/3.63 eV), XeF* (351 nm/3.53 eV) may be selected to remove hydrogen from the SiO$_x$N$_y$ network. It is contemplated that the rotational speed of substrate 1122 may be changed, for example, by increasing the rotation speed in step 350 relative to the preceding deposition step.

In another embodiment, the substrate may be removed from the process chamber and the process chamber is subsequently exposed to a chamber clean process during step 360. The process chamber may be cleaned using a photoexcited cleaning agent. Alternatively, the cleaning agent may be provided from the remote plasma source 1190. In one embodiment, the cleaning agent includes fluorine.

Examples provide that the cleaning agent may be photoexcited within process chamber 1100 using lamp 1170, or remotely from process chamber 1100 using lamp 1184. In one example, lamp 1170 may be used to maintain the excitation level of cleaning agents formed by RPS 1190.

Process chamber 1100 may be cleaned during a chamber clean process to enhance deposition performance. For example, the chamber clean process may be used to remove contaminants contained on windows 1174 and 1186, thereby minimizing transmission losses of the energy beam or flux traveling through window 1174 or 1186 and maximizing the energy transferred to the gases and surfaces. It is also contemplated that windows 1174 and 1186 may be cleaned using a photoexcited agent formed from RPS 1190 during the chamber clean process. Windows 1174 and 1186 may be cleaned with greater frequency than process chamber 1100, for example, process chamber 1100 may be cleaned using RPS 1190 after processing a number of substrates while windows 1174 and 1186 are cleaned after processing each substrate.

The elemental composition of the silicon oxynitride material deposited during step 340 may be predetermined by controlling the concentration or flow rate of the chemical precursors, namely the silicon precursor, the oxygen precursor, and the nitrogen precursor. Film properties may be tailored for specific applications by controlling the relative concentrations of Si, O, N, C, and H within the silicon oxynitride material. In one embodiment, the elemental concentrations of silicon, nitrogen, and hydrogen may be tuned by varying the range of the UV energy during or subsequent the deposition process. The film properties include wet etch rate, dry etch rate, stress, dielectric constant, and the like. For example, by reducing the hydrogen content, the deposited material may have a higher tensile stress. In another example, by reducing the carbon content, the deposited material may have a lower electrical resistance.

Additionally, when using N—Si—R or N—Si—Si—R type of precursors, the dissociation of the silicon-nitrogen precursor takes place at lower temperatures, thereby enabling lower temperature processing. The nitrogen precursors used herein may contain a carbon and hydrogen function group, which react with R or Si—R from N—Si—R or N—Si—Si—R in the silicon precursor, allow the R group to become dissociated and more easily removed than without reacting with nitrogen precursor. The nitrogen precursor provides nitrogen and carbon sources to the silicon oxynitride material. Thus, embodiments of the methods may advantageously facilitate low temperature processing, e.g., at temperatures of less than about 550° C.

Silicon oxynitride materials deposited utilizing process 300 may be used throughout electronic features/devices due to several physical properties. The silicon oxynitride materials may be deposited as layers on a substrate to form electronic features, such as a MOSFET transistor (FIGS. 5A-5B), a bi-polar transistor (FIG. 6), or other silicon-containing layers. In another embodiment, silicon oxynitride materials deposited by process 300 may be used throughout photovoltaic cell applications, such as to form a solar cell.

Silicon Materials—Si, SiGe, SiC, and SiGeC

Figure 4:
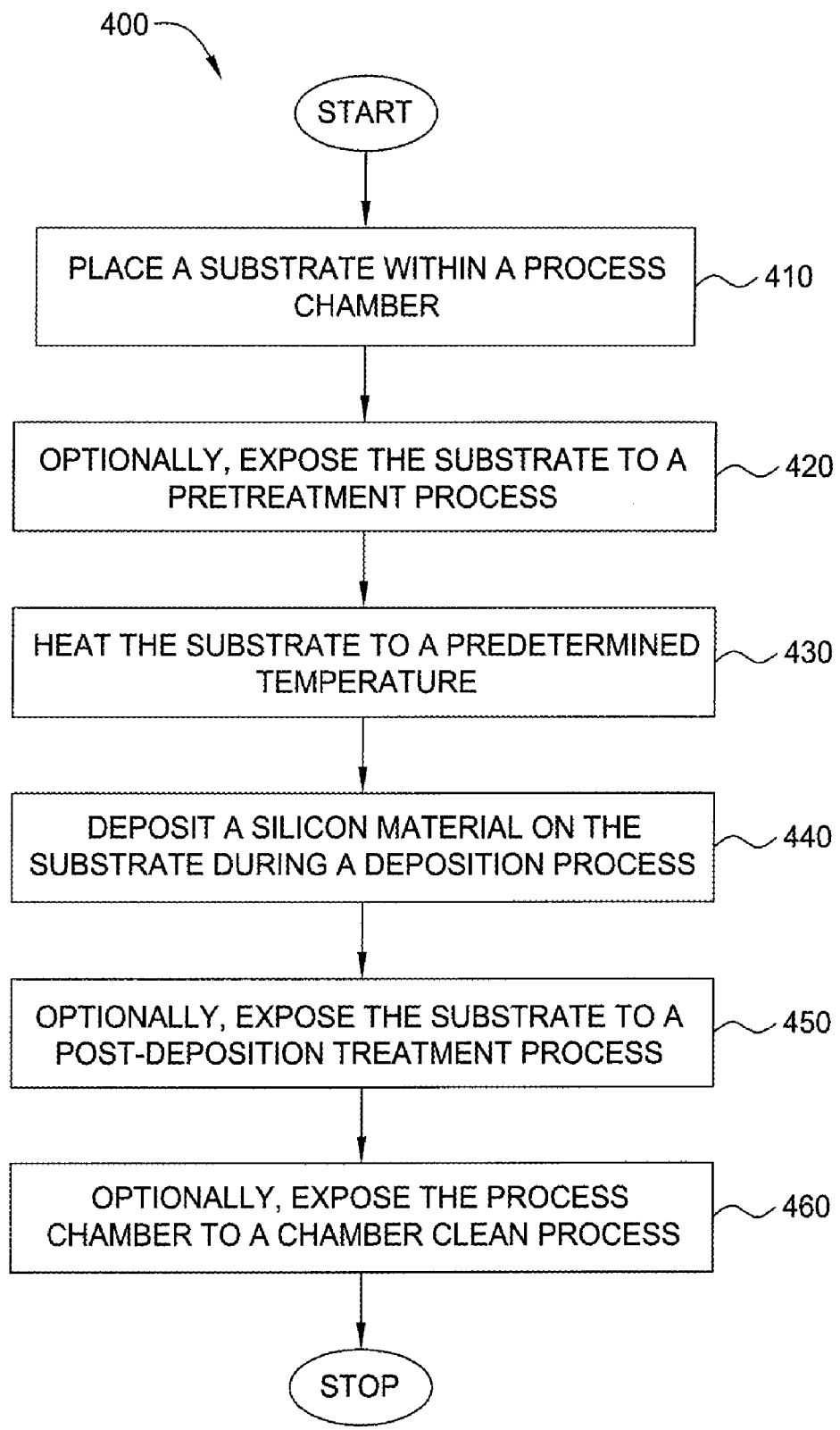
FIG. 4 is a flow diagram of a process for depositing a silicon material as described by embodiments herein.

FIG. 4 depicts a flow diagram of process 400 for depositing a silicon material (e.g., epitaxy, crystalline, microcrystalline, polysilicon, or amorphous), as described by embodiments herein. The substrate may be positioned within a process chamber (step 410), optionally exposed to a pretreatment process (step 420), and heated to a predetermined temperature (step 430). Subsequently, a silicon material may be deposited on the substrate (step 440). The substrate may be optionally exposed to post-deposition treatment process (step 450) and the process chamber may be optionally exposed to a chamber clean process (step 460).

The substrate may be positioned within a process chamber during step 410. The process chamber may be a single wafer chamber or a batch chamber containing multiple wafers or substrates (e.g., 25, 50, 100, or more). The substrate may be maintained in a fixed position, but preferably, is rotated by a support pedestal. Optionally, the substrate may be indexed during one or more steps of process 400.

Process chamber 1100, depicted in FIG. 7, may be used during process 400 to deposit silicon materials on substrate 1122 as described by examples herein. In one example, substrate 1122 may be rotated on substrate support pedestal 1124 within process chamber 1100 at a rate of up to about 120 rpm. Alternatively, substrate 1122 may be positioned on substrate support pedestal 1124 and not rotated during the deposition process.

In one embodiment, the substrate is optionally exposed to at least one pretreatment process during step 420. The substrate surface may contain native oxides that are removed during a pretreatment process. The substrate may be pretreated with an energy beam generated by direct photoexcitation system to remove the native oxides from the substrate surface prior to depositing a silicon material during step 440. A process gas may be exposed to the substrate during the pretreatment process. The process gas may contain argon, nitrogen, helium, hydrogen, forming gas, or combinations thereof. The pretreatment process may last for a time period within a range from about 2 minutes to about 10 minutes to facilitate native oxide removal during a photoexcitation process. Also, the substrate may be heated during step 420 to a temperature within a range from about 100° C. to about 800° C., preferably, from about 200° C. to about 600° C., and more preferably, from about 300° C. to about 500° C., to facilitate native oxide removal during process 400.

Examples provide that substrate 1122 may be exposed to an energy beam produced by lamp 1170 during step 420. Lamp 1170 may provide an energy beam having a photon energy within a range from about 2 eV to about 10 eV, for example, from about 3.2 eV to about 4.5 eV for about 3 minutes. In another example, lamp 1170 provides an energy beam of UV radiation having a wavelength within a range from about 126 nm to about 351 nm. Lamp 1170 may be energized for a period sufficient to remove oxides. The energization period is selected based upon the size and geometry of window 1174 (which corresponds to the exposed area of substrate 1122) and the substrate rotation speed. In one embodiment, lamp 1170 is energized for a time period within a range from about 2 minutes to about 10 minutes to facilitate native oxide removal during a photoexcitation process. In one example, substrate 1122 may be heated to a temperature within a range from about 100° C. to about 800° C. during step 420. In another example, substrate 1122 may be heated to a temperature within a range from about 300° C. to about 500° C. during step 420, while lamp 1170 provides an energy beam having a photon energy within a range from about 2 eV to about 10 eV for a time period within a range from about 2 minutes to about 5 minutes to facilitate native oxide removal. In one example, the energy beam has a photon energy within a range from about 3.2 eV to about 4.5 eV for about 3 minutes.

In another embodiment, native oxide removal may be augmented by a photoexcitation process in the presence of a process gas containing an energy delivery gas during a pretreatment process at step 420. The energy delivery gas may be neon, argon, krypton, xenon, argon bromide, argon chloride, krypton bromide, krypton chloride, krypton fluoride, xenon fluorides (e.g., $XeF_2$), xenon chlorides, xenon bromides, fluorine, chlorine, bromine, excimers thereof, radicals thereof, derivatives thereof, or combinations thereof. In some embodiments, the process gas may also contain nitrogen gas ($N_2$), hydrogen gas ($H_2$), forming gas (e.g., $N_2/H_2$ or $Ar/H_2$) besides at least one energy delivery gas.

In one example, substrate 1122 may be exposed to a process gas containing an energy delivery gas by providing the process gas to interior volume 1104 of process chamber 1100 during step 420. The energy delivery gas may be provided through flow control ring 1142 from gas panel 1136. The proximately of the process gas to lamp 1170 compared to substrate 1122 readily excites the energy delivery gas therein. As the energy delivery gas de-excites and moves closer to substrate 1122, the energy is efficiently transferred to the surface of substrate 1122, thereby facilitating the removal of native oxides.

In another embodiment, native oxide removal may be augmented by a photoexcitation process in the presence of a process gas containing an organic vapor during the pretreatment process at step 420. In one example, the substrate may be exposed to the process gas containing a cyclic aromatic hydrocarbon. The cyclic aromatic hydrocarbon may be in the presence of UV radiation. Monocyclic aromatic hydrocarbons and polycyclic aromatic hydrocarbons that are useful during a pretreatment process include quinone, hydroxyquinone (hydroquinone), anthracene, naphthalene, phenanthracene, derivatives thereof, or combinations thereof. In another example, the substrate may be exposed to the process gas containing other hydrocarbons, such as unsaturated hydrocarbons, including ethylene, acetylene (ethyne), propylene, alkyl derivatives, halogenated derivates, or combinations thereof. In another example, the organic vapor may contain alkane compounds during the pretreatment process at step 420.

In one example, the UV radiation having a wavelength within a range from about 126 nm to about 351 nm may be generated by a lamp during step 420. In another embodiment, polycyclic aromatic hydrocarbons may remove native oxides in the presence of UV radiation by reacting with oxygen atoms within the native oxides. In another embodiment, native oxides may be removed by exposing the substrate to quinone or hydroxyquinone while forming derivative products. The derivative product may be removed from the process chamber by a vacuum pumping process.

At step 430, the substrate may be heated to a predetermined temperature during or subsequent to the pretreatment process. The substrate is heated prior to depositing the silicon material at step 440. The substrate may be heated by an embedded heating element within the substrate support, the energy beam (e.g., UV-source), or combinations thereof. Generally, the substrate is heated long enough to obtain the predetermined temperature, such as for a time period within a range from about 15 seconds to about 30 minutes, preferably, from about 30 seconds to about 20 minutes, and more preferably, from about 1 minute to about 10 minutes.

In one embodiment, the substrate may be heated to a temperature within a range from about 200° C. to about 1,000° C., preferably, from about 400° C. to about 850° C., and more preferably, from about 550° C. to about 800° C. In another embodiment, the substrate may be heated to a temperature of less than about 550° C., preferably, less than about 450° C. In one example, substrate 1122 may be heated to the predetermined temperature within process chamber 1100. The predetermined temperature may be within a range from about 300° C. to about 500° C. Substrate 1122 may be heated by applying power from power source 1116 to the resistive heating element (i.e., the heater 1120).

In one embodiment, a silicon material is deposited on the substrate during a deposition process at step 440. The silicon material may be formed by exposing the substrate to at least one deposition gas during the deposition process. The silicon material may be deposited on the substrate surface, selectively or non-selectively (e.g., blanket), as an epitaxy layer, a crystalline layer, a microcrystalline layer, a polysilicon layer, an amorphous layer, dopant variants thereof, or combinations thereof.

In one example, the substrate is exposed to a deposition process gas containing a silicon precursor during a CVD process while using a UV energy source to non-selectively deposit an amorphous silicon material on the substrate surface. In another example, the substrate is exposed to a deposition process gas containing a silicon precursor and an etchant during a CVD process while using a UV energy source to selectively deposit an epitaxial silicon material on the substrate surface. In another example, the substrate is exposed to a deposition process gas containing a silicon precursor and a reducing agent during a CVD process while using a UV energy source to non-selectively deposit an amorphous silicon material on the substrate surface. In other examples, the substrate is exposed to a deposition process gas containing a silicon precursor and a UV energy source during a CVD process to deposit a crystalline silicon material, a microcrystalline silicon material, or a polycrystalline silicon material on the substrate surface.

Alternatively, the deposition process may be an ALD process having at least two deposition gases, such that, the substrate is sequentially exposed to a silicon precursor another reagent, such as a purge gas, an etchant, a reducing agent, a dopant reagent, or combinations thereof. The deposition process may be a thermal process, a radical process, or a combination thereof. For example, the substrate may be exposed to a process gas in the presence of an energy beam generated by a direct photoexcitation system.

In one example, a process utilizes UV-assisted to epitaxially grow or deposit a layer of silicon material on a substrate surface. The deposition gas used during the process contains a silicon precursor and may also contain at least one secondary elemental source, such as a germanium source and/or a carbon source. The germanium source may be added to the process chamber with the silicon precursor, etchant, reagent, or carrier gas to form the silicon material. Therefore, the silicon material may contain silicon, SiGe, SiC, SiGeC, doped variants thereof, or combinations thereof. Germanium and/or carbon may be added to the silicon material by including germanium source (e.g., germane) or a carbon source (e.g., methylsilane) during the deposition process. The silicon material may also contain dopants by including a boron source (e.g., diborane), an arsenic source (e.g., arsine), or a phosphorous source (e.g., phosphine) during or after the deposition process. The dopant may be included within the silicon precursor, etchant, reductant, or carrier gas to form a silicon material. Alternatively, the dopant may be added to the silicon material by exposing the substrate to an ion implantation process during or subsequent to the deposition process.

Examples of suitable reducing agents for forming silicon materials at step 440 include atomic hydrogen (H), hydrogen ($H_2$), ammonia ($NH_3$), hydrazine ($N_2H_4$), silane ($SiH_4$), disilane ($Si_2H_6$), alkylsilanes, diborane ($B_2H_6$), alkylboranes, radicals thereof, plasmas thereof, derivatives thereof, or combinations thereof. Examples of suitable etchants for forming silicon materials at step 440 include chlorine gas ($Cl_2$), hydrogen chloride (HCl), tetrachlorosilane ($SiCl_4$), fluorine ($F_2$), hydrogen fluoride (HF), chlorine trifluoride ($ClF_3$), nitrogen trifluoride ($NF_3$), radicals thereof, plasmas thereof, derivatives thereof, or combinations thereof.

Examples of suitable silicon precursors for forming silicon materials at step 440 include silanes, halogenated silanes, alkylsilanes, aminosilanes, aminodisilanes, silylazides, silylhydrazines, or derivatives thereof. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where X'=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Alkylsilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Alkylsilanes have been found to be advantageous silicon sources as well as carbon sources in embodiments which incorporate carbon in the deposited silicon materials. Other specific examples of silicon precursors include bis(tertbutylamino) silane (BTBAS or ($^tBu(H)N$)$_2SiH_2$), 1,2-diethyl-tetrakis(diethylamino)disilane (($CH_2CH_3((CH_3CH_2)_2N)_2Si)_2$), 1,2-dichloro-tetrakis(diethylamino)disilane (($Cl((CH_3CH_2)_2N)_2Si)_2$), hexakis(N-pyrrolidinio)disilane ((($C_4H_9N)_3$)$Si)_2$), 1,1,2,2-tetrachloro-bis(di(trimethylsilyl)amino)disilane, (($Cl_2((CH_3)_3Si)_2N)Si)_2$), 1,1,2,2-tetrachloro-bis(diisopropylamino)disilane, (($Cl_2((C_3H_7)_2N)Si)_2$), 1,2-dimethyltetrakis (diethylamino)disilane (($CH_3(CH_3CH_2N)_2Si)_2$), tris(dimethylamino)silane azide ((($CH_3)_2N)_3SiN_3$), tris (methylamino)silane azide ((($CH_3)(H)N)_3SiN_3$), 2,2-dimethylhydrazine-dimethylsilane (($CH_3)_2(H)Si)(H)NN(CH_3)_2$), trisilylamine (($SiH_3)_3N$ or TSA), and hexakis (ethylamino)disilane ((($EtHN)_3Si)_2$), radicals thereof, plasmas thereof, derivatives thereof, or combinations thereof.

In some embodiments, the silicon precursors for forming silicon materials at step 440 include aminodisilanes, silylazides, or silylhydrazines having the chemical formulas:

$$R_2NSi(R'_2)Si(R'_2)NR_2 \text{ (aminodisilanes)}, \qquad (I)$$

$$R_3SiN_3 \text{ (silylazides), or} \qquad (II)$$

$$R'_3SiNRNR_2 \text{ (silylhydrazines).} \qquad (III)$$

In the above chemical formulas, R and R' may be one or more functional groups independently selected from the group of a halogen, an organic group having one or more double bonds, an organic group having one or more triple bonds, an aliphatic alkyl group, a cyclical alkyl group, an aromatic group, an organosilyl group, an alkylamino group, or a cyclic group containing N or Si, or combinations thereof. Examples of suitable functional groups on silicon precursors include chloro (—Cl), methyl (—$CH_3$), ethyl (—$CH_2CH_3$), isopropyl (—$CH(CH_3)_2$), tertbutyl (—$C(CH_3)_3$), trimethylsilyl (—$Si(CH_3)_3$), pyrrolidine, or combinations thereof. It is believed that many of the silicon precursors described herein may decompose or disassociate at a low temperature, such as about 550° C. or less.

Other examples of suitable silicon precursors include silylazides $R_3$—$SiN_3$ and silylhydrazine class of precursors $R_3SiNRNR_2$, linear and cyclic with any combination of R groups. The R groups may be H or any organic functional group such as methyl, ethyl, propyl, butyl, and the like ($C_xH_y$). The R groups attached to Si can optionally be another amino group $NH_2$ or $NR_2$. Examples of specific silylazide compounds include trimethylsilylazide (($CH_3)_3SiN_3$) (available from United Chemical Technologies, located in Bristol, Pa.) and tris(dimethylamine)silylazide ((($CH_3)_2N)_3SiN_3$). An example of a specific silylhydrazine compound is 1,1-dimethyl-2-dimethylsilylhydrazine (($CH_3)_2HSiNHN(CH_3)_2$). In another embodiment, the silicon precursor may be at least one of ($R_3Si)_3N$, ($R_3Si)_2NN(SiR_3)_2$ and ($R_3Si)NN(SiR_3$), wherein each R is independently hydrogen or an alkyl, such as methyl, ethyl, propyl, butyl, phenyl, or combinations thereof. Examples of suitable silicon precursors include trisilylamine (($H_3Si)_3N$), ($H_3Si)_2NN(SiH_3)_2$, ($H_3Si)NN(SiH_3$), or derivatives thereof.

In one example, a silicon material may be deposited on substrate 1122 within process chamber 1100 during a deposition process at step 440. In one embodiment, substrate 1122 may be exposed to a process gas containing a silicon precursor and an oxygen precursor during a CVD process. The silicon and oxygen precursors are generally provided from gas panel 1136 to interior volume 1104 of chamber body 1102 through flow control ring 1142.

In one embodiment, in step 440, the silicon precursor and at least another reagent may be introduced into process chamber or exposed to substrate 1122 by inlet port 1134 simultaneously, such as during a traditional CVD process or sequentially, such as during an ALD process. The ALD process may expose the substrate to at least two deposition gases, such that, the substrate is sequentially exposed to the silicon precursor and the other reagent (e.g., a purge gas, an etchant, a reducing agent, a dopant reagent, or combinations thereof). Although one gas line 1140 is shown disposed between gas panel 1136 and inlet port 1134, it is contemplated that the silicon precursor and the other reagents are provided to process chamber 1100 in separate gas lines. The temperature may be controlled for each gas line.

A description of CVD and ALD processes and apparatuses that may be modified (e.g., incorporating a UV radiation source) and chemical precursors that may be useful for depositing silicon materials (e.g., epitaxy, amorphous, or polycrystalline) may be disclosed in commonly assigned U.S. Pat. Nos. 6,803,297, 6,839,507, 6,897,131, and commonly assigned U.S. Ser. No. 10/683,937, filed Oct. 10, 2003, and published as US 2005-0079691, U.S. Ser. No. 10/845,984, filed May 14, 2004, and published as US 2005-0076692, U.S. Ser. No. 10/784,904, filed Feb. 23, 2004, and published as US 2005-0186765, U.S. Ser. No. 11/001,774, filed Dec. 1, 2004, U.S. Ser. No. 11/047,323, filed Jan. 31, 2005, U.S. Ser. No. 11/242,613, filed Oct. 3, 2005, U.S. Ser. No. 10/117,692, filed Apr. 5, 2002, and published as US 2003-0189208 and U.S. Ser. No. 10/688,797, filed Oct. 17, 2003, and published as US 2004-0224089, which are all herein incorporated by reference in their entirety.

The processes for depositing silicon materials may be conducted on fabrication equipment used for ALE, CVD, or ALD processes. A system that may be used to etch or deposit the silicon materials as described herein include the EPI CENTURA® system or the POLY GEN® system, both available from Applied Materials, Inc., located in Santa Clara, Calif. A process chamber useful to etch and deposit as described herein is further disclosed in commonly assigned U.S. Pat. No. 6,562,720, which is incorporated herein by reference in its entirety for the purpose of describing the apparatus. Other enabling apparatuses include batch furnaces and high-temperature furnaces.

As the silicon precursor and the reagent gases, if any, are combined in process chamber, a silicon-containing material, such as a silicon material, is formed on the substrate surface. In one embodiment, the silicon material may be deposited at a rate within a range from about 10 Å/min to about 500 Å/min and is deposited to a thickness within a range from about 10 Å to about 1,000 Å.

Throughout the application, the term "silicon material," should be construed to include a composition within a layer or a film containing at least silicon and may contain germanium, carbon, boron, arsenic, phosphorous gallium, and/or aluminum. Other elements, such as metals, oxygen, nitrogen, halogens, or hydrogen may be incorporated within a silicon material usually with concentrations of about part per million (ppm). Compounds, alloys, or dopant derivatives of silicon materials may be represented by an abbreviation, such as Si for silicon, SiGe for silicon germanium, SiC for silicon carbon, and SiGeC for silicon germanium carbon. The abbreviations do not represent chemical equations with stoichiometrical relationships, nor represent any particular reduction/oxidation state of the silicon materials. Silicon materials or layers may be deposited or formed, selectively or non-selectively, as an epitaxy material or layer, a crystalline material or layer, a microcrystalline material or layer, a polysilicon material or layer, or an amorphous material or layer.

In one embodiment, the deposition gas used during step 440 may contain a silicon precursor and at least one secondary elemental source, such as a germanium source and/or a carbon source. The germanium source may be added to the process chamber with the silicon source and carrier gas to form a silicon material, such as a silicon germanium material. The germanium source is usually provided into the process chamber at a rate in the range from about 0.1 sccm to about 20 sccm, preferably from about 0.5 sccm to about 10 sccm, and more preferably from about 1 sccm to about 5 sccm, for example, about 2 sccm. Germanium sources useful to deposit silicon materials include germane ($GeH_4$), higher germanes and organogermanes. Higher germanes include compounds with the empirical formula $Ge_xH_{(2x+2)}$, such as digermane ($Ge_2H_6$), trigermane ($Ge_3H_8$) and tetragermane ($Ge_4H_{10}$), as well as others. Organogermanes include compounds such as methylgermane (($CH_3$)$GeH_3$), dimethylgermane (($CH_3$)$_2$$GeH_2$)ethylgermane (($CH_3CH_2$)$GeH_3$), methyldigermane (($CH_3$)$Ge_2H_5$), dimethyldigermane (($CH_3$)$_2$$Ge_2H_4$) and hexamethyldigermane (($CH_3$)$_6$$Ge_2$). Germanes and organogermane compounds have been found to be advantageous germanium sources and carbon sources in embodiments while incorporating germanium and carbon into the deposited silicon materials, namely SiGe and SiGeC compounds. The germanium concentration in the epitaxial layer is in the range from about 1 at % to about 30 at %, for example, about 20 at %. The germanium concentration may be graded within an epitaxial layer, preferably graded with a higher germanium concentration in the lower portion of the epitaxial layer than in the upper portion of the epitaxial layer.

Alternatively, a carbon source may be added during step 440 to the process chamber with the silicon source and carrier gas to form a silicon material, such as a silicon carbon material. A carbon source is usually provided into the process chamber at a rate in the range from about 0.1 sccm to about 20 sccm, preferably from about 0.5 sccm to about 10 sccm, and more preferably from about 1 sccm to about 5 sccm, for example, about 2 sccm. Carbon sources useful to deposit silicon materials include organosilanes, alkyls, alkenes and alkynes of ethyl, propyl and butyl. Such carbon sources include methylsilane ($CH_3SiH_3$), dimethylsilane (($CH_3$)$_2$$SiH_2$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon concentration of an epitaxial layer is in the range from about 200 ppm to about 5 at %, preferably from about 1 at % to about 3 at %, for example 1.5 at %. In one embodiment, the carbon concentration may be graded within an epitaxial layer, preferably graded with a higher carbon concentration in the lower portion of the epitaxial layer than in the upper portion of the epitaxial layer. Alternatively, a germanium source and a carbon source may both be added during step 440 into the process chamber with the silicon source and carrier gas to form a silicon material, such as a silicon germanium carbon material.

The deposition gas used during step 440 may further include at least one dopant compound to provide a source of elemental dopant, such as boron, arsenic, phosphorous, gallium or aluminum. Dopants provide the deposited silicon materials with various conductive characteristics, such as directional electron flow in a controlled and desired pathway required by the electronic device. Films of the silicon materials are doped with particular dopants to achieve the desired conductive characteristic. In one example, the silicon material is doped p-type, such as by using diborane to add boron at a concentration in the range from about $10^{15}$ atoms/cm$^3$ to about $10^{21}$ atoms/cm$^3$. In one example, the p-type dopant has a concentration of at least $5 \times 10^{19}$ atoms/cm$^3$. In another example, the p-type dopant is in the range from about $1 \times 10^{20}$ atoms/cm$^3$ to about $2.5 \times 10^{21}$ atoms/cm$^3$. In another example, the silicon material is doped n-type, such as with phosphorous and/or arsenic to a concentration in the range from about $10^{15}$ atoms/cm$^3$ to about $10^{21}$ atoms/cm$^3$.

A dopant source is usually provided into the process chamber during step 440 at a rate in the range from about 0.1 sccm to about 20 sccm, preferably from about 0.5 sccm to about 10 sccm, and more preferably from about 1 sccm to about 5 sccm, for example, about 2 sccm. Boron-containing dopants useful as a dopant source include boranes and organoboranes.

Boranes include borane, diborane ($B_2H_6$), triborane, tetraborane and pentaborane, while alkylboranes include compounds with the empirical formula $R_xBH_{(3-x)}$, where R=methyl, ethyl, propyl or butyl and x=1, 2 or 3. Alkylboranes include trimethylborane (($CH_3$)$_3$B), dimethylborane (($CH_3$)$_2$BH), triethylborane (($CH_3CH_2$)$_3$B) and diethylborane (($CH_3CH_2$)$_2$BH). Dopants may also include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). Aluminum and gallium dopant sources may include alkylated and/or halogenated derivates, such as described with the empirical formula $R_xMX_{(3-x)}$, where M=Al or Ga, R=methyl, ethyl, propyl or butyl, X=Cl or F and x=0, 1, 2 or 3. Examples of aluminum and gallium dopant sources include trimethylaluminum ($Me_3Al$), triethylaluminum ($Et_3Al$), dimethylaluminumchloride ($Me_2AlCl$), aluminum chloride ($AlCl_3$), trimethylgallium ($Me_3Ga$), triethylgallium ($Et_3Ga$), dimethylgalliumchloride ($Me_2GaCl$), gallium chloride ($GaCl_3$), or derivatives thereof.

In one embodiment, a patterned substrate is loaded in to a process chamber and exposed to a deposition gas during a selective epitaxial process. Patterned substrates are substrates that include electronic features formed into or onto the substrate surface. The patterned substrate usually contains monocrystalline surfaces and at least one secondary surface that is non-monocrystalline, such as polycrystalline or amorphous surfaces. Monocrystalline surfaces include the bare crystalline substrate or a deposited single crystal layer usually made from a material such as silicon, silicon germanium or silicon carbon. Crystalline, microcrystalline, polycrystalline, or amorphous surfaces may include dielectric materials, such as oxides or nitrides, specifically silicon oxide or silicon nitride, as well as amorphous silicon surfaces.

A carrier gas may be provided during step 440 to control the partial pressure of the reagent gas and the silicon precursor. The total internal pressure of a single wafer process chamber may be at a pressure within a range from about 100 mTorr to about 740 Torr, preferably, from about 250 mTorr to about 100 Torr, and more preferably, from about 500 mTorr to about 50 Torr. In one example, the internal pressure of the process chamber is maintained at a pressure of about 10 Torr or less, preferably, about 5 Torr or less, and more preferably, about 1 Torr or less. In some embodiments, the carrier gas may be provided to control the partial pressure of the nitrogen precursor or the silicon precursor within a range from about 100 mTorr to about 1 Torr for batch processing systems. Examples of suitable carrier gases include nitrogen, hydrogen, argon, helium, forming gas, or combinations thereof.

The substrate, the silicon precursor, and/or reagent gas may be exposed to an energy beam or a flux of energy generated by the photoexcitation system during the deposition process at step 440. The use of the energy beam advantageously increases the deposition rate and improves surface diffusion or mobility of atoms within the silicon-containing material to create active sites for incoming reactive species. In one embodiment, the energy beam has photon energy within a range from about 3.0 eV to about 9.84 eV. Also, the energy beam may have a wavelength within a range from about 126 nm to about 450 nm.

A carrier gas may be provided at step 440 to control the partial pressure of the reagent gas and/or the silicon precursor from a few mTorr to a few hundred Torr, and to control the total process pressure within a range from about 100 mTorr to about 740 Torr in single wafer chambers. In another embodiment, the internal pressure of the process chamber is maintained within a range from about 10 Torr to about 740 Torr. The carrier gas may be provided to control the partial pressure of the reagent gas or the silicon precursor within a range from about 100 mTorr to about 1 Torr for batch processing systems. Examples of suitable carrier gases include nitrogen, hydrogen, argon, helium, forming gas, or combinations thereof.

In one example, lamp 1170 of direct photoexcitation system 1192 and/or lamp 1184 of remote photoexcitation system 1182 provides an energy beam to supply the excitation energy of at least one of the silicon precursor or the reagent gas during step 440. The high deposition rate and the low deposition temperature produce a film having tunable properties with minimal parasitic side reactions. In one embodiment, the energy beam or flux may have a photon energy within a range from about 4.5 eV to about 9.84 eV. The substrate surface and the process gases may also be excited by lamps 1170 and 1184.

In another embodiment, the substrate containing the silicon material (formed in step 440) is exposed to a post-deposition treatment process during step 450. The post-deposition treatment process increases the substrate surface energy after deposition, which advantageously removes volatiles and/or other film contaminants (such as by reducing the hydrogen content) and/or anneals the deposited film. A lower concentration of hydrogen from the deposited material advantageously increases tensile stress of the film. At least one lamp (e.g., lamps 1170 or 1184) may alternatively be utilized to energize an energy delivery gas which is exposed to the substrate to increase the surface energy of the substrate after deposition and to remove volatiles and/or other films.

Optionally, at step 450, an energy delivery gas may be provided to interior volume 1104 of process chamber 1100. Examples of suitable energy delivery gases include nitrogen, hydrogen, helium, argon, and combinations thereof. Examples provide that substrate 1122 is treated with an energy beam or flux of energy generated by photoexcitation system 1144 during step 450. In one example, lamp 1170 of direct photoexcitation system 1192 provides an energy beam to supply the surface energy of substrate 1122 during step 350. In another example for annealing the silicon material, the energy beam or flux may have a photon energy within a range from about 3.53 eV to about 9.84 eV. Also, lamp 1170 may produce an energy beam having a wavelength within a range from about 126 nm to about 351 nm. Generally, lamp 1170 may be energized for a time period within a range from about 1 minute to about 10 minutes to facilitate post deposition treatment by photoexcitation.

In one example, volatile compounds or contaminants may be removed from the deposited film surface by exposing the substrate to an energy beam having a photon energy within a range from about 3.2 eV to about 4.5 eV is generated by lamp 1170 and/or lamp 1184 is utilized to dissociate silicon precursors and the reagents within process chamber 1100. Thus, excimer lamps, such as XeBr* (283 nm/4.41 eV), $Br_2$* (289 nm/4.29 eV), XeCl* (308 nm/4.03 eV), $I_2$* (342 nm/3.63 eV), XeF* (351 nm/3.53 eV) may be selected to remove hydrogen from the $SiO_xN_y$ network. It is contemplated that the rotational speed of substrate 1122 may be changed, for example, by increasing the rotation speed in step 450 relative to the preceding deposition step.

In another embodiment, the substrate may be removed from the process chamber and the process chamber is subsequently exposed to a chamber clean process during step 460. The process chamber may be cleaned using a photoexcited cleaning agent. Alternatively, the cleaning agent may be provided from the remote plasma source 1190. In one embodiment, the cleaning agent includes fluorine. Examples provide that the cleaning agent may be photoexcited within process chamber 1100 using lamp 1170, or remotely from process chamber 1100 using lamp 1184. In one example, lamp 1170 may be used to maintain the excitation level of cleaning agents formed by RPS 1190.

Process chamber 1100 may be cleaned during a chamber clean process to enhance deposition performance. For example, the chamber clean process may be used to remove contaminants contained on windows 1174 and 1186, thereby minimizing transmission losses of the energy beam or flux traveling through window 1174 or 1186 and maximizing the energy transferred to the gases and surfaces. It is also contemplated that windows 1174 and 1186 may be cleaned using a photoexcited agent formed from RPS 1190 during the chamber clean process. Windows 1174 and 1186 may be cleaned with greater frequency than process chamber 1100, for example, process chamber 1100 may be cleaned using RPS 1190 after processing a number of substrates while windows 1174 and 1186 are cleaned after processing each substrate.

The elemental composition of the silicon materials deposited during step 440 may be predetermined by controlling the concentration or flow rate of the chemical precursors, namely the silicon precursor and the reagent gas. Film properties may be tailored for specific applications by controlling the relative concentrations of Si, O, N, H, C, Ge, B, P, and As within the silicon material. In one embodiment, the elemental concentrations of silicon, nitrogen, and hydrogen may be tuned by varying the range of the UV energy during or subsequent the deposition process. The film properties include wet etch rate, dry etch rate, stress, dielectric constant, and the like. For example, by reducing the hydrogen content, the deposited material may have a higher tensile stress. In another example, by reducing the carbon content, the deposited material may have a lower electrical resistance.

Silicon materials deposited by process 400 may be used throughout electronic features/devices due to several physical properties. The silicon materials may be deposited as layers on a substrate to form electronic features, such as a MOSFET transistor (FIGS. 5A-5B), a bi-polar transistor (FIG. 6), or other silicon-containing layers. In another embodiment, silicon materials deposited by process 400 may be used throughout photovoltaic cell applications, such as to form a solar cell.

Embodiments, as described herein, provide processes that may be utilized to deposit silicon-containing materials during fabrication processes for Metal Oxide Semiconductor Field Effect Transistor (MOSFET) and bipolar transistors, such as Bipolar device fabrication (e.g., base, emitter, collector, emitter contact), BiCMOS device fabrication (e.g., base, emitter, collector, emitter contact) and CMOS device fabrication (e.g., channel, source/drain, source/drain extension, elevated source/drain, substrate, strained silicon, silicon on insulator and contact plug). Other embodiments provide processes that may be utilized during gate fabrication processes, base contact fabrication processes, collector contact fabrication processes, emitter contact fabrication processes or elevated source/drain fabrication processes.

Figure 5A:
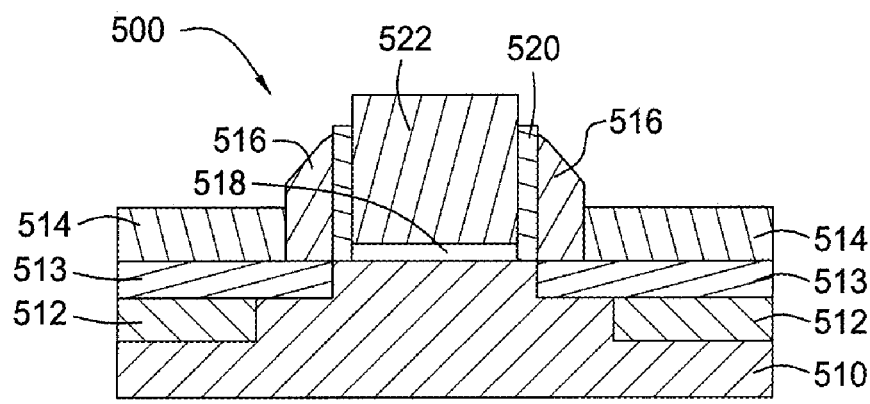
FIGS. 5A-5B are cross sectional views of a MOSFET transistor having silicon-containing materials deposited according to processes described by embodiments herein.
Figure 5B:
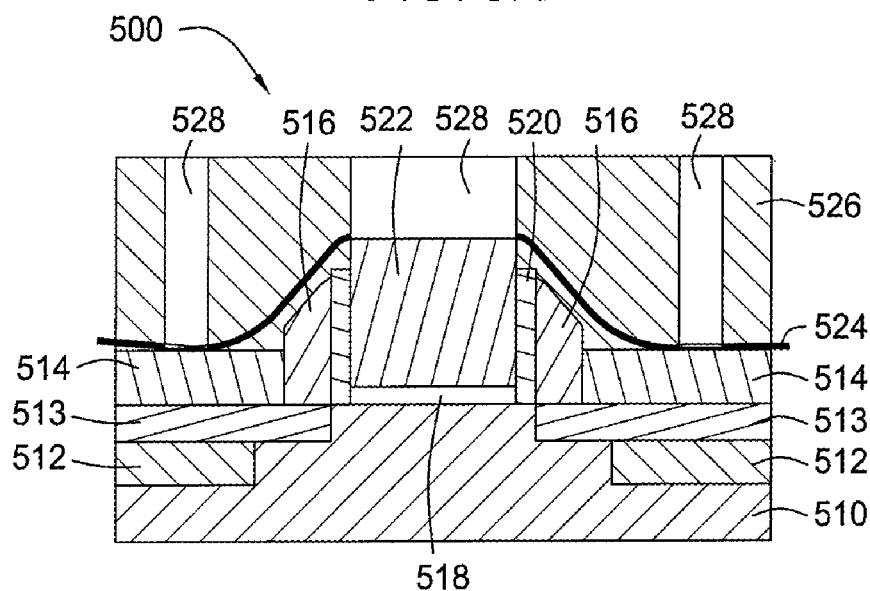
Figure 6:
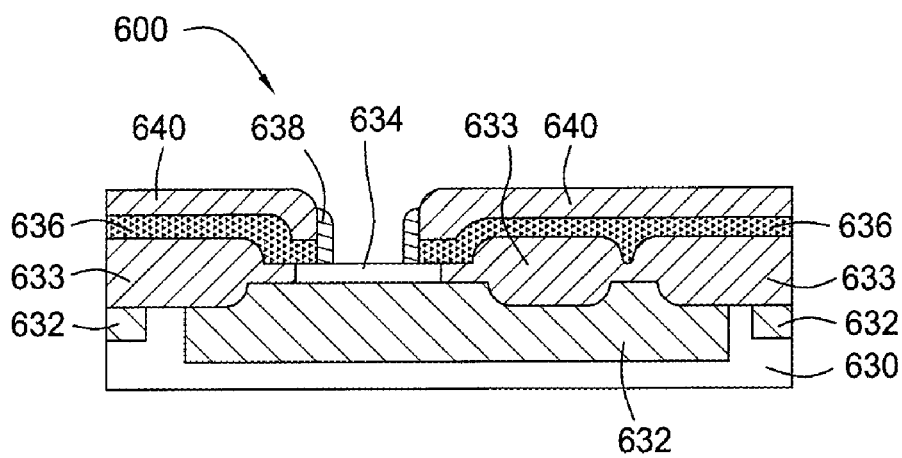
FIG. 6 is a cross section of an exemplary bi-polar transistor having silicon-containing materials deposited according to processes described by embodiments herein.

In some embodiments, silicon-containing materials may be deposited as various layers in MOSFET and bipolar transistors as depicted in FIGS. 5A-5B and 6. The silicon-containing materials include silicon oxide, silicon nitride, silicon oxynitride, silicon (e.g., epitaxy, polysilicon, or amorphous), or other silicon-containing materials (e.g., SiGe, SiC, SiGeC, or doped variants thereof). For example, FIG. 5A shows silicon-containing materials deposited within a MOSFET containing both recessed and elevated source/drains. Source/drain layer 512 is formed by ion implantation of substrate layer 510. For pMOS, substrate layer 510 is doped n-type while source/drain layer 512 is doped p-type material. Silicon-containing layers 513 and 514 may be selectively and epitaxially grown on source/drain layer 512 or directly on substrate layer 510 by processes described herein. Silicon-containing layers 513 and 514 may contain silicon, silicon germanium, silicon carbon, silicon germanium carbon, dopant variants thereof, derivatives thereof, or combinations thereof. Gate barrier layer 518 bridges segmented silicon-containing layer 513. Generally, gate barrier layer 518 may contain silicon oxide, silicon oxynitride, hafnium oxide, hafnium oxynitride, hafnium silicate, hafnium silicon oxynitride, derivatives thereof, or combinations thereof. Partially encompassing gate barrier layer 518 is a spacer 516, which is usually an isolation material such as a nitride/oxide/nitride stack (e.g., $Si_3N_4/SiO_2/Si_3N_4$). Alternatively, spacer 516 may be a homogeneous layer of a silicon nitride material, such as silicon nitride or silicon oxynitride deposited by the various methods described herein. Gate electrode layer 522 (e.g., polysilicon) may have a spacer 516 and off-set layers 520 disposed on either side. Off-set layers 520 may be composed of silicon nitride, silicon oxide, or silicon oxynitride deposited by the various processes described herein.

FIG. 5B shows etch stop layer 524 for source/drain and gate contact aperture etch deposited over a MOSFET. Etch stop layer 524 may be composed of a silicon nitride material, such as silicon nitride, deposited by the various methods described herein. Pre-metal dielectric layer 526 (e.g., silicon oxide) is deposited on etch stop layer 524 and contains contact apertures 528 formed thereon.

In another embodiment, FIG. 6 depicts substrate 600 having silicon-containing materials as several layers within a bipolar transistor using various processes as described in embodiments herein. Silicon-containing compound layer 634 is deposited on n-type collector layer 632 previously deposited on substrate layer 630. The transistor further includes isolation layer 633 (e.g., $SiO_2$, $SiO_xN_y$, or $Si_3N_4$), contact layer 636 (e.g., heavily doped poly-Si), off-set layer 638 (e.g., $Si_3N_4$), and isolation layer 640 (e.g., $SiO_2$, $SiO_xN_y$, or $Si_3N_4$). Isolation layers 633, isolation layer 640, and off-set layer 638 may be independently deposited as a silicon nitride material, such as silicon oxynitride, silicon carbon nitride, and/or silicon nitride deposited by the various processes described herein. In one embodiment, the isolation layers 633 and 640 are silicon oxynitride and off-set layer 638 is silicon nitride.

Thus, a method for depositing a silicon-containing layer, such as silicon nitride, using photoexcitation has been provided. The method described above is suitable for device fabrication having small critical dimensions requiring low thermal budgets due to the use of deposition temperatures less than about 550° C., which advantageously facilitates robust circuit fabrication using sub 90 nm technology.

A "substrate" (e.g., substrate 1122) or "substrate surface" as used herein refers to any substrate or material surface formed on a substrate upon which processes may be performed by embodiments described herein. For example, a substrate or a substrate surface may contain materials such as silicon, silicon-containing materials, silicon oxide, strained silicon, silicon on insulator (SOI), silicon nitride, doped silicon, silicon germanium, silicon germanium carbon, germanium, silicon carbon, gallium arsenide, glass, sapphire, fluorine-doped silicate glass (FSG), or carbon-doped silicon oxides, such as $SiO_xC_y$, for example, BLACK DIAMOND® low-k dielectric, available from Applied Materials, Inc., located in Santa Clara, Calif. A substrate surface may also include dielectric materials such as silicon dioxide, silicon nitride, silicon oxynitride and/or carbon doped silicon oxides. Substrates may have various dimensions, such as 200 mm or 300 mm diameter round wafers, as well as, rectangular or square panes. Embodiments of the processes described herein form or deposit silicon-containing materials on many substrates and substrate surfaces. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers silicon nitride and patterned or non-patterned wafers. Optionally, substrate 1122 may be pretreated prior to the deposition of a silicon-containing material by a polishing process, an etching process, a reducing process, an oxidizing process, a halogenation process, a hydroxylation process, an annealing process, a plasma process, a UV process, or combination thereof.

Throughout the application, the terms "silicon-containing" materials, compounds, films, or layers should be construed to include a composition containing at least silicon and may contain germanium, carbon, boron, arsenic, phosphorous gallium and/or aluminum. Other elements, such as metals, halogens or hydrogen may be incorporated within a silicon-containing material, compound, film or layer, usually with concentrations of about part per million (ppm). Compounds or alloys of silicon-containing materials may be represented by an abbreviation, such as Si for silicon, SiGe, for silicon germanium, SiC for silicon carbon and SiGeC for silicon germanium carbon. The abbreviations do not represent chemical equations with stoichiometrical relationships, nor represent any particular reduction/oxidation state of the silicon-containing materials. Silicon-containing materials, compounds, films or layers may include substrates or substrate surfaces.

Hardware

In the embodiment of FIG. 7, process chamber 1100 includes a chamber body 1102 coupled to pumping system 1138, a controller 1146, at least one photoexcitation system 1144 and a gas panel 1136. Chamber body 1102 has walls 1106, a bottom 1108, and a lid 1110 that define an internal volume 1104. The walls 1106 of the process body 1102 may be thermally regulated. In one embodiment, a plurality of conduits 1112 are disposed in the walls 1106 and are configured to circulate a heat transfer fluid that regulates the temperature of chamber body 1102. The walls 1106 additionally include a substrate access port 1128 configured to facilitate entry and egress of a workpiece, such as substrate 1122, from process chamber 1100.

Substrate support pedestal 1124 is disposed in internal volume 1104 of chamber body 1102 and supports substrate 1122 during processing. Substrate support pedestal 1124 includes heater 1120 configured to regulate the temperature of substrate 1122 and/or heat interior volume 1104 of process chamber 1100. In the embodiment depicted in FIG. 7, heater 1120 is a resistive heating element coupled to a power source 1116 and is capable of heating the substrate to a temperature of about 550° C. or higher.

Pedestal lift assembly 1130 is coupled to substrate support pedestal 1124 and is configured to control the elevation of substrate support pedestal 1124 between an elevated processing position (as shown in FIG. 7) and a lowered position that facilitates access to substrate 1122 disposed on substrate support pedestal 1124 through the substrate access port 1128. The pedestal lift assembly 1130 is sealingly coupled to bottom 1108 of chamber body 1102 by a flexible bellows 1132. Optionally, the pedestal lift assembly 1130 may be configured to rotate substrate support pedestal 1124 during processing. Pedestal lift assembly 1130 and similar assemblies that may be used by embodiments described herein is disclosed in commonly assigned U.S. Ser. No. 11/147,938, entitled "Rotating Substrate Support and the Methods of Use," and filed Jun. 8, 2005, which is herein incorporated by reference in its entirety. The pedestal lift assembly 1130 may be configured to rotate substrate support pedestal 1124 continuously at a constant rate, rotate substrate support pedestal 1124 continuously at different rates, or to index substrate support pedestal 1124.

Gas panel 1136 is coupled to process chamber 1100 and is configured to provide process precursors and chemicals, in liquid and/or gaseous form, and other gases to interior volume 1104 of chamber body 1102. In the embodiment depicted in FIG. 7, gas panel 1136 is coupled by gas line 1140, which is used to transfer process chemical or mixed process gases or vapors from liquid injector generated from a selected liquid chemical source, to inlet port 1134 formed in lid 1110 of chamber body 1102. It is contemplated that inlet port 1134 may be formed through one or more other locations of chamber body 1102.

Flow control ring 1142 is disposed in the process body 1102 and is coupled to port 134. Flow control ring 1142 is configured to direct gas flow 1180 (represented by arrows) of process gas across substrate 1122 supported on substrate support pedestal 1124. Flow control ring 1142 is additionally configured to maintain a flow of purge gas, provided to a portion of interior volume 1104 defined below substrate support pedestal 1124 from purge gas source 1154, flowing upwards around the lower edge of substrate support pedestal 1124, and thereby preventing deposition gases from entering the region below substrate support pedestal 1124. Gases exiting flow control ring 1142 are generally collected in pumping channel 1156 prior to removal from process chamber 1100 through pumping port 1126 by pumping system 1138. Pumping system 1138 generally includes a throttle valve and one or more pumps arranged to control the pressure within internal volume 1104 of process chamber 1100. Flow control ring 1142 is further detailed below with reference to FIGS. 8 and 9A-B.

Lift pins 1114 (of which one is shown in FIG. 7) are provided to separate substrate 1122 from the upper surface of substrate support pedestal 1124 to facilitate substrate hand-off with a robot (not shown) entering the chamber body through access port 1128. In the embodiment depicted in FIG. 7, lift plate 1118 is disposed below substrate support pedestal 1124 and arranged such that as substrate support pedestal 1124 is lowered, lift pins 1114 come in contact with lift plate 1118 before substrate support pedestal 1124 has completed its downward travel. Lift plate 1118 supports lift pins 1114 as substrate support pedestal 1124 continues downward, causing lift pins 1114 to extend from the upper surface of the pedestal. The position of lift plate 1118 and/or the length of lift pins 1114 are configured such that substrate 1122 becomes spaced-apart from substrate support pedestal 1124 and generally aligned with access port 1128 when substrate support pedestal 1124 is in the lowered position.

Photoexcitation system 1144 is positioned to provide energy to at least one of the process gases or the surface of substrate 1122. In one embodiment, photoexcitation system 1144 includes at least one of remote photoexcitation system 1182 or a direct photoexcitation system 1192. Although the embodiment depicted in FIG. 7 includes both remote photoexcitation system 1182 and a direct photoexcitation system 1192, it is contemplated that process chamber 1100 may optionally be configured with a single photoexcitation system (i.e., either the system 1182 or 1192). The energy from photoexcitation system 1144 may be utilized in a number of ways. For example, the energy may be utilized to remove native oxides from the surface of substrate 1122 prior to deposition, to increase the energy of the process gases, thus, increasing deposition rates while reducing deposition temperatures, and to increase the energy level of the deposited materials, thereby increasing deposition rates, allowing greater mobility of atoms within the film and assisting in the reduction of hydrogen or other volatile materials within the film.

In one embodiment, direct photoexcitation system 1192 generally includes at least one lamp 1170 positioned to deliver a beam or flux of energy to substrate surface. The flux of energy can be delivered in a continuous mode or in a pulsed mode. Lamp 1170 may additionally be utilized to energize process and/or cleaning gases.

Direct photoexcitation system 1192 is positioned above one or more windows 1174 disposed in lid 1110, such that energy emitted from photoexcitation system 1144 may be directed into internal volume 1104 of process chamber 1100. Power source 1172 is coupled to lamp 1170 and selectively controls the energy emitted from the lamp within a range from about 1 eV to about 10 eV, and at a frequency within a range from about 100 nm to about 480 nm. In one embodiment, lamp 1170 is an excimer lamp.

In another embodiment, lamp 1170 may include one or more lamps that generate energy at different wavelengths. Thus, different lamps may be energized at different times during a process to produce a desired energy level. Lamps 1170 may also be pulsed to produce the desired energy level. The energy at different wavelengths may be produced simultaneously, or at different times during processing.

Window 1174 is generally sealed to lid 1110 in a manner that prevents vacuum leakage. Window 1174 is fabricated from a material transmissive to the energy emitted from lamp 1170 while being substantially compatible with process chemistries. In one embodiment, window 1174 is fabricated from sapphire or magnesium fluoride.

To protect window 1174 from deposition, baffle plate 1160 is provided below lid 1110 to direct a blanket of purge gas between window 1174 and substrate 1122 disposed on substrate support pedestal 1124. Baffle plate 1160 includes an aperture that is aligned with window 1174 to allow the beam or flux of energy from lamp 1170 to impinge upon the substrate and/or gases within internal volume 1104 of process chamber 1100. A shutter plate can be added below or above window 1174 that can be open or shut to achieve a pulsing of the beam on the surface of the substrate. Purge gas source 1178 is coupled to purge gas inlet 1164 formed through process chamber 1100 and provides a purge gas to the region between lid 1110 and baffle plate 1160. Additional details of direct photoexcitation system 1192, lid 1110, window 1174 and baffle plate 1160 are described further below with reference to FIGS. 10-14.

Figure 8:
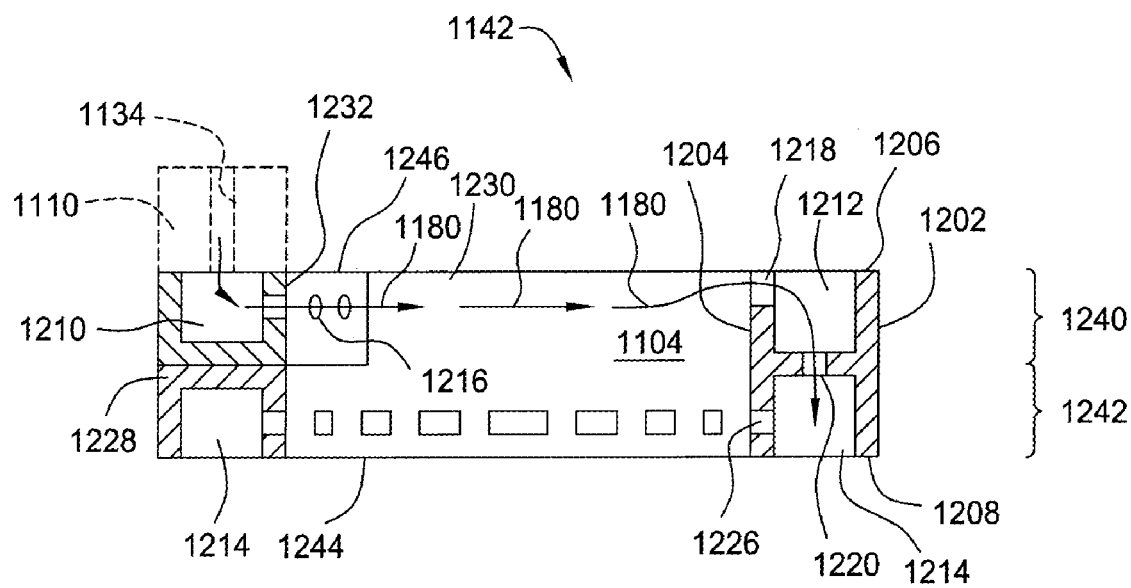
FIG. 8 is a sectional view of one embodiment of a flow control ring.
Figure 9A:
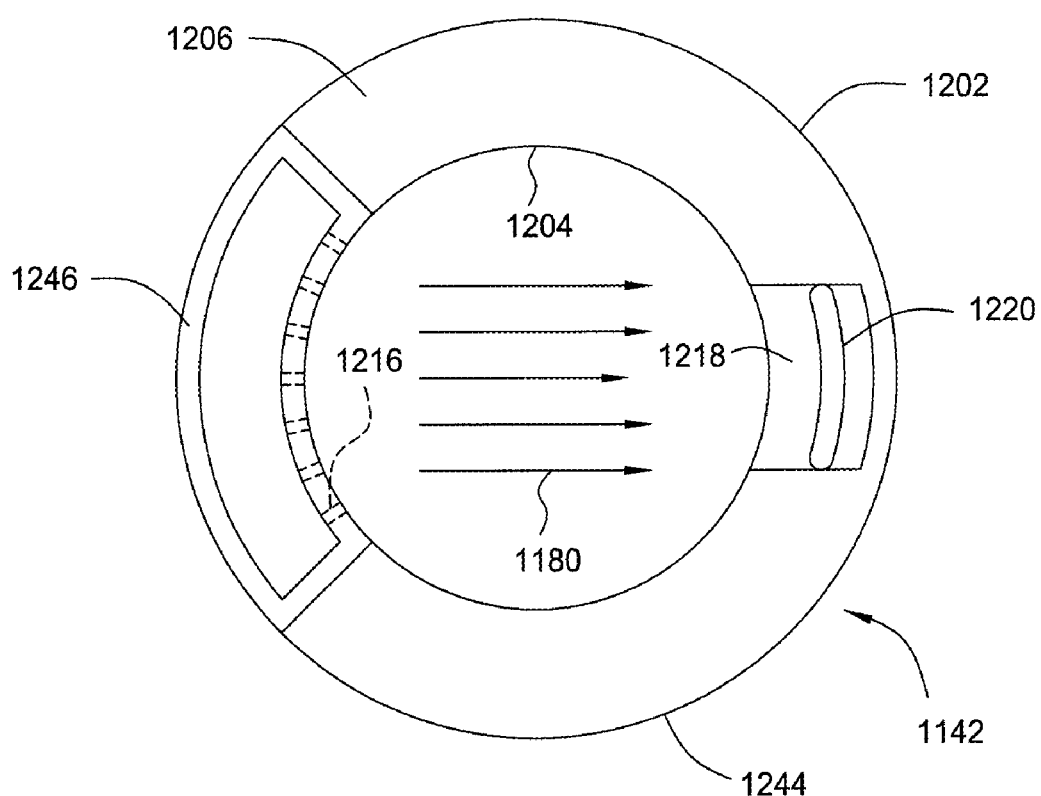
FIGS. 9A-9B are top and bottom views of the flow control ring of FIG. 8.
Figure 9B:
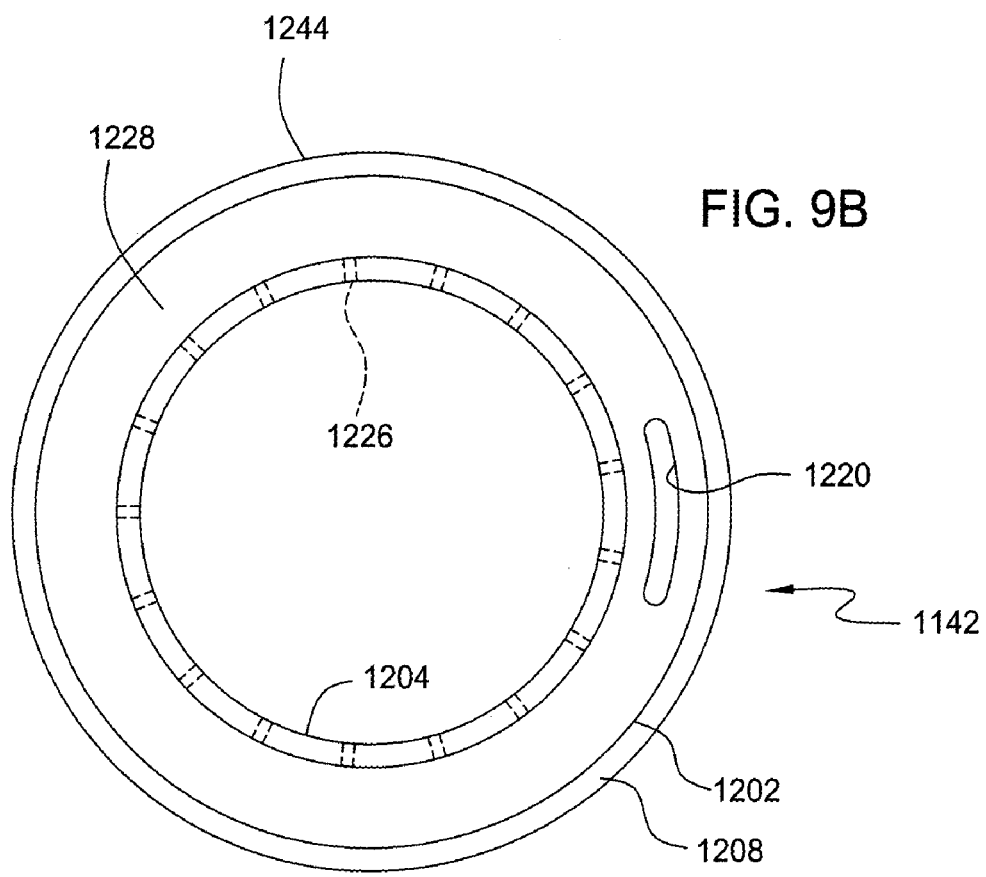
Figures 11A, 11B:
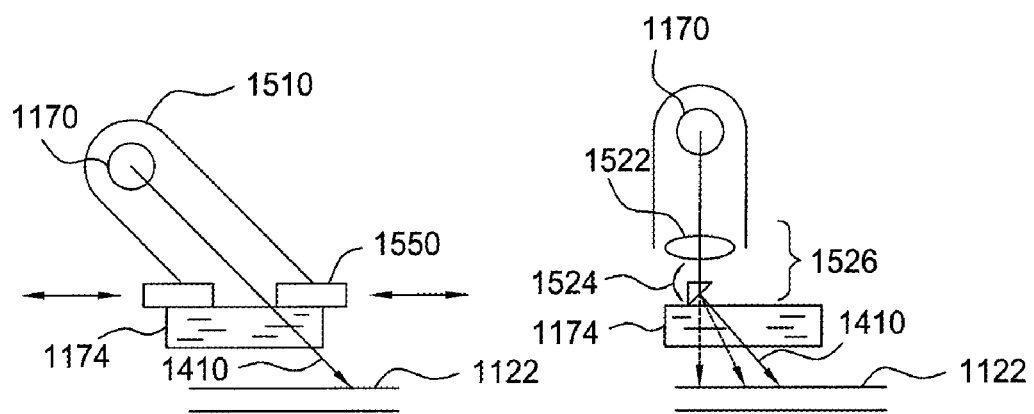
FIGS. 11A-11B illustrate schematics of apparatus for directing an energy beam or flux on a substrate.

FIGS. 8 and 9A-9B are sectional and bottom views of one embodiment of flow control ring 1142. Flow control ring 1142 has outer side 1202, inner wall 1204, top 1206, and bottom 1208. Flow control ring 1142 may be fabricated from a material compatible with the process conditions, such as aluminum, anodized aluminum, steel, stainless steel, or derivatives thereof. In the embodiment depicted in FIGS. 8 and 9A-9B, flow control ring 1142 is shown fabricated from main body 1244 having insert 1246 coupled thereto. It is contemplated that flow control ring 1142 may alternatively be fabricated as a since piece member, be assembled into a unitary body, or contain multiple sections held together within process chamber 1100.

Three plenums are defined within flow control ring 1142. An upper portion 1240 of flow control ring 1142 includes inlet plenum 1210 and outlet plenum 1212. Inlet plenum 1210 is separated from outlet plenum 1212 by wall 1230. In one embodiment, wall 1230 spaces inlet plenum 1210 and outlet plenum 1212 to opposite sides of flow control ring 1142.

Pumping plenum 1214 is disposed in lower portion 1242 of flow control ring 1142 and is separated from the plenums 1210 and 1212 by interior wall 1228. Pumping plenum 1214 is substantially annular, circumscribing inner wall 1204 of flow control ring 1142.

One or more inlet ports 1216 are formed through inner wall 1204 of flow control ring 1142. In the embodiment depicted in FIGS. 8 and 9A, a plurality of inlet ports 1216 are formed through inside diameter wall 1232 of insert 1246 that forms part of inner wall 1204 of flow control ring 1142. Inlet ports 1216 fluidly couple inlet plenum 1210 to internal volume 1104 of process chamber 1100. Thus, gases provided through inlet port 1134 formed in lid 1110 (shown in phantom in FIG. 8) may be delivered from gas panel 1136 to interior volume 1104 of process chamber 1100 through flow control ring 1142.

Outlet plenum 1212 is formed in flow control ring 1142 opposite inlet plenum 1210. One or more paths of gas flow 1180 pass through upper outlet port 1218 positioned within inner wall 1204 of flow control ring 1142 to allow gases within interior volume 1104 of process chamber 1100 to enter outlet plenum 1212. Upper outlet port 1218 may be a hole, slot, aperture, or other flow conduit suitable for allowing a gas flow to enter flow control ring 1142. In one example as depicted in FIGS. 8 and 9A, upper outlet port 1218 is an annular notch formed in inner wall 1204 at top 1206 of flow control ring 1142.

FIG. 8 depicts gas flow 1180 of the process gas entering interior volume 1104 through inlet ports 1216 are drawn back into outlet plenum 1212 through upper outlet port 1218, thereby creating a cross-flow (e.g., flow from one edge to the edge on the opposing side of the substrate) of process gases laterally across substrate 1122 in a non-radial manner. The size, size variation, geometry and distribution of inlet ports 1216 and upper outlet port 1218 are selected to obtain desired gas flow distribution across the surface of substrate 1122.

Unused process gas and reaction by-products flow are routed from outlet plenum 1212 to pumping plenum 1214 through at least one transfer hole 1220 formed through the interior wall 1228. Again, the size, number of holes and geometry of transfer hole 1220 provide control of gas flow 1180. In the embodiment depicted in FIGS. 8 and 9A-9B, transfer hole 1220 is an annular slot.

A plurality of lower outlet ports 1226 are formed through inner wall 1204 to allow purge gas (entering process chamber 1100 below substrate support pedestal 1124, as shown in FIG. 7) to enter pumping plenum 1214. Gases entering pumping plenum 1214 through lower outlet ports 1226 and transfer hole 1220 are drawn into pumping channel 1156 and exhausted from process chamber 1100 by pumping system 1138. The size, size variation, geometry, multiplicity, and distribution of transfer hole 1220, lower outlet ports 1226, or other exhaust ports are selected to obtain desired gas flow into pumping plenum 1214, which assists in tuning the flow of process gases across the surface of the substrate and preventing process gases from contaminating the region below substrate support pedestal 1124.

Figure 14:
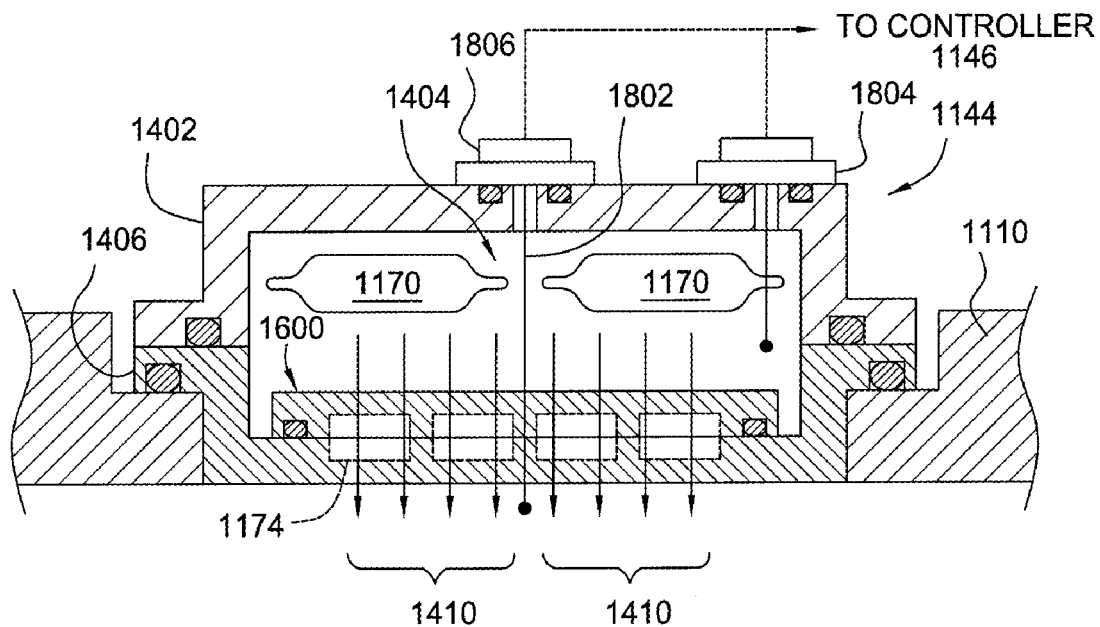
FIG. 14 is a sectional view of the lid and photoexcitation system taken along section lines 14-14 of FIG. 10.

FIG. 14 is a sectional view of one embodiment of direct photoexcitation system 1192 mounted on lid 1110. Direct photoexcitation system 1192 generally includes housing 1402 that retains lamp 1170 in an internal cavity 1404 and mounting frame 1406 that secures a plurality of windows 1174. Housing 1402 may be fabricated from aluminum or other suitable material and is coupled to lid 1110 in a leak-tight manner. In one embodiment, mounting frame 1406 is sealed to the lid by a first o-ring, while housing 1402 is sealed to mounting frame 1406 by a second o-ring. It is contemplated that either o-ring may be replaced by a gasket or other sealing material. Mounting frame 1406 and housing 1402 may be secured to the lid by a fastener or other suitable method.

Interior walls 1408 of housing 1402 defining cavity 1404 are coated with a reflective material to minimize parasitic absorption of energy generated by lamp 1170, thereby increasing the amount of energy directed through window 1174. In one example, interior walls 1408 are coated with nickel as a reflective material.

Interior walls 1408 are shaped to enhance the direction of light or photons through window 1174. In one embodiment, a flux or energy beam 1410 (represented by arrows) produced by lamp 1170 is directed substantially normal to the surface of substrate 1122 (shown in phantom). It is contemplated that it may be desirable to direct energy beam 1410 at other angles of incidence to the substrate. For example, as illustrated in the schematic diagram of FIG. 11A, reflector 1510 positioned proximate lamp 1170 may be configured to direct energy beam 1410 at an acute angle relative to substrate 1122. In another example depicted in FIG. 11B, optics 1520, such as a collimator lens 1522 and prism 1524, may be utilized to set the angle of incidence of energy beam 1410. It is also contemplated that a microactuator may be coupled to the prism 1524 to select the angle of incidence within a range from about 45° to about 90°, as shown by the dashed arrows. As additionally shown in FIG. 11A, shutter 1550 may be utilized to pulse or selectively allow energy beam 1410 to enter internal volume 1104 of process chamber 1100 when desired.

To prevent direct photoexcitation system 1192 from overheating and to maintain consistent performance, direct photoexcitation system 1192 may be temperature controlled. For example, the purge gas source 1178 may be coupled to cavity 1404 of housing 1402 by inlet passage 1412. Inlet passage 1412 injects a heat transfer fluid, such as nitrogen to remove heat generated by lamp 1170 from housing 1402. The heat transfer fluid is removed from cavity 1404 through outlet passage 1414.

Thermocouple 1416 is positioned to provide controller 1146 with a metric indicative of the temperature of the heat transfer fluid, window, lamp or other portion of direct photoexcitation system 1192 so that the temperature of the lamp and/or seals of direct photoexcitation system 1192 may be maintained within operating temperature ranges. For example, utilizing temperature information provided by thermocouple 1416, at least one of the power provided to lamp 1170, the temperature and/or the flow rate of the heat transfer fluid circulated through housing 1402 may be adjusted to maintain lamp 1170 from overheating or exceeding the operational temperature of window 1174.

Figure 12:
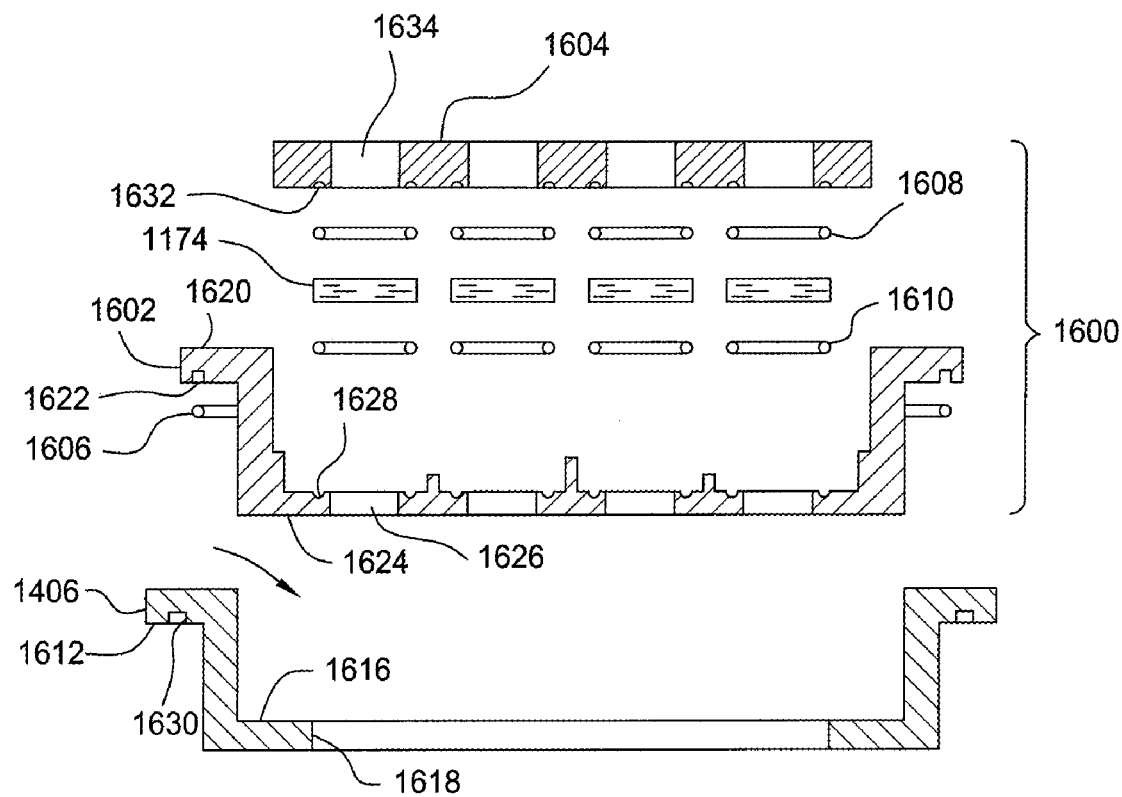
FIG. 12 is an exploded, sectional view of one embodiment of a frame assembly utilized to retain one or more windows in the photoexcitation system of FIG. 10.

FIG. 12 depicts an exploded view of one embodiment of frame assembly 1600 utilized to couple window 1174 to mounting frame 1406. Mounting frame 1406 includes flange 1612 having gland 1630 formed therein that accepts a seal utilized to provide the leak-tight seal between mounting frame 1406 and lid 1110 as described above.

Frame assembly 1600 generally includes window insert mount 1602 and window frame 1604. Window insert mount 1602 is disposed in pocket 1614 framed in mounting frame 1406. Window insert mount 1602 includes flange 1620 and base 1624. Flange 1620 of window insert mount 1602 extends outward from base 1624 and includes a gland 1622. Mount seal 1606, such as an o-ring, is disposed in gland 1622 and provides a seal between window insert mount 1602 and base 1616 of mounting frame 1406. Compression of mount seal 1606 is maintained by fasteners (not shown) coupling window insert mount 1602 to mounting frame 1406.

Base 1624 is generally an elongated rectangle that includes a plurality of apertures 1626 for allowing passage of the energy beam or flux through the frame assembly. In the embodiment depicted in FIG. 12, base 1624 is disposed in rectangular aperture 1618 formed in base 1616 of mounting frame 1406.

One or more lamps are secured between window insert mount 1602 and window frame 1604. In the embodiment depicted in FIG. 12, four windows 1174 are clamped between window insert mount 1602 and window frame 1604. Upper window seal 1608 is disposed in gland 1632 formed in window frame 1604 and provides a seal between window 1174 and window frame 1604. A lower window seal 1610 is disposed in a gland 1628 formed in window insert mount 1602 and provides a seal between window 1174 and window insert mount 1602. Compression of the upper and lower window seals 1608, 1610 is maintained by fasteners (not shown) coupling window frame 1604 to window insert mount 1602.

The seals between window insert mount 1602 and mounting frame 1406, and between window 1174 and window insert mount 1602 and mounting frame 1406, do not need to be air-tight. Since nitrogen-filled cavity 1404 of housing 1402 is maintained at a higher pressure than interior volume 1104 of process chamber 1100, slight leakage of nitrogen into the area of process chamber 1100 between baffle plate 1160 and lid 1110 is acceptable as being innocuous to processes performed in process chamber 1100.

Once windows 1174 are clamped in place within frame assembly 1600, apertures 1634 formed through window frame 1604 and apertures 1626 formed through window insert mount 1602 align with window 1174 and aperture 1162 of baffle plate 1160 to allow the beam or flux of energy generated by lamp 1170 to enter the chamber.

To provide process control feedback, direct photoexcitation system 1192 may include one or more sensors that provide a metric indicative of lamp performance. This metric advantageously allows processors to selectively control process attributes to obtain films having desired properties and deposition rates.

Figure 10:
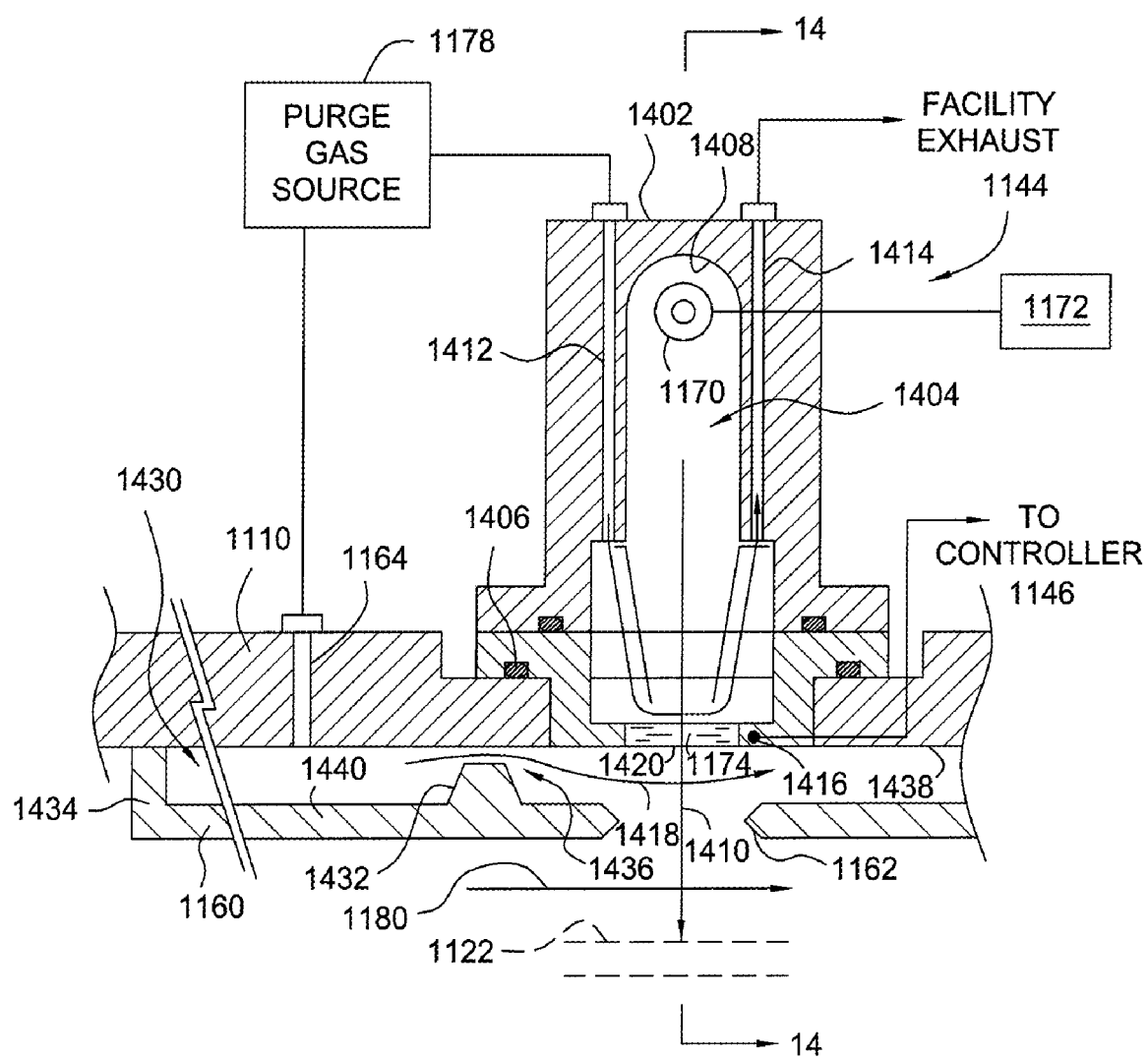
FIG. 10 is a partial sectional view of the lid of the chamber depicted in FIG. 7 and one embodiment of a photoexcitation system.

FIG. 14 is a sectional view of direct photoexcitation system 1192 taken along section line 14-14 of FIG. 10 illustrating sensors utilized to provide metric indicative of lamp performance. In the embodiment depicted in FIG. 14, first sensor 1802 is disposed through housing 1402 and extends between the lamps 1170, through the frame assembly 1600 and into interior volume 1104 of process chamber 1100. First sensor 1802 may utilize a compression fitting 1808 or suitable seal to prevent gas leakage from housing 1402. First sensor 1802 is generally capable of providing a metric indicative of the energy incident on substrate 1122. In one embodiment, first sensor 1802 is a flux sensor. One suitable flux sensor that may be adapted to benefit from the invention is available from Hamamatsu Corporation, located in Hamamatsu City, Japan. As first sensor 1802 is positioned below window 1174 and relatively close to substrate 1122, the energy levels measured are indicative of the actual energy reaching the substrate, and accounts for parasitic energy losses such as energy absorbed by window 1174 and gases within housing 1402 and process chamber 1100. Thus, if a predetermined energy level is desired at the substrate surface, lamp 1170 (or other processing attribute) may be adjusted in-situ to obtain and/or maintain a desired film characteristic.

Second sensor 1804 may be utilized to detect energy levels in housing 1402. Second sensor 1804 is sealed to housing 1402 as described above with reference to first sensor 1802. Second sensor 1804 is generally capable of providing a metric indicative of the energy generated by lamp 1170 within housing 1402. In one embodiment, second sensor 1804 is a flux sensor. Information obtained from first sensor 1802 may be compared with the information obtained from second sensor 1804 to determine parasitic energy losses as the energy generated by the lamp acts upon objects, such as the window, gases and the substrate, positioned within the chamber. Through design experiments, for example by comparing data from the sensors with and without process gas flows, the energy incident on substrate 1122 and absorbed by the process gases may be determined and utilized to control film properties during deposition.

Returning to FIG. 10, curtain 1418 of inert gas is provided across lower surface 1420 of window 1174 to further maintain the performance of direct photoexcitation system 1192. Curtain 1418 is created by flowing nitrogen (or other inert gas) into purge plenum 1430 defined between body 1440 of baffle plate 1160 and lid 1110.

Figure 13A:
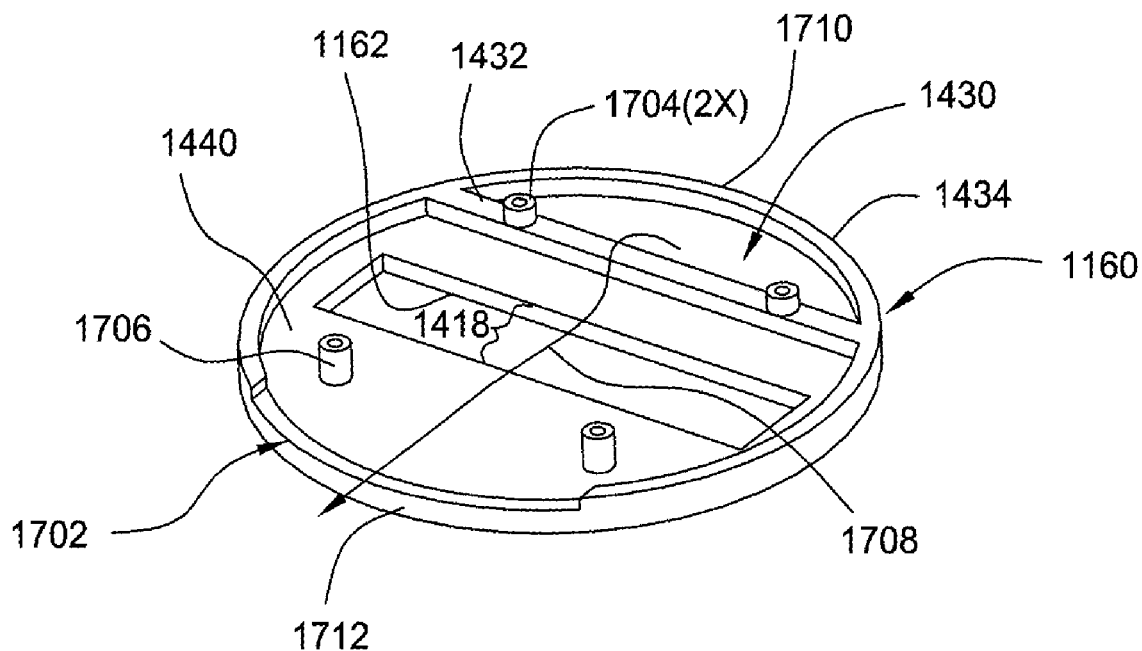
FIGS. 13A-13B are top and bottom perspective views of a baffle plate.
Figure 13B:
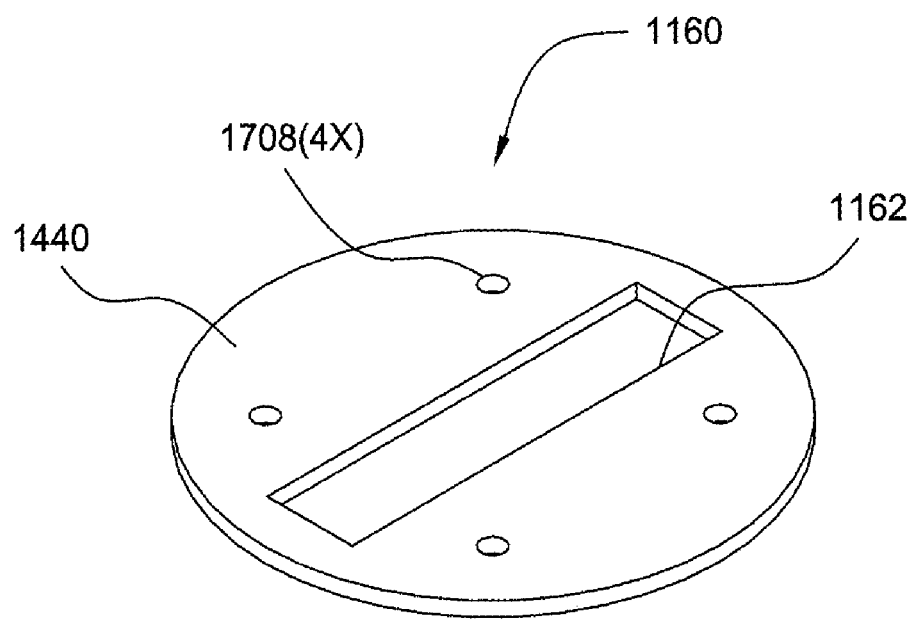

Referring additionally to the top and bottom perspective views of the baffle plate 1160 depicted in FIGS. 13A-13B, purge plenum 1430 is bounded by lip 1434 extending from body 1440 to lid 1110 and weir 1423. Body 1440 provides a physical separation between lid 1110 and the process gases flowing into process chamber 1100. Body 1440 typically has no openings or apertures between first side 1710 of body 1440 disposed over inlet ports 1216 and aperture 1162 to prevent process gases from contacting window 1174.

Lip 1434 extends further from body 1440 than weir 1423. Thus, gases flowed into purge plenum 1430 are substantially confined in purge plenum 1430 and forced over orifice 1436 defined between weir 1423 and lid 1110 along flow path 1708 (represented by arrow). Lip 1434 includes a release port 1702 formed on a second side 1712 of baffle plate 1160 opposite first side 1710 that allows the purge gases to escape from behind baffle plate 1160 and enter flow control ring 1142 through the outlet plenum. In the embodiment depicted in FIG. 13A, the release port 1702 is a notch formed in the distal end of lip 1434.

Orifice 1436 (and weir 1432 that defines orifice 1436) extends parallel to and spaced apart from window 1174. The pressure drop across orifice 1436, along with the pressure within the interior volume and purge plenum 1430, are selected to control the flow of curtain 1418 in the direction substantially parallel to gas flow 1180 of the process gas while maintaining substantially uniform flow across weir 1423 so that window 1174 is protected by curtain 1418. In one embodiment, the velocity of curtain 1418 is substantially matched to the process gas flow to minimize turbulent mixing of the gases that may bring some process gases in contact with window 1174.

To ensure uniform spacing between baffle plate 1160 and lid 1110, a plurality of stand-offs or bosses 1704, 1706 extend from baffle plate 1160. The first set of bosses 1704 extend from weir 1432, while the second set of bosses 706 extend from body 1440 between the region of body 1440 defined between aperture 1162 and second side 1712. Bosses 1704 additionally provide a structure through which flow path 1708 is formed. Flow path 1708 extends through baffle plate 1160 and accommodates fasteners (not shown) utilized to secure baffle plate 1160 to lid 1110. In the embodiment depicted in FIG. 13B, each flow path 1708 through bosses 1704, 1706 is counter-bored or counter-sunk on the pedestal side of baffle plate 1160 to recess the head of the fastener.

Returning to FIG. 7, remote photoexcitation system 1182 may be disposed between gas panel 1136 and inlet port 1134. Remote photoexcitation system 1182 may be utilized to energize the gases entering process chamber 1100 from gas panel 1136. The energized gases may be utilized for treating the substrate, cleaning the chamber, promoting a film deposition and/or controlling characteristics of the deposited film.

In one embodiment, remote photoexcitation system 1182 includes lamp 1184 disposed in housing 1194. Lamp 1184 is coupled to the power source 1172, or other suitable source. Lamp 1184 generally produces energy within a range from about 1 eV to about 10 eV, and at a frequency within a range from about 100 nm to about 480 nm. In one embodiment, lamp 1184 is an excimer lamp.

In another embodiment, lamp 1184 may include one or more lamps that generate energy at different wavelengths. Thus, different lamps may be energized at different times during a process to produce a desired energy level. Thus, one lamp may be utilized to energize a selected gas and/or surface while another lamp may be utilized to energize a different gas and/or achieve a desired effect on the deposited film.

In another example, a first wavelength may be utilized to energize a first precursor or a surface, followed by a second wavelength utilized to energize a second precursor or the surface. In such a manner, monolayer deposition may be achieved. Other examples suitable for monolayer deposition through atomic and/or cyclic deposition techniques includes, but is not limited to, photoenergization of only one of the two precursors, photoenergization of a purge gas flowed into the chamber between injection of at least one of or after both of the precursors, photoenergization of the substrate surface between injection of at least one of or after both of the precursors, or combinations thereof among others process sequences.

Gas from gas panel 1136 flowing through passage 1188 formed in housing 1194 may optionally be separated from lamp 1184 by window 1186. Window 1186 may be fabricated from a suitable transmissive material, such as magnesium fluoride.

Remote plasma source (RPS) 1190 may be coupled to process chamber 1100. RPS 1190 generally provides a reactive cleaning agent, such as disassociated fluorine, that removes deposition and other process byproducts from the chamber components. In the embodiment depicted in FIG. 7, RPS 1190 is coupled to inlet port 1134 such that the inlet side of flow control ring 1142 is cleaned. Optionally, RPS 1190 may be coupled to purge gas inlet 1164 so that the cleaning agent may more effectively clean window 1174.

Alternatively, fluorine or other suitable cleaning agent may be provided to the purge gas inlet 1164 from gas panel 1136 to clean window 1174. The cleaning agent, whether provided from the RPS 1190 or gas panel 1136, may be energized by lamp 1170 to increase the energy state of the gases proximate window 1174. It is also contemplated that a cleaning agent may be energized by remote photoexcitation system 1182 and delivered into process chamber 1100 through inlet port 1134.

Controller 1146 is coupled to the various components of process chamber 1100 to facilitate control of a silicon nitride deposition process as described below. Controller 1146 generally includes central processing unit (CPU) 1150, memory 1148, and support circuits 1152. CPU 1150 may be one of any form of computer processor that can be used in an industrial setting for controlling various chambers and sub processors. Memory 1148, or computer readable medium, may be one or more of readily available memory, such as random access memories (RAM), read-only memory (ROM), floppy disk, hard drive, flash memory, or any other form of digital storage, local or remote. Support circuits 1152 are coupled to CPU 1150 for supporting the processor in a conventional manner. Support circuits 1152 include cache, power supplies, clock circuits, input/output circuitry and subsystems, and the like. A process, for example, a deposition process for depositing the silicon-containing material in step 1900 described below, is generally stored in memory 1148, typically as a software routine. The software routine may also be stored and/or executed by a second CPU (not shown) that is remotely located from the hardware being controlled by CPU 1150. Although the deposition process of the present invention is described as being implemented as a software routine, some of the method steps that are disclosed therein may be performed in hardware as well as by the software controller. As such, the invention may be implemented in software as executed upon a system computer, in hardware as an application specific integrated circuit or other type of hardware implementation, or a combination of software and hardware.

While the foregoing is directed to embodiments of the invention, other and further embodiments of the invention may be devised without departing from the basic scope thereof, and the scope thereof is determined by the claims that follow.

What is claimed is:

1. A method for forming a silicon material on a substrate, comprising:
    positioning a substrate containing a native oxide layer within a process chamber;
    exposing the substrate to an energy beam derived from a UV-source and having a photon energy between about 2 eV and about 10 eV to remove the native oxide layer during a pretreatment process; and
    depositing a silicon oxide material on the substrate during a deposition process, comprising:
        exposing the substrate to a deposition gas comprising an aminosilane precursor and an oxygen precursor; and
        exposing the deposition gas to the energy beam within the process chamber.

2. The method of claim 1, wherein the substrate is exposed to the energy beam during a post-treatment process after depositing the silicon oxide material.

3. The method of claim 2, wherein the photon energy is within a range from about 3.2 eV to about 4.5 eV.

4. The method of claim 2, wherein an energy delivery gas passes through the energy beam during the pretreatment process or the post-treatment process and the energy delivery gas comprises a gas selected from the group consisting of neon, argon, krypton, xenon, argon bromide, argon chloride, krypton bromide, krypton chloride, krypton fluoride, xenon fluorides, xenon chlorides, xenon bromides, fluorine, chlorine, bromine, excimers thereof, radicals thereof, derivatives thereof, and combinations thereof.

5. The method of claim 4, wherein the energy delivery gas further comprises nitrogen gas or hydrogen gas.

6. The method of claim 1, wherein the aminosilane precursor is bis-tertbutylaminosilane, trisilylamine, hexakis(ethylamino) disilane, derivatives thereof, or combinations thereof.

7. The method of claim 6, wherein the oxygen precursor is selected from the group consisting of atomic oxygen, oxygen, ozone, water, hydrogen peroxide, radicals thereof, derivatives thereof, and combinations thereof.

8. The method of claim 6, wherein the silicon material further comprises nitrogen.

9. The method of claim 8, wherein the deposition gas further comprises a nitrogen precursor.

10. The method of claim 9, wherein the nitrogen precursor is selected from the group consisting of atomic nitrogen, nitrogen, azide, ammonia, hydrazine, amine compounds, hydrazine compounds, azide compounds, radicals thereof, derivatives thereof, and combinations thereof.

11. The method of claim 8, wherein the substrate is exposed to a nitridation process after the deposition process.

12. A method for forming a silicon material on a substrate, comprising:
    positioning a substrate within a process chamber;
    depositing a silicon oxide material on the substrate during a deposition process, comprising:
        exposing the substrate to a deposition gas comprising an aminosilane precursor and an oxygen precursor; and
        exposing the deposition gas to an energy beam derived from a UV-source within the process chamber; and
    exposing the substrate to the energy beam after depositing the silicon oxide material during a post-treatment process.

13. The method of claim 12, wherein the energy beam has a photon energy within a range from about 2 eV to about 10 eV during the post-deposition process.

14. The method of claim 13, wherein the photon energy is within a range from about 3.2 eV to about 4.5 eV.

15. The method of claim 13, wherein an energy delivery gas passes through the energy beam during the post-treatment process and the energy delivery gas comprises a gas selected from the group consisting of neon, argon, krypton, xenon, argon bromide, argon chloride, krypton bromide, krypton chloride, krypton fluoride, xenon fluorides, xenon chlorides, xenon bromides, fluorine, chlorine, bromine, excimers thereof, radicals thereof, derivatives thereof, and combinations thereof.

16. The method of claim 15, wherein the energy delivery gas further comprises nitrogen gas or hydrogen gas.

17. The method of claim 12, wherein the substrate is exposed to the energy beam during a pretreatment process prior to depositing the silicon oxide material.

18. The method of claim 17, wherein native oxides are removed from the substrate during the pretreatment process.

19. The method of claim 17, wherein the energy beam has a photon energy within a range from about 2 eV to about 10 eV.

20. The method of claim 19, wherein the photon energy is within a range from about 3.2 eV to about 4.5 eV.

21. The method of claim 19, wherein an energy delivery gas passes through the energy beam during the pretreatment process and the energy delivery gas comprises a gas selected from the group consisting of neon, argon, krypton, xenon, argon bromide, argon chloride, krypton bromide, krypton chloride, krypton fluoride, xenon fluorides, xenon chlorides, xenon bromides, fluorine, chlorine, bromine, excimers thereof, radicals thereof, derivatives thereof, and combinations thereof.

22. The method of claim 21, wherein the energy delivery gas further comprises nitrogen gas or hydrogen gas.

23. The method of claim 12, wherein the aminosilane precursor is bis-tertbutylaminosilane, trisilylamine, hexakis(ethylamino) disilane, derivatives thereof, or combinations thereof.

24. The method of claim 23, wherein the oxygen precursor is selected from the group consisting of atomic oxygen, oxygen, ozone, water, hydrogen peroxide, radicals thereof, derivatives thereof, and combinations thereof.

25. A method for forming a silicon material on a substrate, comprising:
- positioning a substrate within a process chamber;
- exposing the substrate to an energy beam derived from a UV-source and an energy delivery gas during a pretreatment process; and
- depositing a silicon oxide material on the substrate during a deposition process, comprising:
  - exposing the substrate to a cross flow of a deposition gas comprising an aminosilane precursor, a nitrogen source, and an oxygen precursor; and
  - exposing the deposition gas to the energy beam within the process chamber.

26. The method of claim 25, wherein native oxides are removed from the substrate during the pretreatment process.

27. The method of claim 25, wherein the energy beam has a photon energy within a range from about 2 eV to about 10 eV.

28. The method of claim 27, wherein the photon energy is within a range from about 3.2 eV to about 4.5 eV.

29. The method of claim 27, wherein the energy delivery gas passes through the energy beam during the pretreatment process and the energy delivery gas comprises a gas selected from the group consisting of neon, argon, krypton, xenon, argon bromide, argon chloride, krypton bromide, krypton chloride, krypton fluoride, xenon fluorides, xenon chlorides, xenon bromides, fluorine, chlorine, bromine, excimers thereof, radicals thereof, derivatives thereof, and combinations thereof.

30. The method of claim 29, wherein the energy delivery gas further comprises nitrogen gas or hydrogen gas.

31. The method of claim 25, wherein the aminosilane precursor is bis-tertbutylaminosilane, trisilylamine, hexakis (ethylamino) disilane, derivatives thereof, or combinations thereof.

32. The method of claim 31, wherein the oxygen precursor is selected from the group consisting of atomic oxygen, oxygen, ozone, water, hydrogen peroxide, radicals thereof, derivatives thereof, and combinations thereof.

33. The method of claim 12, wherein the silicon material further comprises nitrogen.

34. The method of claim 33, wherein the deposition gas further comprises a nitrogen precursor.

35. The method of claim 34, wherein the nitrogen precursor is selected from the group consisting of atomic nitrogen, nitrogen, azide, ammonia, hydrazine, amine compounds, hydrazine compounds, azide compounds, radicals thereof, derivatives thereof, and combinations thereof.

36. The method of claim 12, wherein the substrate is exposed to a nitridation process after the deposition process.

* * * * *

UNITED STATES PATENT AND TRADEMARK OFFICE
CERTIFICATE OF CORRECTION

PATENT NO. : 7,648,927 B2  Page 1 of 1
APPLICATION NO. : 11/425344
DATED : January 19, 2010
INVENTOR(S) : Singh et al.

It is certified that error appears in the above-identified patent and that said Letters Patent is hereby corrected as shown below:

Column 5, Line 43, please delete "suicides" and insert --silicides-- therefor.

Signed and Sealed this

Fourteenth Day of September, 2010

David J. Kappos
*Director of the United States Patent and Trademark Office*